(12) United States Patent
Kamimura et al.

(10) Patent No.: US 11,410,859 B2
(45) Date of Patent: Aug. 9, 2022

(54) TREATMENT LIQUID

(71) Applicant: FUJIFILM Corporation, Tokyo (JP)

(72) Inventors: Tetsuya Kamimura, Shizuoka (JP); Tomonori Takahashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/028,282

(22) Filed: Sep. 22, 2020

(65) Prior Publication Data
US 2021/0005473 A1    Jan. 7, 2021

Related U.S. Application Data

(63) Continuation of application No. PCT/JP2019/006981, filed on Feb. 25, 2019.

(30) Foreign Application Priority Data

Mar. 30, 2018 (JP) ............... JP2018-069565

(51) Int. Cl.
*C09G 1/02* (2006.01)
*H01L 21/67* (2006.01)
*C11D 1/62* (2006.01)
*C11D 3/20* (2006.01)
*C11D 3/30* (2006.01)
(Continued)

(52) U.S. Cl.
CPC .......... *H01L 21/67069* (2013.01); *C09G 1/02* (2013.01); *C11D 1/62* (2013.01); *C11D 3/20* (2013.01); *C11D 3/30* (2013.01); *C11D 3/43* (2013.01); *H01L 21/304* (2013.01)

(58) Field of Classification Search
CPC ....................................................... C09G 1/02
See application file for complete search history.

(56) References Cited

U.S. PATENT DOCUMENTS 6,147,042 A  * 11/2000 Yata ................. C11D 11/0047
510/175
2005/0014667 A1* 1/2005 Aoyama .......... H01L 21/76802
510/175
(Continued)

FOREIGN PATENT DOCUMENTS

JP      2016-090753 A    5/2016
WO     2018043440 A1    3/2018

OTHER PUBLICATIONS

Notice of Reasons for Refusal dated Jun. 22, 2021 from the Japanese Patent Office in JP Application No. 2020-510457.
(Continued)

*Primary Examiner* — Shamim Ahmed
(74) *Attorney, Agent, or Firm* — Sughrue Mion, PLLC

(57) ABSTRACT

The present invention provides a treatment liquid for a semiconductor device, which has excellent temporal stability of residue removal performance as well as excellent anticorrosion performance for an object to be treated. The treatment liquid of an aspect of the present invention is a treatment liquid for a semiconductor device contains one or more hydroxylamine compounds selected from the group consisting of hydroxylamine and a hydroxylamine salt, an organic basic compound, an alcohol-based solvent, and a surfactant, in which a content of the alcohol-based solvent with respect to a total mass of the treatment liquid is 40% to 85% by mass, and a pH is 8 or higher.

22 Claims, 1 Drawing Sheet

(51) Int. Cl.
*C11D 3/43* (2006.01)
*H01L 21/304* (2006.01)

(56) References Cited

U.S. PATENT DOCUMENTS

| | | | |
|---|---|---|---|
| 2006/0293208 A1* | 12/2006 | Egbe .................. | G03F 7/425 |
| | | | 510/407 |
| 2010/0043823 A1* | 2/2010 | Lee .................. | H01L 21/31111 |
| | | | 134/1.3 |
| 2010/0160200 A1* | 6/2010 | Seki .................. | C11D 1/008 |
| | | | 510/175 |
| 2016/0122695 A1 | 5/2016 | Kumagai et al. | |
| 2018/0105774 A1* | 4/2018 | Inaoka .................. | C11D 7/265 |
| 2019/0177669 A1 | 6/2019 | Kamimura et al. | |

OTHER PUBLICATIONS

International Search Report dated Mar. 19, 2019 from the International Searching Authority in International Application No. PCT/JP2019/006981.
International Preliminary Report on Patentability dated Oct. 6, 2020 from the International Bureau in International Application No. PCT/JP2019/006981.
Written Opinion dated Mar. 19, 2019 from the International Bureau in International Application No. PCT/JP2019/006981.
Office Action dated Nov. 26, 2021 in Korean Application No. 10-2020-7027251.

\* cited by examiner

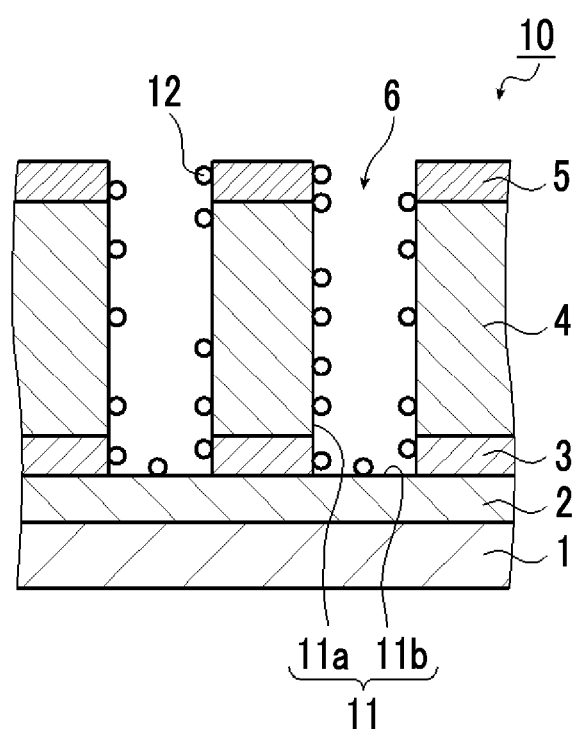

TREATMENT LIQUID

CROSS-REFERENCE TO RELATED APPLICATIONS

This application is a Continuation of PCT International Application No. PCT/JP2019/006981 filed on Feb. 25, 2019, which claims priority under 35 U.S.C. § 119(a) to Japanese Patent Application No. 2018-069565 filed on Mar. 30, 2018. The above application is hereby expressly incorporated by reference, in its entirety, into the present application.

BACKGROUND OF THE INVENTION

1. Field of the Invention

The present invention relates to a treatment liquid. In particular, the present invention relates to a treatment liquid which can be suitably used for the manufacture of a semiconductor device.

2. Description of the Related Art

Semiconductor devices such as charge-coupled devices (CCDs) and memories are manufactured by forming fine electronic circuit patterns on substrates using photolithography technology. Specifically, the semiconductor devices are manufactured by forming a resist film on a laminate that has a metal film serving as a wiring material, an etching stop layer, and an interlayer insulating layer on a substrate, and carrying out a photolithographic step and a dry etching step (for example, a plasma etching treatment).

Furthermore, nowadays, a metal material-based resist film (a so-called metal hard mask) such as TiN and AlOx has been studied as the resist film in order to realize further miniaturization of semiconductor devices. In a case where the metal hard mask is used as the resist film, a dry etching step (for example, a plasma etching treatment) is performed using the metal hard mask as a mask and a step of forming holes based on a pattern shape of the metal hard mask and exposing a surface of a metal film serving as a wiring film are usually performed.

Dry etching residues (in a case where a metal hard mask is used as a resist film, a large amount of metal components such as a titanium-based metal are included as the residual components, and on the other hand, in a case where a photoresist film is used, a large amount of organic components are included as the residual components) adhere to a substrate which has been subjected to a dry etching step. These residues are generally removed using a treatment liquid so as not to interfere with the next step.

For example, US2016/0122695A discloses a cleaning liquid for lithography, which contains hydroxylamine, at least one organic basic compound selected from the group consisting of a compound and a quaternary ammonium hydroxide, and water, and has a pH of 8 or more.

SUMMARY OF THE INVENTION

The present inventors have examined the cleaning liquid (treatment liquid) described in US2016/0122695A, and have thus found that performance thereof is likely to be significantly reduced after storage over time. That is, they have also found that it is necessary to improve the temporal stability of the residue removal performance of the treatment liquid.

Moreover, on the other hand, the treatment liquid has been required to have suppressed corrosion (anticorrosion performance) of wiring metals (which may be any of a metal, a metal nitride, an alloy, and the like; and may be, for example, W or Co used as a wiring metal, or a form containing such a metal) which may contain an object to be treated.

Therefore, an object of the present invention is to provide a treatment liquid for a semiconductor device, which has excellent temporal stability of residue removal performance as well as excellent anticorrosion performance for an object to be treated.

The present inventors have conducted intensive studies to solve the problems, and as a result, have found that the objects can be accomplished by the following configuration.

[1] A treatment liquid for a semiconductor device, comprising:
one or more hydroxylamine compounds selected from the group consisting of hydroxylamine and a hydroxylamine salt;
an organic basic compound;
an alcohol-based solvent; and
a surfactant,
in which a content of the alcohol-based solvent is 40% to 85% by mass with respect to a total mass of the treatment liquid, and
a pH is 8 or higher.

[2] The treatment liquid as described in [1],
in which a content of the hydroxylamine compound is 1% to 20% by mass with respect to the total mass of the treatment liquid.

[3] The treatment liquid as described in [1] or [2],
in which a mass ratio of a content of the hydroxylamine compound to a content of the surfactant is 1 to 1,000.

[4] The treatment liquid as described in any one of [1] to [3],
in which the organic basic compound includes one or more selected from the group consisting of tetramethylammonium hydroxide, tetrabutylammonium hydroxide, benzyltrimethylammonium hydroxide, tetrahydrofurfurylamine, N-(2-aminoethyl)piperazine, 1,8-diazabicyclo[5.4.0]-7-undecene, and 1,4-diazabicyclo[2.2.2]octane.

[5] The treatment liquid as described in any one of [1] to [4],
in which the organic basic compound contains a tertiary amine compound,
the tertiary amine compound contains a tertiary amino group other than a tertiary amino group contained in a nitrogen-containing non-aromatic ring, and
a content of the tertiary amine compound is 1 ppt by mass to 5 ppm by mass with respect to the total mass of the treatment liquid.

[6] The treatment liquid as described in any one of [1] to [5],
in which a mass ratio of a content of the organic basic compound to a content of the surfactant is 1 to 150.

[7] The treatment liquid as described in any one of [1] to [6],
in which the surfactant is a cationic surfactant.

[8] The treatment liquid as described in [7],
in which the cationic surfactant contains a quaternary nitrogen atom.

[9] The treatment liquid as described in any one of [1] to [7],
in which the surfactant contains one or more selected from the group consisting of cetyltrimethylammonium bromide, cetylpyridinium chloride, benzethonium chloride, chlorhexidine dihydrochloride, distearyldimethylammonium chloride, benzalkonium chloride, dequalinium chloride, dodecyltrimethylammonium chloride, octadecylamine hydrochloride, and dodecylpyridinium chloride.

[10] The treatment liquid as described in any one of [1] to [9], in which a content of the surfactant is 1 ppm by mass to 0.5% by mass with respect to the total mass of the treatment liquid.

[11] The treatment liquid as described in any one of [1] to [10], in which the alcohol-based solvent contains an alkoxy group.

[12] The treatment liquid as described in any one of [1] to [10], in which the alcohol-based solvent contains one or more selected from the group consisting of 3-methoxy-3-methyl 1-butanol, furfuryl alcohol, glycerin, 2-methyl-2,4-pentanediol, ethylene glycol, 1,2-propanediol, ethylene glycol monoethyl ether, ethylene glycol monobutyl ether, diethylene glycol monomethyl ether, diethylene glycol monoethyl ether, and dipropylene glycol monomethyl ether.

[13] The treatment liquid as described in any one of [1] to [12], further comprising an alkyl halide compound, in which a content of the alkyl halide compound is 1 ppt by mass to 5 ppm by mass with respect to the total mass of the treatment liquid.

[14] The treatment liquid as described in any one of [1] to [13], further comprising a reducing agent.

[15] The treatment liquid as described in [14], in which the reducing agent is one or more reducing agents selected from the group consisting of catechol and a derivative thereof, and a mercaptan compound.

[16] The treatment liquid as described in any one of [1] to [15], further comprising acetic acid, in which a content of the acetic acid is 1 ppt by mass to 0.1% by mass with respect to the total mass of the treatment liquid.

[17] The treatment liquid as described in any one of [1] to [16], further comprising another organic acid other than acetic acid.

[18] The treatment liquid as described in any one of [1] to [17], further comprising metal-containing particles, in which the metal-containing particle contains one or more metal components selected from the group consisting of Na, Ca, Fe, and Cr, a particle diameter of the metal-containing particle is 0.02 to 0.05 μm, and a content of the metal-containing particles is 10 ppt by mass to 10 ppb by mass with respect to the total mass of the treatment liquid.

[19] The treatment liquid as described in any one of [1] to [18], used as a cleaning liquid for removing etching residues, a solution for removing a resist film used for pattern formation, or a cleaning liquid for removing residues from a substrate after chemical mechanical polishing.

[20] The treatment liquid as described in any one of [1] to [19], used for a treatment of a substrate having a metal layer containing one or more selected from the group consisting of W and Co.

According to the present invention, it is possible to provide a treatment liquid for a semiconductor device, which has excellent temporal stability of residue removal performance as well as excellent anticorrosion performance for an object to be treated.

BRIEF DESCRIPTION OF THE DRAWINGS

FIG. 1 is a schematic cross-sectional view showing an example of a laminate which can be applied to a substrate cleaning method using a treatment liquid of an embodiment of the present invention.

DESCRIPTION OF THE PREFERRED EMBODIMENTS

Hereinafter, the present invention will be described in detail.

The description of the constituents described below is sometimes made based on representative embodiments of the present invention, but the present invention is not limited to such embodiments.

In addition, in the present specification, a numerical value range expressed using "to" means a range that includes the preceding and succeeding numerical values of "to" as the lower limit value and the upper limit value, respectively.

Moreover, in the present invention, a reference to "preparation" is meant to encompass delivering a predetermined material by purchases or the like, in addition to comprising specific materials by synthesis, combination, or the like.

Incidentally, in the present invention, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion ($10^{-15}$)".

Moreover, in the present invention, 1 Å (angstrom) corresponds to 0.1 nm.

In addition, in the notation of a group (atomic group) in the present invention, in a case where the group is noted without specifying whether it is substituted or unsubstituted, the group includes both a group having no substituent and a group having a substituent within a range not interfering with the effects of the present invention. For example, a "hydrocarbon group" includes not only a hydrocarbon group having no substituent (an unsubstituted hydrocarbon group) but also a hydrocarbon group having a substituent (a substituted hydrocarbon group). This also applies to each of compounds.

In the present specification, the pH of the treatment liquid is a value measured by F-51 (trade name) manufactured by Horiba Ltd. at room temperature (25° C.).

In addition, a "radiation" in the present invention means, for example, a bright line spectrum of a mercury lamp, far ultraviolet rays typified by an excimer laser, extreme ultraviolet rays (EUV light), X-rays, electron beams, or the like. Incidentally, in the present invention, light means actinic rays or radiation. Unless otherwise specified, "exposure" in the present invention includes not only exposure with a mercury lamp, far ultraviolet rays typified by an excimer laser, X-rays, EUV light, or the like but also writing by particle rays such as electron beams and ion beams.

[Treatment Liquid]

The treatment liquid of an embodiment of the present invention is a treatment liquid for a semiconductor device, containing
one or more hydroxylamine compounds selected from the group consisting of hydroxylamine and a hydroxylamine salt, an organic basic compound, an alcohol-based solvent, and a surfactant, in which a content of the alcohol-based solvent is 40% to 85% by mass with respect to the total mass of the treatment liquid, and a pH is 8 or higher.

By allowing the treatment liquid of the embodiment of the present invention to have the above-mentioned configuration, the temporal stability of the residue removal performance is excellent and the anticorrosion performance for an object to be treated is excellent.

A reason therefor is not clear in detail, but is considered to be as follows by the present inventors.

That is, the present inventors consider that a predetermined amount of an alcohol content in the treatment liquid keeps the residue removal performance of the treatment liquid above a certain level, and suppresses a temporal deterioration of the residue removal performance of the treatment liquid due to the decomposition of the hydroxylamine. They consider that by incorporation of a surfactant, the anticorrosion performance for an object to be treated (in particular, a metal layer including W or Co) is improved. In addition, the present inventors consider that the residue removal performance of the treatment liquid is also improved by setting a pH to be above a predetermined value.

Moreover, the treatment liquid of the embodiment of the present invention has an excellent defect suppression property, which enables the suppression of generation of defects in the object to be treated.

Hereinafter, the respective components included in the treatment liquid of the embodiment of the present invention will be described.

<Hydroxylamine Compound>

The treatment liquid of the embodiment of the present invention contains at least one or more hydroxylamine compounds selected from the group consisting of hydroxylamine and a hydroxylamine salt. The hydroxylamine compound has a function of accelerating decomposition and solubilization of the residues.

Here, the "hydroxylamine" with regard to the hydroxylamine compound of the treatment liquid of the embodiment of the present invention refers to a hydroxylamine compound in a broad sense including a substituted or unsubstituted alkylhydroxylamine, and the like, any of which can be used to obtain the effects of the present invention.

The hydroxylamine compound is not particularly limited, but preferred aspects thereof include unsubstituted hydroxylamine, a hydroxylamine derivative, and salts thereof.

The hydroxylamine derivative is not particularly limited, but examples thereof include O-methylhydroxylamine, O-ethylhydroxylamine, N-methylhydroxylamine, N,N-dimethylhydroxylamine, N,O-dimethylhydroxylamine, N-ethylhydroxylamine, N,N-diethylhydroxylamine, N,O-diethylhydroxylamine, O,N,N-trimethylhydroxylamine, N,N-dicarboxyethylhydroxylamine, and N,N-disulfoethylhydroxylamine.

The salt of the unsubstituted hydroxylamine or the hydroxylamine derivative is preferably an inorganic acid salt or organic acid salt of the above-mentioned unsubstituted hydroxylamine or hydroxylamine derivative, more preferably a salt of an inorganic acid formed by bonding a non-metal atom such as Cl, S, N, and P to a hydrogen atom, and still more preferably a salt of an acid thereof with any acid of hydrochloric acid, sulfuric acid, or nitric acid. Among those, hydroxylamine nitrate, hydroxylamine sulfate, hydroxylamine hydrochloride, hydroxylamine phosphate, N,N-diethylhydroxylamine sulfate, N,N-diethylhydroxylamine nitrate, or a mixture thereof is preferable.

In addition, organic acid salts of the above-mentioned unsubstituted hydroxylamine or hydroxylamine derivative can also be used, and examples thereof include hydroxylammonium citrate, hydroxylammonium oxalate, and hydroxylammonium fluoride.

Among those, the hydroxylamine or the hydroxylamine sulfate is preferable, and from the viewpoint that the defect suppression property and the temporal stability of the treatment liquid are more excellent, the hydroxylamine is preferable.

The content of the hydroxylamine compound is, for example, 0.1% to 30% by mass with respect to the total mass of the treatment liquid.

Among those, the content of the hydroxylamine compound is preferably 1% by mass or more, more preferably 3% by mass or more, and still more preferably 6% by mass or more with respect to the total mass of the treatment liquid, from the viewpoint that the residue removal property and the defect suppression property of the treatment liquid are more excellent.

In addition, the content of the hydroxylamine compound is preferably 20% by mass or less, more preferably 15% by mass or less, and still more preferably 12% by mass or less with respect to the total mass of the treatment liquid, from the viewpoint that the anticorrosion property is more excellent.

The hydroxylamine compounds may be used singly or in combination of two or more kinds thereof. In a case where the two or more kinds of the hydroxylamine compounds are used, a total content thereof is preferably within the range.

In addition, the content of the hydroxylamine compound with respect to the content of a surfactant which will be described later is preferably 1 or more, more preferably 10 or more, still more preferably 80 or more, and especially preferably 120 or more in terms of a mass ratio (the content of the hydroxylamine compound/the content of the surfactant) from the viewpoint that the residue removal property and the defect suppression property are more excellent.

The mass ratio is preferably 10,000 or less, more preferably 2,500 or less, and still more preferably 1,000 or less from the viewpoint that the residue removal property, the defect suppression property, the anticorrosion property, and the temporal stability of the treatment liquid are more excellent.

<Organic Basic Compound>

The treatment liquid of the embodiment of the present invention further includes an organic basic compound in addition to the above-mentioned components.

Furthermore, the organic basic compound as mentioned herein is a compound which is different from the above-mentioned hydroxylamine compound. That is, the hydroxyamine compound is not included in the organic basic compound.

As the organic basic compound, at least one selected from the group consisting of amine compounds different from the hydroxylamine compound, and a quaternary ammonium hydroxide salt is preferable.

In addition, as the organic basic compound, a cyclic compound (compound having a cyclic structure) is preferable. Examples of the cyclic compound include an amine compound having a cyclic structure which will be described later.

As the amine compound, an amine compound having a cyclic structure is preferable from the viewpoint that it can more effectively suppress the corrosion of a metal layer (preferably a metal layer including W and/or Co) on the substrate while ensuring residue removal performance.

In the amine compound having a cyclic structure, the amino group may be present in either the cyclic structure or outside the cyclic structure, or may be present in both. It should be noted that in a case where the amino group is a tertiary amino group, it is also preferable that the tertiary amino group is present in the cyclic structure and the cyclic structure is a non-aromatic cyclic structure (nitrogen-containing non-aromatic ring).

Examples of the amine compound include tetrahydrofurfurylamine, N-(2-aminoethyl)piperazine, 1,8-diazabicyclo[5.4.0]-7-undecene, 1,4-diazabicyclo[2.2.2]octane, hydroxyethylpiperazine, piperazine, 2-methylpiperazine, trans-2,5-dimethylpiperazine, cis-2,6-dimethylpiperazine, 2-piperidinemethanol, cyclohexylamine, 1,5-diazabicyclo[4,3,0]-5-nonene, diethylenetriamine, triethylenetetramine, and tetraethylenepentamine.

Among those, tetrahydrofurfurylamine, N-(2-aminoethyl)piperazine, 1,8-diazabicyclo[5.4.0]-7-undecene, or 1,4-diazabicyclo[2.2.2]octane is preferable as the amine compound from the viewpoint of more effectively suppressing the corrosion of a metal layer (preferably a metal layer including Co or a Co alloy) on a substrate while ensuring the residue removal performance.

The molecular weight of the amine compound is preferably 50 to 500, more preferably 75 to 400, and still more preferably 100 to 300.

(Tertiary Amine Compound)

It is also preferable that the treatment liquid of the embodiment of the present invention contains a tertiary amine compound as the amine compound. The tertiary amine compound is a compound having a tertiary amino group. It should be noted that the tertiary amino group contained in the tertiary amine compound is preferably a tertiary amino group other than a tertiary amino group contained in the nitrogen-containing non-aromatic ring. For example, N-(2-aminoethyl)piperazine is a compound which is not contained in the tertiary amine compound.

Furthermore, the tertiary amine compound may have a tertiary amino group contained in the nitrogen-containing non-aromatic ring, and a tertiary amino group not contained in the nitrogen-containing non-aromatic ring.

In a case where the treatment liquid contains a tertiary amine compound, it is also preferable that the treatment liquid further contains an organic basic compound other than the tertiary amine compound.

Examples of the tertiary amine compound include trimethylamine, pyridine, N,N-dimethyl-2-[2-[4-[2,4,4-trimethylpentan-2-yl]phenoxy]ethoxy]ethanamine, dimethylstearylamine, and 4-amino-2-methylquinoline.

The content of the tertiary amine compound is preferably 1 ppt by mass to 5 ppm by mass, more preferably 5 ppt by mass to 100 ppb by mass, and still more preferably 50 ppt by mass to 100 ppb by mass with respect to the total mass of the treatment liquid, from the viewpoint where the defect suppression property is more excellent.

(Quaternary Ammonium Hydroxide Salt)

Examples of the quaternary ammonium hydroxide salt include a compound represented by Formula (a1).

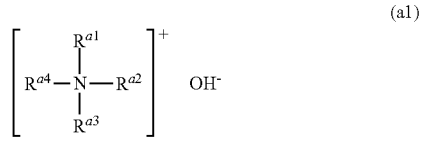

(a1)

In Formula (a1), $R^{a1}$ to $R^{a4}$ each independently represent an alkyl group having 1 to 16 carbon atoms, an aryl group having 6 to 16 carbon atoms, an aralkyl group having 7 to 16 carbon atoms, or a hydroxyalkyl group having 1 to 16 carbon atoms. At least two of $R^{a1}, \ldots,$ or $R^{a4}$ may be bonded to each other to form a cyclic structure, and in particular, at least one of a combination of $R^{a1}$ and $R^{a2}$ or a combination of $R^{a3}$ and $R^{a4}$ may be bonded to each other to form a cyclic structure.

Among the compounds represented by Formula (a1), at least one selected from the group consisting of tetramethylammonium hydroxide, benzyltrimethylammonium hydroxide, tetrabutylammonium hydroxide, tetraethylammonium hydroxide, tetrapropylammonium hydroxide, methyltripropylammonium hydroxide, methyltributylammonium hydroxide, ethyltrimethylammonium hydroxide, dimethyldiethylammonium hydroxide, hexadecyltrimethylammonium hydroxide, (2-hydroxyethyl)trimethylammonium hydroxide, and spiro-(1,1')-bipyrrolidinium hydroxide is preferable from the viewpoint of easy availability. Among those, tetramethylammonium hydroxide, tetrabutylammonium hydroxide, or benzyltrimethylammonium hydroxide is more preferable.

The molecular weight of the quaternary ammonium hydroxide salt is preferably 90 to 400, more preferably 90 to 300, and still more preferably 90 to 260.

The organic basic compounds may be used singly or in combination of two or more kinds thereof.

The content of the organic basic compound (a total content in a case where two or more kinds of the organic basic compounds are used; for example, in a case where the treatment liquid contains the above-mentioned tertiary amine compound and an organic basic compound other than the tertiary amine compound, a total content thereof) is, for example, 1 ppt by mass to 20% by mass, preferably 0.1% to 20% by mass, more preferably 0.5% to 5% by mass, and still more preferably 0.5% to 1.5% by mass with respect to the total mass of the treatment liquid.

In addition, the content of the organic basic compound with respect to the content of the surfactant which will be described later is preferably 1 to 150, more preferably 5 to 125, and still more preferably 5 or more and less than 118 in terms of a mass ratio (the content of the organic basic compound/the content of the surfactant) from the viewpoint that the residue removal property, the defect suppression property, the anticorrosion property, and the temporal stability are more excellent.

<Surfactant>

The treatment liquid of the embodiment of the present invention further contains a surfactant, in addition to the above-mentioned components.

The type of the surfactant is not particularly limited, a known surfactant can be used, and examples thereof include an ionic surfactant (for example, an anionic surfactant, a cationic surfactant, and an amphoteric surfactant), a non-ionic surfactant (for example, a nonionic surfactant, a silicone-based surfactant, and a fluorine-based surfactant).

Examples of the anionic surfactant include aromatic sulfonic acid-based surfactants such as alkylbenzene sulfonates (dodecylbenzene sulfonic acid and the like) and alkyldiphenyl ether sulfonates (dodecyldiphenyl oxide sulfonate and the like), monosoap-based anionic surfactants, ether sulfate-based surfactants, phosphate-based surfactants, and carboxylic acid-based surfactants.

Examples of the cationic surfactant include amine salts (alkylamine salts such as an octadecylamine salt, a chlorhexidine salt, and the like, preferably hydrochlorides such as chlorhexidine dihydrochloride and octadecylamine hydrochloride), pyridinium salts (preferably halide salts such as cetylpyridinium chloride, dodecylpyridinium chloride, and dequalinium chloride), and quaternary ammonium salts (preferably halide salts, preferably having a molecular weight of 260 or more, and more preferably having a molecular weight of more than 260, such as benzalkonium chloride, cetyltrimethylammonium bromide, benzethonium chloride, distearyldimethylammonium chloride, and dodecyltrimethylammonium chloride).

Examples of the amphoteric surfactant include alkyl betaine-based surfactants (2-alkyl-n-carboxymethyl-n-hydroxyethyl imidazolinium betaine and the like), amine oxide-based surfactants, and fatty acid amide propyl betaines (cocamidopropyl betaine and lauramidopropyl betaine).

Examples of the nonionic surfactant include sugar ester-based surfactants such as sorbitan fatty acid ester and polyoxyethylene sorbitan fatty acid ester, alkylglycoside-based surfactants such as lauryl glucoside, fatty acid ester-based surfactants such as polyoxyethylene resin acid ester and polyoxyethylene fatty acid diethyl, and ether-based surfactants such as polyoxyethylene alkyl ethers (polyoxyethylene lauryl ether and the like), polyoxyethylene alkylphenyl ethers (octylphenol ethoxylate and the like), and polyoxyethylene/polypropylene glycol.

Among those, as the surfactant, the cationic surfactant is preferable. Further, the cationic surfactant preferably contains a quaternary nitrogen atom. The quaternary nitrogen atom is contained in, for example, a quaternary ammonium salt or a pyridinium salt. It should be noted that the cationic surfactant containing a quaternary nitrogen atom is preferably different from the quaternary ammonium hydroxide salt (for example, the compound represented by Formula (a1)) mentioned in the description of the organic basic compound.

From the viewpoint that the defect suppression property, the residue removal property, and the temporal stability of the treatment liquid are more excellent, the lower limit of the content of the surfactant is preferably 1 ppm by mass or more, more preferably 85 ppm by mass or more, still more preferably 0.01% by mass or more, and particularly preferably 0.05% by mass or more with respect to the total mass of the treatment liquid. The upper limit is preferably 2% by mass or less, more preferably 1% by mass or less, and still more preferably 0.5% by mass or less.

Furthermore, it is also preferable that the content of the surfactant satisfies preferred ranges of the mass ratio of the content of the hydroxylamine compound to the content of the surfactant, and/or the mass ratio of the content of the organic basic compound to the content of the surfactant, as described above.

The surfactants may be used singly or in combination of two or more kinds thereof. In a case where the two or more kinds of the hydroxylamine compounds are used, a total content thereof is preferably within the range.

<Alcohol-Based Solvent>

The treatment liquid of the embodiment of the present invention further contains an alcohol-based solvent, in addition to the above-mentioned components.

The alcohol-based solvent is preferably a water-soluble alcohol-based solvent.

Examples of the alcohol-based solvent include an alkane diol, an alkylene glycol, alkoxyalcohol, a saturated aliphatic monohydric alcohol, an unsaturated non-aromatic monohydric alcohol, and a trihydric or higher alcohol.

Examples of the alkanediol include glycol, 2-methyl-1,3-propanediol, 1,2-propanediol, 1,3-propanediol (1,3-dihydroxypropane), 2-methyl-2,4-pentanediol, 2,2-dimethyl-1,3-hexanediol, 1,4-butanediol (1,4-dihydroxybutane), 1,3-butanediol, 1,2-butanediol, 2,3-butanediol, 2,5-dihydroxy-2,5-dimethylhexane, pinacol, and alkylene glycol.

Examples of the alkylene glycol include ethylene glycol, propylene glycol, diethylene glycol, dipropylene glycol, triethylene glycol, and tetraethylene glycol.

Examples of the alkoxyalcohol include 3-methoxy-3-methyl-1-butanol, 3-methoxy-1-butanol, 3-methoxy-3-methylbutanol, 1-methoxy-2-butanol, and glycol monoether.

Examples of the glycol monoether include ethylene glycol monomethyl ether, ethylene glycol monoethyl ether, ethylene glycol mono-n-propyl ether, ethylene glycol monoisopropyl ether, ethylene glycol monobutyl ether, diethylene glycol monomethyl ether, diethylene glycol monoethyl ether, diethylene glycol monobutyl ether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Examples of the saturated aliphatic monohydric alcohol include methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of the unsaturated non-aromatic monohydric alcohol include allyl alcohol, propargyl alcohol, 2-butenyl alcohol, 3-butenyl alcohol, and 4-penten-2-ol.

Examples of the low-molecular-weight alcohol including a ring structure include tetrahydrofurfuryl alcohol, furfuryl alcohol, and 1,3-cyclopentanediol.

Examples of the trihydric or higher alcohol include glycerin.

Among those, the alcohol-based solvent is preferably an alkoxyalcohol containing an alkoxy group. The alkoxy group is preferably an alkoxy group having 1 to 6 carbon atoms, such as a methoxy group, an ethoxy group, a propoxy group, and a butoxy group.

The molecular weight of the alcohol-based solvent is preferably 32 to 250, more preferably 40 to 200, and still more preferably 50 to 150.

The content of the alcohol-based solvent is 40% to 85% by mass with respect to the total mass of the treatment liquid, and from the viewpoint that the anticorrosion property and the temporal stability are more excellent, the content is preferably 50% by mass or more, and still more preferably 60% by mass or more. The content is preferably 80% by mass or less, and more preferably 70% by mass or less from the viewpoint that the defect suppression property and the residue removal property are more excellent.

The alcohol-based solvents may be used singly or in combination of two or more kinds thereof. In a case where the two or more kinds of the hydroxylamine compounds are used, a total content thereof is preferably within the range.

<Alkyl Halide Compound>

The treatment liquid of the embodiment of the present invention preferably further contains an alkyl halide compound, in addition to the above-mentioned components.

By incorporating the alkyl halide compound, the defect suppression property of the treatment liquid is more excellent. The alkyl halide compound is not limited as long as it has an alkyl halide group.

Among those, the number of halogen atoms (preferably chlorine atoms) contained in the alkyl halide compound is preferably 1 to 10, and more preferably 1 or 2. The alkyl halide compound preferably has a hydrocarbon group except for the halogen atom portion.

The content of the alkyl halide compound is preferably 1 ppt by mass to 5 ppm by mass, and more preferably 50 ppt by mass to 100 ppb by mass with respect to the total mass of the treatment liquid, from the viewpoint that the defect suppression property is more excellent.

<Reducing Agent>

The treatment liquid of the embodiment of the present invention preferably further contains a reducing agent, in addition to the above-mentioned components.

By incorporating the reducing agent, the residue removal property and the temporal stability of the treatment liquid are more excellent.

In addition, the reducing agent does not include a hydroxylamine compound.

The reducing agent is preferably a reducing substance such as a compound having an OH group or a CHO group, or a compound containing a sulfur atom. The reducing agent has an oxidizing action and has a function of oxidizing $OH^-$ ions, dissolved oxygen, and the like which cause decomposition of the hydroxylamine compound.

Examples of the reducing agent include a compound represented by (B) below.

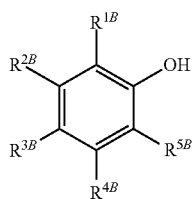

Formula (B)

In Formula (B), $R^{1B}$ to $R^{5B}$ each independently represent a hydrogen atom, a hydroxyl group, or a hydrocarbon group which may have a heteroatom. Further, in a case where $R^{1B}$ to $R^{5B}$ each have a hydrocarbon group which may have a heteroatom, the hydrocarbon group may have a substituent.

In Formula (B), examples of the hydrocarbon group represented by each of $R^{1B}$ to $R^{5B}$ which may have a heteroatom include a hydrocarbon group and a hydrocarbon group having a heteroatom.

Examples of the hydrocarbon group represented by each of $R^{1B}$ to $R^{5B}$ include an alkyl group (preferably having 1 to 12 carbon atoms, and more preferably having 1 to 6 carbon atoms) and an alkenyl group (preferably having 2 to 12 carbon atoms, and more preferably having 2 to 6 carbon atoms), an alkynyl group (preferably having 2 to 12 carbon atoms, and more preferably having 2 to 6 carbon atoms), an aryl group (preferably having 6 to 22 carbon atoms, more preferably having 6 to 14 carbon atoms, and still more preferably having 6 to 10 carbon atoms), and an aralkyl group (preferably having 7 to 23 carbon atoms, more preferably having 7 to 15 carbon atoms, and still more preferably having 7 to 11 carbon atoms).

In addition, examples of the hydrocarbon group having a heteroatom, represented by each of $R^{1B}$ to $R^{5B}$, include the hydrocarbon group in which $—CH_2—$ is substituted with any one selected from the group consisting of $—O—$, $—S—$, $—CO—$, $—SO_2—$, and $—NR^a—$, or a divalent group formed by combination of a plurality of these groups. $R^a$ represents a hydrogen atom or a hydrocarbon group having 1 to 20 carbon atoms (preferably an alkyl group having 1 to 5 carbon atoms).

Moreover, examples of the substituent include a hydroxyl group, a carboxyl group, or a substituted or unsubstituted amino group (as the substituent, an alkyl group having 1 to 6 carbon atoms is preferable, and an alkyl group having 1 to 3 carbon atoms is more preferable).

The compound represented by Formula (B) preferably has two or more hydroxyl groups, and more preferably has two or three or more hydroxyl groups. The position at which the hydroxyl group is substituted is not particularly limited, but among these, $R^{1B}$ and/or $R^{2B}$ is preferable.

Examples of the compound represented by Formula (B) include catechol, resorcinol, isoeugenol, o-methoxyphenol, 4,4'-dihydroxyphenyl-2,2-propane, isoamyl salicylate, benzyl salicylate, methyl salicylate, and 2,6-di-t-butyl-p-cresol.

Among those, catechol is preferable as the compound represented by Formula (B).

Moreover, a catechol derivative is also preferable as the reducing agent.

Examples of the catechol derivative include dopamine, 3-methylcatechol, 4-methylcatechol, catechol-4-acetic acid, noradrenaline, adrenaline, 3-(3,4-dihydroxyphenyl)-L-alanine, 5,6-dihydroxyindole, catechin, isoflavone, gallic acid, ellagic acid, 4-tert-butylpyrocatechol, pyrogallol, 5-sec-butylpyrogallol, 4-phenylpyrogallol, 4-methyl-1,2,3-benzenetriol, 4,5,6-trichloropyrogallol, 4,5,6-trimethylpyrogallol, 4,5-dimethylpyrogallol, and 4,6-dimethylpyrogallol.

As the reducing agent, ascorbic acid is also preferable.

Furthermore, examples of the ascorbic acid include ascorbic acids such as ascorbic acid, isoascorbic acid, ascorbic acid sulfuric ester, ascorbic acid phosphoric ester, ascorbic acid 2-glucoside, ascorbyl palmitic ester, ascorbyl tetraisopalmitate, ascorbic acid isopalminate, and salts thereof, and the ascorbic acid is preferable.

A compound containing a sulfur atom is also preferable as the reducing agent.

Furthermore, examples of the compound containing a sulfur atom include mercaptosuccinic acid, dithiodiglycerol $[S(CH_2CH(OH)CH_2(OH))_2]$, bis(2,3-dihydroxypropylthio) ethylene $[CH_2CH_2(SCH_2CH(OH)CH_2(OH))_2]$, sodium 3-(2,3-dihydroxypropylthio)-2-methyl-propylsulfonate $[CH2(OH)CH(OH)CH_2SCH_2CH(CH_3)CH_2SO_3Na]$, 1-thioglycerol $[HSCH_2CH(OH)CH_2(OH)]$, sodium 3-mercapto-1-propanesulfonate $[HSCH_2CH_2CH2SO_3Na]$, 2-mercaptoethanol $[HSCH_2CH_2(OH)]$, thioglycolic acid $[HSCH_2CO_2H]$, and 3-mercapto-1-propanol $[HSCH_2CH_2CH_2OH]$. Among these, a compound having a SH group (mercaptan compound) is preferable, and 1-thioglycerol, sodium 3-mercapto-1-propanesulfonate, 2-mercaptoethanol, 3-mercapto-1-propanol, or thioglycolic acid is more preferable, and 1-thioglycerol or thioglycolic acid is still more preferable.

Among those, the reducing agent is preferably one or more reducing agents selected from the group consisting of catechol and a derivative thereof, and a mercaptan compound.

The content of the reducing agent is preferably 0.01% to 5% by mass, more preferably 0.05% to 3% by mass, and still more preferably 0.1% to 1% by mass with respect to the total mass of the treatment liquid.

<Acetic Acid>

The treatment liquid of the embodiment of the present invention preferably further contains acetic acid.

By incorporating the acetic acid, the defect suppression property of the treatment liquid is more excellent.

The content of the acetic acid is preferably 1 ppt by mass to 0.1% by mass, more preferably 500 ppt by mass to 0.09% by mass, and still more preferably 5 ppb by mass to 0.08% by mass with respect to the total mass of the treatment liquid.

<Other Organic Acids>

The treatment liquid of the embodiment of the present invention preferably further contains another organic acid, in addition to the above-mentioned components.

By incorporating other organic acid, the residue removal property of the treatment liquid and the temporal stability are more excellent.

Such another organic acid is, for example, a component different from the above-mentioned acetic acid and reducing agent.

Such another organic acid preferably has one or more acid groups, and the acid group of such another organic acid is preferably at least one functional group selected from a carboxylic acid group, a sulfonic acid group, and a phosphonic acid group, with the carboxylic acid group being more preferable.

Specific examples of other organic acids include polyaminopolycarboxylic acids, aliphatic dicarboxylic acids, and aliphatic polycarboxylic acids containing a hydroxyl group.

The polyaminopolycarboxylic acid is a compound having a plurality of amino groups and a plurality of carboxylic acid groups, and examples thereof include a monoalkylenepolyamine polycarboxylic acid, a polyalkylenepolyamine polycarboxylic acid, a polyaminoalkane polycarboxylic acid, a polyaminoalkanol polycarboxylic acid, and a hydroxyalkyl ether polyamine polycarboxylic acid.

Examples of the aliphatic dicarboxylic acids include oxalic acid, malonic acid, succinic acid, and maleic acid, and the oxalic acid, the malonic acid, or the succinic acid is preferable.

Examples of the aliphatic polycarboxylic acid including a hydroxyl group include malic acid, tartaric acid, and citric acid, and the citric acid is preferable.

The content of such another organic acid is preferably 0.01% to 5% by mass, more preferably 0.05% to 3% by mass, and still more preferably 0.1% to 1% by mass with respect to the total mass of the treatment liquid.

<Metal-Containing Particles>

The treatment liquid of the embodiment of the present invention may further contain metal-containing particles containing one or more metal components selected from the group consisting of Na, Ca, Fe, and Cr.

Furthermore, the metal-containing particles have a particle diameter of 0.02 to 0.05 μm.

The diameter and the content of such metal-containing particles in the treatment liquid are, for example, Agilent 8900 triple quadrupole SNP-ICP/MS (small nanoparticle-inductively coupled plasma mass spectrometry, Option #200 for semiconductor analysis) can be used for the measurement.

The metal-containing particle contains one or more metal components selected from the group consisting of Na, Ca, Fe, and Cr, and in a case where the particle diameter is within a predetermined range, the structure is not particularly limited, and for example, the metal may be a simple substance or an alloy, or may be associated with a component other than the metal.

The content of the metal-containing particles is preferably 10 ppt by mass to 10 ppb by mass with respect to the total mass of the treatment liquid from the viewpoint that the defect suppression property of the treatment liquid is more excellent.

By setting the content of the metal-containing particles to 10 ppb by mass or less, it is possible to prevent the particles from remaining on the substrate to cause scratches.

On the other hand, by setting the content of the metal-containing particles to 10 ppt by mass or more, the residue of the ionic metal can be reduced.

The metal-containing particles are often contained as impurities in the raw material of the treatment liquid, and in a case where the unpurified raw materials are mixed, an amount exceeding the preferable range is often brought into the treatment liquid. Therefore, by subjecting a part or all of the raw materials constituting the treatment liquid to a purification treatment such as filtering before or after mixing, the content of the metal-containing particles in the finally obtained treatment liquid can be adjusted to a predetermined range.

In addition, the metal-containing particles may be added separately in preparation of treatment liquid.

<Water>

The treatment liquid of the embodiment of the present invention preferably contains water.

The content of water in the treatment liquid of the embodiment of the present invention is not particularly limited and is, for example, 15% to 59.999% by mass with respect to the total mass of the treatment liquid.

<pH (pH Adjusting Agent)>

The pH of the treatment liquid of the embodiment of the present invention is 8 or more. By setting the pH of the treatment liquid to be in the alkaline range, the residue removal performance is excellent.

Among those, the pH of the treatment liquid is preferably 9 or more, more preferably 10 or more, and still more preferably higher than 10 from the viewpoints that the anticorrosion property against Co, the defect suppression property, and the residue removal property are more excellent.

In addition, the pH of the treatment liquid is preferably 14 or less, more preferably 12 or less, and still more preferably less than 12 from the viewpoint that the anticorrosion property against W and the defect suppression property are more excellent.

In order to adjust the treatment liquid to be in the pH range, the treatment liquid may include a pH adjusting agent. The above-mentioned organic basic compound may also serve as the pH adjusting agent for increasing the pH of the treatment liquid.

Examples of the pH adjusting agent for increasing the pH of the treatment liquid include 1,8-diazabicyclo [5.4.0]-7-undecene (DBU), tetramethylammonium hydroxide (TMAH), tetrabutylammonium hydroxide (TBAH), and an inorganic base (KOH and the like). In a case where an inorganic base is used as the pH adjusting agent, the amount of the inorganic base is preferably 0.1% by mass or less with respect to the total mass of the treatment liquid.

The acid as described above (acetic acid, another organic acid, and the like) may also serve as a pH adjusting agent for lowering the pH of the treatment liquid.

Examples of the pH adjusting agent for lowering the pH of the treatment liquid include inorganic acids (HCl, $H_2SO_4$, $H_3PO_4$, and the like) and citric acid.

<Other Additives>

Examples of other additives include an organic solvent other than an alcohol, an anticorrosive material, an antifoaming agent, a rust inhibitor, and a preservative.

<Metal Concentration>

In the treatment liquid of the embodiment of the present invention, it is preferable that the ion concentration of the metals (metal elements of Co, K, Cu, Mg, Mn, Li, Al, Ni, and Zn) contained as impurities in the liquid is 5 ppm by mass or less (preferably 1 ppm by mass or less). In particular, in a view that high-purity treatment liquids are further demanded in the manufacture of state-of-the-art semiconductor elements, it is more preferable that the metal concentration is less than a value in a ppm-by-mass order, that is, a value in a ppb-by-mass order or less, it is still more preferable that the metal concentration is in a ppt-by-mass order, and it is particularly preferable that the metal is not substantially included.

Examples of a method for sufficiently reducing the metal concentration include performing distillation or filtration using an ion exchange resin in at least one of a stage using raw materials used in the production of a treatment liquid or a stage after preparation of the treatment liquid.

Examples of a method other than the method for reducing the metal concentration include a use of a container having little elution of impurities as shown in the section describing a container housing the treatment liquid with regard to a "container" housing raw materials used in the production of a treatment liquid. Other examples of the method include a method of carrying out lining of a fluorine-based resin for an inner wall of a "pipe" so as to prevent the elution of metal fractions from the pipe or the like during the preparation of the treatment liquid.

<Applications>

The treatment liquid of the embodiment of the present invention is a treatment liquid for a semiconductor device. In the present invention, the expression, "for a semiconductor device", means a use for the manufacture of a semiconductor device. The treatment liquid of the embodiment of the present invention can also be used in any steps for manufacturing a semiconductor device, and can also be used in, for example, a treatment of an insulating film, a resist, or an antireflection film, which is present on a substrate, a treatment of dry etching residues (residues of a photoresist film, residues of a metal hard mask, and the like), a treatment of ashing residues, and the like.

With regard to more specific applications of the treatment liquid, the treatment liquid is used as a pre-wet liquid applied on a substrate in order to improve the coatability of an actinic ray-sensitive or radiation-sensitive composition before a step of forming a photoresist film using the composition; a cleaning liquid used for removing residues such as dry etching residues, or the like; a solution (for example, a removing liquid and a peeling liquid) used for removing various resist films (preferably a photoresist film) used for the formation of a pattern; and a solution (for example, a removing liquid and a peeling liquid) used for removing a permanent film (for example, a color filter, a transparent insulating film, and a resin-made lens) or the like from a substrate. In addition, the treatment liquid can also be used as a developer for various actinic ray-sensitive or radiation-sensitive resin composition layers for pattern formation.

In addition, the treatment liquid can also be used as a cleaning liquid which is used for removing residues such as metal impurities and fine particles from a substrate after chemical mechanical polishing. The substrate after the removal of a permanent film may be used again in a use of a semiconductor device, and therefore, the removal of the permanent film is included in the step of manufacturing a semiconductor device.

The treatment liquid may be used as an etching liquid for treating the metal layer of the substrate having a metal layer.

Among the applications, the treatment liquid can also be suitably used as a cleaning liquid for removing dry etching residues, a solution for removing various resist films used for pattern formation, or a cleaning liquid for removing residues such as metal impurities and fine particles from a substrate after chemical mechanical polishing.

The treatment liquid of the embodiment of the present invention may be used only in one or two or more of the applications.

As miniaturization and high functionalization of semiconductor devices proceed in recent years, metals used for wiring materials, plug materials, or the like are required to be more electrically conductive. For example, it is presumed that substitution of aluminum (Al) and copper (Cu) in the metals used as the wiring materials with cobalt (Co) proceeds. In addition, it is expected that in addition to tungsten (W) in the metals used as the plug materials, a demand for Co increases.

Therefore, it is preferable that the treatment liquid has a small amount of corrosion with respect to W and Co.

The treatment liquid of the embodiment of the present invention is preferably used for a treatment of a substrate having a metal layer containing one or more selected from the group consisting of W and Co. Further, the treatment liquid of the embodiment of the present invention is preferably used as a treatment liquid for manufacturing a semiconductor device including a substrate having a metal layer containing one or more selected from the group consisting of W and Co.

In addition, the metal layer containing one or more selected from the group consisting of W and Co may be a metal layer consisting of W and/or Co, or a metal layer which is an alloy including W and/or Co, or may also be another form of the metal layer including W and/or Co.

[Method for Producing Treatment Liquid]

<Liquid Preparing Method for Treatment Liquid>

The treatment liquid can be produced by a known method. Hereinafter, the method for producing the treatment liquid will be described in detail.

(Step of Purifying Raw Materials)

In the production of the treatment liquid, it is preferable to purify any one or more of the raw materials for preparing the treatment liquid by distillation, ion exchange, filtration or the like in advance. As for the degree of purification, for example, it is preferable to purify the raw materials to have a purity of 99% or more, and more preferable to have a purity of 99.9% or more.

The purification method is not particularly limited, but examples thereof include a method including passing through an ion exchange resin, an reverse osmosis (RO) membrane, or the like, and a method of distillation, filtering which will be described later, or the like. Specific examples of the method include a method in which a primary purification is performed by passage through a reverse osmosis membrane or the like, and then a secondary purification is carried out by passage through a purification device including a cation exchange resin, an anion exchange resin, or a mixed bed ion exchange resin.

Incidentally, for the purification treatment, a plurality of the above-mentioned known purification methods may be carried out in combination.

In addition, the purification treatments may be carried out a plurality of times.

(Filtering)

The filter is not particularly limited as long as it is a filter which has been used in filtering applications or the like from the related art. Examples thereof include a filter formed with a fluorine resin such as polytetrafluoroethylene (PTFE) and a tetrafluoroethylene-perfluoroalkyl vinyl ether copolymer (PFA), a polyamide-based resin such as nylon, and a polyolefin resin (including a high-density polyolefin and an ultrahigh-molecular-weight polyolefin) such as polyethylene and polypropylene (PP), or the like. Among these materials, a material selected from the group consisting of the polyethylene, the polypropylene (including a high-density polypropylene), the fluorine resin such as PTFE and PFA, and the polyamide-based resin such as nylon is preferable, and among these, a filter with a fluorine resin such as PTFE and PFA is more preferable. By using a filter formed with these materials, high-polarity foreign matters which are likely to cause defects can be more effectively removed.

The critical surface tension of the filter is preferably 70 mN/m or more, more preferably 95 mN/m or less, and still more preferably from 75 mN/m to 85 mN/m. Further, the value of the critical surface tension is a nominal value of a manufacturer. By using a filter having a critical surface tension in the range, high-polarity foreign matters which are likely to cause defects can be more effectively removed.

The pore diameter of the filter is preferably approximately 2 to 20 nm, and more preferably 2 to 15 nm. By adjusting the pore diameter of the filter to be in the range, it is possible to reliably remove fine foreign matters such as impurities and aggregates included in the raw materials while suppressing clogging in filtering.

In a case of using filters, different filters may be combined. In this case, the filtering with the first filter may be performed once or twice or more times. In a case where the filtering is performed twice or more times by combining different filters, the pore diameter at the second filtering or later is preferably the same as or smaller than the pore diameter at the first filtering. In addition, the first filters with different pore diameters in the above-mentioned range may be combined. With regard to the pore diameters herein, reference can be made to nominal values of filter manufacturers. A commercially available filter may be selected from various filters provided by Nihon Pall Ltd., Advantech Toyo Roshi Kaisha., Ltd., Nihon Entegris K. K. (formerly Nippon Microlith Co., Ltd.), Kitz Micro Filter Corporation, or the like, for example. Further, a polyamide-made "P-Nylon Filter (pore diameter of 0.02 µm, critical surface tension of 77 mN/m)"; (manufactured by Nihon Pall Ltd.), a high-density polyethylene-made "PE•Clean Filter (pore diameter of 0.02 µm)"; (manufactured by Nihon Pall Ltd.), and a high-density polyethylene-made "PE•Clean Filter (pore diameter of 0.01 µm)"; (manufactured by Nihon Pall Ltd.) can also be used.

As the second filter, a filter formed of the same materials as those of the above-mentioned first filter, and the like can be used. The pore diameter of the second filter is preferably approximately 1 to 10 nm.

Moreover, in the present invention, the filtering step is preferably performed at room temperature (25° C.) or lower, more preferably performed at 23° C. or lower, and still more preferably performed at 20° C. or lower. Further, the temperature is preferably 0° C. or higher, more preferably 5° C. or higher, and still more preferably 10° C. or higher.

In the filtering step, particulate foreign matters or impurities can be removed, but in a case of performing the filtering at the temperature, the amounts of the particulate foreign matters and/or impurities dissolved in the raw materials are reduced, and therefore, they are efficiently removed by filtering.

In addition, in order to adjust the content of the metal-containing particles in the finally obtained treatment liquid within the range as described above, a part or all of the raw materials and a mixture thereof may be subjected to a purification treatment by making an adjustment so that the metal-containing particles having a constant amount and/or particle diameter remain.

(Liquid Preparing Step)

The liquid preparation for the treatment liquid of the embodiment of the present invention is not particularly limited, and the treatment liquid can be produced by mixing the above-mentioned respective components, for example. The order and/or timing for mixing the above-mentioned respective components is not particularly limited, and examples thereof include a method in which a hydroxylamine compound is dispersed in advance in water having a pH adjusted, and predetermined components are sequentially mixed.

<Kit and Concentrate>

The treatment liquid in the embodiment of the present invention may be used in the form of a kit having raw materials of the treatment liquid divided into a plurality of parts.

Although not being particularly limited, examples of a specific method for using the treatment liquid in the form of the kit include an aspect in which a liquid composition containing a hydroxylamine compound and an organic basic compound in an alcohol-based solvent is prepared as a first liquid, and a liquid composition containing the other components is prepared as a second liquid.

Further, the treatment liquid may be prepared by using a concentrate. In a case where a concentrate of the treatment liquid is prepared, the concentration rate is appropriately determined by the composition for constitution, but is preferably 5 to 2,000 folds. That is, the treatment liquid is used after dilution of the concentrate to 5 to 2,000 folds. In addition, from the viewpoint of further improving the temporal stability of the residue removal performance, it is preferable to reduce the water which causes the decomposition of the hydroxylamine compound as much as possible, and thus prepare a composition including a large amount of alcohol-based solvent.

<Container (Housing Container)>

The treatment liquid of the embodiment of the present invention can be filled in any container as long as the container does not have any problem such as corrosion properties (irrespective of whether the treatment liquid is a kit or a concentrate), stored, transported, and used. As for the container, as a container used in semiconductor applications, a container which has high cleanliness in the container and less elution of impurities is preferable. Examples of the usable container include, but are not limited to, "CLEAN BOTTLE" series (manufactured by Aicello Chemical Co., Ltd.) and "PURE BOTTLE" (manufactured by Kodama Plastics Co., Ltd.). The inner wall of the container is preferably formed of one or more resins selected from the group consisting of a polyethylene resin, a polypropylene resin, and a polyethylene-polypropylene resin, other resins, and a metal which has been antirust and metal elution preventing treatments, such as stainless steel, Hastelloy, Inconel, and Monel.

As such other resins, a fluorine-based resin (perfluoro resin) is preferable. In this manner, by using a container having an inner wall formed of a fluorine-based resin, occurrence of a problem of elution of ethylene or propylene oligomers can be suppressed, as compared with a container having an inner wall formed of a polyethylene resin, a polypropylene resin, or a polyethylene-polypropylene resin.

Specific examples of such a container having an inner wall which is a fluorine-based resin include a Fluoro-PurePFA composite drum manufactured by Entegris Inc.

Further, the containers described on page 4 and the like of JP1991-502677A (JP-H03-502677A), page 3 and the like of WO2004/016526A, pages 9 and 16 of WO99/046309A, or the like can also be used.

Moreover, for the inner wall of the container, the quartz and the electropolished metal material (that is, the metal material which has been completely electropolished) are also preferably used, in addition to the above-mentioned fluorine-based resin.

The metal material used for producing the electropolished metal material is preferably a metal material which contains at least one selected from the group consisting of chromium and nickel, and has a total content of chromium and nickel of more than 25% by mass with respect to the total mass of the metal material, and examples thereof include stainless steel and a nickel-chromium alloy.

The total content of chromium and nickel in the metal material is more preferably 30% by mass or more with respect to the total mass of the metal material.

In addition, the upper limit value of the total content of Cr and Ni in the metal material is not particularly limited, but is generally preferably 90% by mass or less.

The stainless steel is not particularly limited, and a known stainless steel can be used. Among those, an alloy containing 8% by mass or more of nickel is preferable, and austenitic stainless steel containing 8% by mass or more of nickel is more preferable. Examples of the austenitic stainless steel include Steel Use Stainless (SUS) 304 (Ni content of 8% by mass, Cr content of 18% by mass), SUS 304L (Ni content of 9% by mass, Cr content of 18% by mass), SUS 316 (Ni content of 10% by mass, Cr content of 16% by mass), and SUS 316L (Ni content of 12% by mass, Cr content of 16% by mass).

The nickel-chromium alloy is not particularly limited and a known nickel-chromium alloy can be used. Among those, a nickel-chromium alloy having a nickel content of 40% to 75% by mass and a chromium content of 1% to 30% by mass is preferable.

Examples of the nickel-chromium alloy include Hastelloy (trade name, hereinafter, the same shall apply), Monel (trade name, hereinafter, the same shall apply), and Inconel (trade name, hereinafter, the same shall apply). More specific examples thereof include Hastelloy C-276 (Ni content of 63% by mass, Cr content of 16% by mass), Hastelloy C (Ni content of 60% by mass, Cr content of 17% by mass), and Hastelloy C-22 (Ni content of 61% by mass, Cr content of 22% by mass).

In addition, the nickel-chromium alloy may further contain boron, silicon, tungsten, molybdenum, copper, cobalt, or the like, as desired, in addition to the above-mentioned alloys.

A method for electropolishing the metal material is not particularly limited, and a known method can be used. For example, the methods described in paragraphs [0011] to [0014] of JP2015-227501A, paragraphs [0036] to [0042] of JP2008-264929A, or the like can be used.

It is presumed that the metal material has a larger content of chromium in the passivation layer on the surface than the content of chromium in the parent phase by electropolishing the metal material. As a result, it is presumed that since it is difficult for the metal elements to flow into the treatment liquid from the inner wall coated with the electropolished metal material, it is possible to obtain a treatment liquid having a reduced amount of metal impurities.

In addition, it is preferable that the metal material is buffed. The buffing method is not particularly limited, and known methods can be used. The size of the abrasive grain used to finish the buffing is not particularly limited, but is preferably #400 or less in view that the unevenness of the surface of the metal material is likely to be smaller.

Incidentally, buffing is preferably performed before the electropolishing.

In addition, the metal material may be subjected to a treatment including one of buffing, acid cleaning, magnetic fluid polishing, and the like or a combination of two or more thereof in a plurality of steps that are performed by changing the number of a size or the like of the abrasive grains.

In the present invention, the container, and the treatment liquid housed in the container may be referred to as a treatment liquid receptor in some cases.

The inside of these containers is preferably cleaned before the treatment liquid is filled. For the liquid used for the cleaning, the amount of the metal impurities in the liquid is preferably reduced. The treatment liquid of the embodiment of the present invention may be bottled in a container such as a gallon bottle and a coated bottle after the production, transported, and stored.

In order to prevent the change in the components in the treatment liquid during the storage, the inside of the container may be replaced with inert gas (nitrogen, argon, or the like) with a purity of 99.99995% by volume or more. In particular, a gas having a low moisture content is preferable. In addition, during the transportation and the storage, the temperature may be controlled to a normal temperature in the range of −20° C. to 20° C. to prevent deterioration.

(Clean Room)

It is preferable that handlings including production of the treatment liquid of the embodiment of the present invention, opening and/or cleaning of a housing container, filling of the treatment liquid, and the like, treatment analysis, and measurements are all performed in clean rooms. It is preferable that the clean room satisfies 14644-1 clean room standards. It is preferable that the clean room satisfies any one of International Organization for Standardization (ISO) Class 1, ISO Class 2, ISO Class 3, or ISO Class 4, it is more preferable that the clean room satisfies ISO Class 1 or ISO Class 2, and it is still more preferable that the clean room satisfies ISO Class 1.

[Method for Cleaning Substrate]

As one aspect of the method for cleaning a substrate using the treatment liquid of the embodiment of the present invention, an aspect having a cleaning step of using the treatment liquid to clean a substrate having a metal layer containing one or more selected from the group consisting of W and Co (hereinafter also referred to as a "cleaning step B") may be mentioned. Further, the cleaning method of the aspect may have a treatment liquid preparing step (hereinafter referred to as a "treatment liquid preparing step A") of preparing the treatment liquid before the cleaning step B.

In the following description of the substrate cleaning method, a case of performing the treatment liquid preparing step A before the cleaning step B is shown as an example, but the present invention is not limited to this, and the substrate cleaning method of the present invention may be performed using the treatment liquid that has been prepared in advance.

<Object to Be Cleaned>

The object to be cleaned in the method for cleaning a substrate according to the present invention is preferably a substrate having a metal layer containing one or more selected from the group consisting of W and Co. Examples of the object to be cleaned by the method for cleaning a substrate according to the present invention include a laminate comprising at least a metal layer containing one or more selected from the group consisting of W and Co (hereinafter simply referred to as a "metal layer"), an interlayer insulating layer, and a metal hard mask in this order on the substrate. The laminate further has holes formed toward the substrate from the surface (apertures) of the metal hard mask so as to expose the surface of the metal layer through a dry etching step or the like.

A method for producing a laminate having holes as described above is not particularly limited, but common examples thereof include a method in which a laminate before the treatment, having a substrate, a metal layer, an interlayer insulating layer, and a metal hard mask in this order, is subjected to a dry etching step using the metal hard mask as a mask, and the interlayer insulating layer is etched so as to expose the surface of the metal layer, thereby providing holes passing through the inside of the metal hard mask and the interlayer insulating layer.

Furthermore, a method for producing the metal hard mask is not particularly limited, and examples thereof include a method in which a metal layer including predetermined components is firstly formed on an interlayer insulating layer, a resist film having a predetermined pattern is formed thereon, and then the metal layer is etched using the resist film as a mask to produce a metal hard mask (that is, a film with a metal layer that is patterned).

In addition, the laminate may have layers other than the above-mentioned layer, and examples of such other layers include an etching stop layer and an antireflection layer.

FIG. 1 illustrates a schematic cross-sectional view showing an example of a laminate which is an object to be cleaned in the method for cleaning a substrate of the embodiment of the present invention.

A laminate 10 shown in FIG. 1 comprises a metal layer 2, an etching stop layer 3, an interlayer insulating layer 4, and a metal hard mask 5 in this order on a substrate 1, and has holes 6 formed by a dry etching step, through which the metal layer 2 is exposed at predetermined positions. That is, the object to be cleaned shown in FIG. 1 is a laminate comprising the substrate 1, the metal layer 2, the etching stop layer 3, the interlayer insulating layer 4, and the metal hard mask 5 in this order, and comprising the holes 6 passing through the surface of the metal hard mask 5 at aperture positions thereof to the surfaces of the metal layer 2. The inner wall 11 of the hole 6 is formed of a cross-sectional wall 11a consisting of the etching stop layer 3, the interlayer insulating layer 4, and the metal hard mask 5, and a bottom wall 11b consisting of the exposed metal layer 2, and dry etching residues 12 adhere thereto.

The method for cleaning a substrate of the embodiment of the present invention can be suitably used in cleaning intended to remove the dry etching residues 12. That is, while being excellent in removal performance of the dry etching residue 12, it is also excellent in the anticorrosion property of the inner wall 11 (for example, the metal layer 2 and the like) of the object to be cleaned.

In addition, the method for cleaning a substrate of the embodiment of the present invention may also be carried out for the laminate which has been subjected to a dry ashing step after the dry etching step.

Hereinafter, each layer constituent material of the above-mentioned laminate will be described.

(Metal Hard Mask)

The metal hard mask preferably contains at least one component selected from the group consisting of Cu, Co, W, AlOx, AlN, AlOxNy, WOx, Ti, TiN, ZrOx, HfOx, and TaOx. Here, x and y are numbers represented by x=1 to 3 and y=1 or 2, respectively.

Examples of the material of the metal hard mask include TiN, $WO_2$, and $ZrO_2$.

(Interlayer Insulating Layer)

A material for the interlayer insulating layer is not particularly limited, and examples thereof include those having a dielectric constant k of preferably 3.0 or less, and more preferably 2.6 or less.

Specific examples of the material for the interlayer insulating layer include organic polymers such as $SiO_2$, SiOC-based materials, and a polyimide.

(Etching Stop Layer)

A material for the etching stop layer is not particularly limited. Specific examples of the material for the etching stop layer include SiN-, SiON-, and SiOCN-based materials, and metal oxides such as AlOx.

(Metal Layer)

The wiring material forming the metal layer contains at least tungsten (W) or cobalt (Co). Further, these metals may be alloys with other metals.

The wiring material of the present invention may further contain a metal other than W and Co, a metal nitride, or an alloy. Specific examples thereof include copper, titanium, titanium-tungsten, titanium nitride, tantalum, tantalum compounds, chromium, chromium oxide, and aluminum.

(Substrate)

Examples of the "substrate" as mentioned herein include a semiconductor substrate consisting of a single layer and a semiconductor substrate consisting of multiple layers.

A material constituting the semiconductor substrate including a single layer is not particularly limited, and in general, the semiconductor substrate is preferably formed of silicon, silicon germanium, Group III to V compounds such as GaAs, and any combinations thereof.

In a case of the semiconductor substrate including multiple layers, its configuration is not particularly limited, and the substrate may have, for example, exposed integrated circuit structures such as interconnect structures (interconnect features) such as a metal wire and a dielectric material on the semiconductor substrate such as silicon as described above. Examples of the metals and the alloys used in the interconnect structures include, but are not limited to, aluminum, aluminum alloyed with copper, copper, titanium, tantalum, cobalt, silicon, titanium nitride, tantalum nitride, and tungsten. Further, there may be an interlayer dielectric layer, a silicon oxide layer, a silicon nitride layer, a silicon carbide layer, a carbon-doped silicon oxide layer, or the like on the semiconductor substrate.

<Treatment Step>

Hereinafter, the treatment liquid preparing step A and the cleaning step B will be described, respectively, in detail.

(Treatment Liquid Preparing Step A)

The treatment liquid preparing step A is a step of preparing the treatment liquid. The respective components used in the present step are as described above.

The procedure in the present step is not particularly limited, and examples thereof include a method in which a hydroxylamine compound, an organic basic compound, an alcohol-based solvent, and any other components are added, stirred, and mixed to prepare a treatment liquid. Further, in a case where the respective components are added, they may be added at once or may be added in portions over a plurality of times.

In addition, as the respective components included in the treatment liquid, components classified into a semiconductor grade or components classified into a high-purity grade equivalent thereto are preferably used, and components which have been subjected to removal of foreign matters by filtering and/or reduction in ion components with an ion exchange resin or the like are preferably used. Further, it is preferable that the raw material components are mixed, and then subjected to removal of foreign matters by filtering and/or reduction in ion components with an ion exchange resin or the like are used.

Moreover, in a case where a concentrate of the treatment liquid is prepared, the concentrate is diluted to obtain a diluted solution before the cleaning step B is performed, and then the cleaning step B is performed using this diluted solution. In this case, the dilution is preferably performed using a diluting liquid containing water.

(Cleaning Step B)

Examples of an object to be cleaned to be cleaned in the cleaning step B include the above-mentioned laminate, and examples thereof include the laminate 10 having holes formed by carrying out a dry etching step as described above (see FIG. 1). In addition, the dry etching residues 12 adhere to the inside of the holes 6 in the laminate 10.

In addition, the laminate which has been subjected to a dry ashing step after the dry etching step may be referred to as an object to be cleaned.

A method for bringing the treatment liquid into contact with the object to be cleaned is not particularly limited, but examples thereof include a method in which an object to be cleaned is immersed in a treatment liquid contained in a tank, a method in which a treatment liquid is sprayed onto an object to be cleaned, a method in which a treatment liquid is flowed onto an object to be cleaned, and any combinations thereof. From the viewpoint of the residue removal performance, the method in which an object to be cleaned is immersed in a treatment liquid is preferable.

A temperature of the treatment liquid is preferably set to 90° C. or lower, more preferably 25° C. to 80° C., still more preferably 30° C. to 75° C., and particularly preferably 40° C. to 70° C.

The cleaning time can be adjusted depending on the cleaning method used and the temperature of the treatment liquid.

In a case where cleaning is performed in an immersion batch mode (a batch mode in which a plurality of sheets of object to be cleaned are immersed in a treatment tank to perform a treatment), the cleaning time is, for example, 60 minutes or less, preferably 1 to 60 minutes, more preferably 3 to 20 minutes, and still more preferably 4 to 15 minutes.

In a case where sheet-type cleaning is performed, the cleaning time is, for example, 10 seconds to 5 minutes, preferably 15 seconds to 4 minutes, more preferably 15 seconds to 3 minutes, and still more preferably 20 seconds to 2 minutes.

Furthermore, in order to further enhance the cleaning capability of the treatment liquid, a mechanical stirring method may be used.

Examples of the mechanical stirring method include a method in which a treatment liquid is circulated on an object to be cleaned, a method in which a treatment liquid is flowed through or sprayed on an object to be cleaned, and a method in which a treatment liquid is stirred with an ultrasonic or a megasonic.

(Rinsing Step B2)

The method for cleaning a substrate using the treatment liquid of the embodiment of the present invention may further have a step (hereinafter referred to as "rinsing step B2") of cleaning the object to be cleaned by rinsing it with a solvent after the cleaning step B.

The rinsing step B2 is preferably a step which is performed subsequently after the cleaning step B, and involves rinsing performed with a rinsing solvent (rinsing liquid) over 5 seconds to 5 minutes. The rinsing step B2 may be performed using the above-mentioned mechanical stirring method.

Examples of the rinsing solvent include, but are not limited to, deionized (DI) water, methanol, ethanol, isopropyl alcohol, N-methylpyrrolidinone, γ-butyrolactone, dimethyl sulfoxide, ethyl lactate, and propylene glycol monomethyl ether acetate. Alternatively, an aqueous rinsing liquid (diluted aqueous ammonium hydroxide or the like) with a pH>8 may be used.

As the rinsing solvent, an aqueous ammonium hydroxide solution, DI water, methanol, ethanol, or isopropyl alcohol is preferable, the aqueous ammonium hydroxide solution, DI water, or isopropyl alcohol is more preferable, and the aqueous ammonium hydroxide solution or DI water is still more preferable.

As a method for bringing the rinsing solvent into contact with the object to be cleaned, the above-mentioned method in which the treatment liquid is brought into contact with an object to be cleaned can be applied in the same manner.

The temperature of the rinsing solvent in the rinsing step B2 is preferably 16° C. to 27° C.

(Drying Step B3)

The method for cleaning a substrate using the treatment liquid of the embodiment of the present invention may have a drying step B3 for drying an object to be cleaned after the rinsing step B2.

The drying method is not particularly limited. Examples of the drying method include a spin drying method, a method of flowing a dry gas onto an object to be cleaned, a method of heating a substrate by a heating means such as a hot plate and an infrared lamp, a Marangoni drying method, a Rotagoni drying method, an isopropyl alcohol (IPA) drying method, or any combinations thereof.

The drying time depends on a specific method used, but in general, it is preferably 30 seconds to several minutes.

The object to be cleaned in the method for cleaning a substrate using the treatment liquid of the embodiment of the present invention is not limited to a laminate comprising at least a metal layer containing one or more selected from the group consisting of W and Co, an interlayer insulating layer, and a metal hard mask in this order on a substrate, as described above. That is, for example, the method can also be used to remove photoresist etching residues of a laminate comprising at least a metal layer containing one or more selected from the group consisting of W and Co, an interlayer insulating layer, and a photoresist film in this order on a substrate.

EXAMPLES

Hereinbelow, the present invention will be described in more detail with reference to Examples. The materials, the amounts used, the proportions, the treatment details, the treatment procedure, and the like shown in Examples below may be modified as appropriate as long as the modifications do not depart from the spirit of the present invention. Therefore, the scope of the present invention should not be construed as being limited to Examples shown below. In addition, "%" means "mass %" unless otherwise specified.

[Preparation of Treatment Liquid]

The treatment liquids shown in Table 1 were each prepared. In addition, the contents of the respective components used in each treatment liquid (all based on mass) are as described in the table.

Here, various components shown in Table 1 which are all classified into a semiconductor grade or a high-purity grade equivalent thereto were used.

Various components used in the treatment liquid are shown below.

<Hydroxylamine Compound>
HA: Hydroxylamine
HAS: Hydroxylamine sulfate
<Organic Basic Compound>
Amine 1: Tetrahydrofurfurylamine
Amine 2: N-(2-Aminoethyl)piperazine
Amine 3: 1,8-Diazabicyclo[5.4.0]undecene-7
Amine 4: 1,4-Diazabicyclo[2.2.2]octane
Amine 5: Diethylethylenetriamine
Amine 6: Triethylenetetramine
Amine 7: Tetraethylenepentamine
TMAH: Tetramethylammonium hydroxide
TBAH: Tetrabuthyllammonium hydroxide
BeTMAH: Benzyltrimethylammonium hydroxide
<Alcohol-Based Solvent>
Sol. 01: 3-Methoxy-3-methyl-1-butanol
Sol. 02: 1,3-Dihydroxypropane
Sol. 03: 1,4-Dihydroxybutane
Sol. 04: 2,5-Dihydroxy-2,5-dimethylhexane
Sol. 05: Furfuryl alcohol
Sol. 06: Glycerin
Sol. 07: 2,4-Dihydroxy-2-methylpentane
Sol. 08: 3-Methoxy-1-butanol
Sol. 09: 3-Methoxy-3-methylbutanol
Sol. 10: Ethylene glycol
Sol. 11: 1,2-Propanediol
Sol. 12: Ethylene glycol monoethyl ether
Sol. 13: Ethylene glycol monobutyl ether
Sol. 14: Diethylene glycol monomethyl ether
Sol. 15: Diethylene glycol monoethyl ether
Sol. 16: Dipropylene glycol monomethyl ether
Sol. 17: 1,2-Butanediol Furthermore, among the components, Sol. 01, 08, 09, and 12 to 16 are alcohol-based solvents each having an alkoxy group.

<Surfactant>
Surf. 01: Dodecylbenzenesulfonic acid
Surf. 02: (Dodecylphenoxy)benzene-disulfonic acid
Surf. 03: Polyoxyethylene lauryl ether (manufactured by Kao Corporation, molecular weight of more than 250)
Surf. 04: Polyoxyethylene polyoxypropylene glycol (manufactured by Takemoto Oil & Fat Co., Ltd., molecular weight of more than 250)
Surf. 05: Cetyltrimethylammonium bromide
Surf. 06: Cetylpyridinium chloride
Surf. 07: Benzethonium chloride
Surf. 08: Chlorhexidine dihydrochloride
Surf. 09: Distearyl dimethyl ammonium chloride
Surf. 10: Benzalkonium chloride (manufactured by Kao Corporation)
Surf. 11: Dequalinium Chloride
Surf. 12: Dodecyltrimethylammonium chloride
Surf. 13: Octadecylamine hydrochloride
Surf. 14: 1-Dodecylpyridinium chloride
Surf. 15: Lauryl glucoside
Surf. 16: Octylphenol ethoxylate
Surf. 17: 2-Alkyl-n-carboxymethyl-n-hydroxyethyl imidazolium betaine (manufactured by Takemoto Oil & Fat Co., Ltd.)
Surf. 18: Lauramidopropyl betaine
Surf. 19: Cocamidopropyl betaine (manufactured by Kao Corporation)

Furthermore, among the components, Surf. 1 and 2 are anionic surfactants.

Surf. 5 to 14 are cationic surfactants. Among those, the amine salt is Surf. 8 or 13. The pyridinium salt is Surf. 6, 11, or 14. The quaternary ammonium salt is 5, 7, 9, 10, or 12.

Surf. 3, 4, 15, and 16 are nonionic surfactants.

Surf. 17 to 19 are amphoteric surfactants.

<Tertiary Amine Compound and Alkyl Halide Compound>
Chem. 01: Trimethylamine
Chem. 02: 1-Chlorohexadecane
Chem. 03: Pyridine
Chem. 04: N,N-Dimethyl-2-[2-[4-(2,4,4-trimethylpentan-2-yl)phenoxy]ethoxy]ethanamine
Chem. 05: Benzyl chloride
Chem. 06: Dimethyl stearyl amine
Chem. 07: 1-Chlorooctadecane
Chem. 08: 4-Amino-2-methylquinoline
Chem. 09: 1,10-Dichlorodecane
Chem. 10: 1-Chlorooctadecane
Chem. 11: 1-Chlorododecane Furthermore, among the components, Chem. 01, 03, 04, 06, 08 are tertiary amine compounds.

Chem. 02, 05, 07, 09, 10, and 11 are alkyl halide compounds.

<Acid>
O.A. 1: Citric acid
<Reducing Agent>
Red. 1: Thioglycollic acid
Red. 2: Gallic acid
Red. 3: Cathecol
Red. 4: α-Thioglycerol Among the components, Red. 1 and 4 are mercaptan compounds, and Red. 2 and 3 are catechol or catechol derivatives.

<Water>
Water: Ultrapure water
<pH Adjusting Agent>

As a pH adjusting agent, an inorganic acid ($H_3PO_4$) or an inorganic base (KOH) other than the treatment liquids of Examples 20 and 55 was added so that the pH of the final treatment liquid would be a predetermined value.

In addition, in a case where an inorganic base was used as the pH adjusting agent, the amount of the added inorganic base was 0.1% by mass or less with respect to the total mass of the treatment liquid.

In Examples 20 and 55, an organic basic compound, 1,8-diazabicyclo[5.4.0]undecene-7 (DBU (Amine 3)) was used as the pH adjusting agent. In other words, in Examples 20 and 55, the pH was adjusted by adjusting the addition amount of the organic basic compound.

<Acetic Acid>
Acetic acid
<Preparation of Treatment Liquid (Metal-Containing Particles)>

The components were mixed so as to have the formulation and pH shown in Table 1 to obtain a mixed liquid. Next, the obtained mixed liquid was filtered with a filter to obtain a treatment liquid. In the filtration, the content of the metal-containing particles in the treatment liquid was adjusted by adjusting the type of a filter used and/or the number of times of filtration.

In addition, the content of the metal-containing particles in the treatment liquid was measured using Agilent 8900 triple quadrupole SNP-ICP/MS (for semiconductor analysis, Option #200).

Furthermore, the definition of the metal-containing particles is as described above.

[Evaluations]

Each of the treatment liquids prepared above was subjected to various evaluations shown below.

<Etching Test>

Each of the treatment liquids of Examples and Comparative Examples was prepared and then the W film or the Co film was subjected to an etching treatment.

Specifically, a substrate (substrate having a metal layer formed thereon) having a layer consisting of Co or a layer consisting of W by a chemical vapor deposition (CVD) method formed on one surface of a substrate (silicon wafer (diameter: 12 inches)) was prepared.

Furthermore, the substrate having the metal layer formed thereon was immersed in the treatment liquid (65° C.) of each of Examples and Comparative Examples for 5 minutes, and an etching rate (Å/min) of the treatment liquid for each metal layer was calculated from a difference in the thickness of the layer consisting of Co or the layer consisting of W between before and after the immersion in the treatment liquid. The lower the etching rate for Co or W as measured in this test, the better the anticorrosion property for Co or W, respectively.

<Defect Suppression Property>

The substrate on which the layer formed of Co was formed was sprayed for 1 minute at a flow rate of 1.0 L/min and 1.5 L/min, respectively, in the order of the treatment liquid (65° C.) of each of Examples and Comparative Examples, and water, and finally, a nitrogen gas was blown onto the substrate at a flow rate of 50 L/min.

Thereafter, the number of defects (pieces/cm$^2$) in size (major axis) of 60 nm or more as an object to be measured was counted using a surface defect inspection device (Surfscan SP-2, manufactured by KLA-Tencor Corporation). From the obtained results, the defect suppression property of each treatment liquid was evaluated based on the following standard.

A: The number of defects is less than 0.5/cm$^2$.

B: The number of defects is 0.5/cm$^2$ or more and less than 1.0/cm$^2$.

C: The number of defects is 1.0/cm$^2$ or more and less than 2.0/cm$^2$.

D: The number of defects is 2.0/cm$^2$ or more and less than 3.0/cm$^2$.

E: The number of defects is 3.0/cm$^2$ or more.

<Residue Removal Property>

The residue removal performance was evaluated using each of the treatment liquids of Examples and Comparative Examples. Further, in the following evaluation, a model film formed of TiO$_2$, which is a kind of residue generated in a case where a metal hard mask (MHM) was plasma-etched, was prepared, and by evaluating an etching rate thereof, the residue removal performance was evaluated. That is, it can be said that in a case where the etching rate is high, the residue removal performance is excellent, whereas in a case where the etching rate is low, the residue removal performance is poor.

In addition, a model film (TiO$_2$ film) formed of TiO$_2$ is provided on an Si substrate with a film thickness of 1,000 Å.

Each of the treatment liquids of Examples and Comparative Examples was prepared and then the TiO$_2$ film was subjected to an etching treatment. Specifically, the TiO$_2$ film was immersed in the treatment liquid (65° C.) of each of Examples and Comparative Examples for 5 minutes, and based on a difference in the film thickness between before and after the immersion in the treatment liquid, an etching rate (Å/min) was calculated.

Furthermore, the thickness of the TiO$_2$ film before and after the treatment was measured using an ellipsometer (spectroscopic ellipsometer, trade name "Vase", manufactured by J.A. Woollam Co., Inc.) under the conditions of a measurement range of 250 to 1,000 nm and measurement angles of 70 degrees and 75 degrees.

Based on the calculated etching rate (ER) of the TiO$_2$ film, the residue removal property was evaluated according to the following evaluation standard.

A: 1.5 Å/min<ER

B: 1.0 Å/min<ER≤1.5 Å/min

C: 0.5 Å/min<ER≤1.0 Å/min

D: 0.3 Å/min<ER≤0.5 Å/min

E: ER≤0.3 Å/min

The evaluation of the residue removal performance was carried out not only for the treatment liquid immediately after preparation ("0 h" in the tables) but also for the treatment liquid after being stored for 6 hours at 65° C. under a sealed condition ("6 h" in the tables) and the treatment liquid after being stored under the same condition for 12 hours ("12 h" in the tables), the residue removal property of the treatment liquids was evaluated.

Here, the etching rate of the TiO$_2$ film in a case of using the treatment liquid immediately after preparation was taken as ER$_{0h}$, and the etching rate in a case of using the treatment liquid after being stored for 6 hours and the etching rate in a case of using the treatment liquid after being stored for 12 hours were taken as ER$_{6h}$ and ER$_{12h}$, respectively. The maintenance rates of the etching rates at the respective storage times were calculated as "ER$_{6h}$/ER$_{0h}$" and "ER$_{12h}$/ER$_{0h}$", respectively, and the temporal stability was evaluated according to the following evaluation standard.

A: 0.90<Maintenance rate

B: 0.80<Maintenance rate≤0.90

C: 0.70<Maintenance rate≤0.80

D: 0.60<Maintenance rate≤0.70

E: Maintenance rate≤0.60

[Results]

The formulations of the respective treatment liquids and the test results are shown in the following table.

In the tables, the "organic basic compound" is simply described as "Basic compound".

%, ppm, ppb, and ppt shown as a content of each component in the column of "Formulation" means % by mass, ppm by mass, ppb by mass, and ppt by mass, respectively.

The description of "Balance" indicated as the content of water means that as the finally obtained treatment liquid contains the components in the amounts shown in the column of each component and the amount of the pH adjusting agent is adjusted so as to give a predetermined pH, the residual component is water.

The description of "Inorganic acid/inorganic base" in the column of "pH Adjusting agent" indicates that an inorganic acid (H$_3$PO$_4$) or an inorganic base (KOH) as the pH adjusting agent is added in the amount so that the pH of the treatment liquid is the one as described in the column of "pH". The description of "DBU 0.1%" in Examples 20 and 55 indicates that 1,8-diazabicyclo[5.4.0]undecene-7 as the pH adjusting agent is added in the amount of 0.1% by mass with respect to the total mass of the treatment liquid.

The column of "HA/Surfactant" means a mass ratio of the content of the hydroxylamine compound to the content of the surfactant in the treatment liquid (Content of hydroxylamine compound/Content of surfactant).

The column of "Basic compound/surfactant" means a mass ratio of the content of the organic basic compound to the content of the surfactant in the treatment liquid (Content of organic basic compound/content of surfactant).

The column of "Co ER" and the column of "W ER" mean the etching rates for W and Co, respectively, of each treatment liquid.

TABLE 1

| Table 1-1 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
|---|---|---|---|---|---|---|---|---|---|---|---|
| Example 1 | HA 10.0% | TMAH 1.0% | Sol. 01 40% | | Surf. 05 0.1% | Chem. 01 10 ppt | Chem. 02 10 ppt | | | 3.1 | Balance |
| Example 2 | HA 10.0% | TMAH 1.0% | Sol. 01 60% | | Surf. 05 0.1% | Chem. 01 10 ppt | Chem. 02 10 ppt | | | 0.8 | Balance |
| Example 3 | HA 10.0% | TMAH 1.0% | Sol. 01 70% | | Surf. 05 0.1% | Chem. 01 10 ppt | Chem. 02 10 ppt | | | 0.7 | Balance |
| Example 4 | HA 10.0% | TMAH 1.0% | Sol. 01 85.0% | | Surf. 05 0.1% | Chem. 01 10 ppt | Chem. 02 10 ppt | | | 0.8 | Balance |
| Example 5 | HA 0.5% | TMAH 1.0% | Sol. 01 60% | | Surf. 05 0.1% | Chem. 01 10 ppt | Chem. 02 10 ppt | | | 0.4 | Balance |
| Example 6 | HA 1.0% | TMAH 1.0% | Sol. 01 60% | | Surf. 05 0.1% | Chem. 01 10 ppt | Chem. 02 10 ppt | | | 0.5 | Balance |
| Example 7 | HA 3.0% | TMAH 1.0% | Sol. 01 60% | | Surf. 05 0.1% | Chem. 01 10 ppt | Chem. 02 10 ppt | | | 0.7 | Balance |
| Example 8 | HA 5.0% | TMAH 1.0% | Sol. 01 60% | | Surf. 05 0.1% | Chem. 01 10 ppt | Chem. 02 10 ppt | | | 0.7 | Balance |
| Example 9 | HA 8.0% | TMAH 1.0% | Sol. 01 60% | | Surf. 05 0.1% | Chem. 01 10 ppt | Chem. 02 10 ppt | | | 0.8 | Balance |
| Example 10 | HA 12.0% | TMAH 1.0% | Sol. 01 60% | | Surf. 05 0.1% | Chem. 01 10 ppt | Chem. 02 10 ppt | | | 1.4 | Balance |
| Example 11 | HA 15.0% | TMAH 1.0% | Sol. 01 60% | | Surf. 05 0.1% | Chem. 01 10 ppt | Chem. 02 10 ppt | | | 1.8 | Balance |
| Example 12 | HA 20.0% | TMAH 1.0% | Sol. 01 60% | | Surf. 05 0.1% | Chem. 01 10 ppt | Chem. 02 10 ppt | | | 2.4 | Balance |
| Example 13 | HA 25.0% | TMAH 1.0% | Sol. 01 60% | | Surf. 05 0.1% | Chem. 01 10 ppt | Chem. 02 10 ppt | | | 3.5 | Balance |
| Example 14 | HA 10.0% | TMAH 1.0% | Sol. 01 60% | | Surf. 05 0.1% | Chem. 01 10 ppt | Chem. 02 10 ppt | | | 1.9 | Balance |
| Example 15 | HA 10.0% | TMAH 1.0% | Sol. 01 60% | | Surf. 05 0.1% | Chem. 01 10 ppt | Chem. 02 10 ppt | | | 1.8 | Balance |
| Example 16 | HA 10.0% | TMAH 1.0% | Sol. 01 60% | | Surf. 05 0.1% | Chem. 01 10 ppt | Chem. 02 10 ppt | | | 1.3 | Balance |
| Example 17 | HA 10.0% | TMAH 1.0% | Sol. 01 60% | | Surf. 05 0.1% | Chem. 01 10 ppt | Chem. 02 10 ppt | | | 1.4 | Balance |
| Example 18 | HA 10.0% | TMAH 1.0% | Sol. 01 60% | | Surf. 05 0.1% | Chem. 01 10 ppt | Chem. 02 10 ppt | | | 1.9 | Balance |
| Example 19 | HA 10.0% | TMAH 1.0% | Sol. 01 60% | | Surf. 05 0.1% | Chem. 01 10 ppt | Chem. 02 10 ppt | | | 0.8 | Balance |

| Table 1-1 | Formulation pH Adjusting agent | pH | HA/ surfactant | Basic compound/ surfactant | Co ER (Å/min) | W ER (Å/min) | Defect suppression property | Residue removal property (0 h) | Temporal stability (6 h) | Temporal stability (12 h) |
|---|---|---|---|---|---|---|---|---|---|---|
| Example 1 | Inorganic acid/inorganic base | 11 | 100 | 10 | 16 | 15 | C | C | D | D |
| Example 2 | Inorganic acid/inorganic base | 11 | 100 | 10 | 4 | 4 | B | A | B | B |
| Example 3 | Inorganic acid/inorganic base | 11 | 100 | 10 | 3 | 4 | B | B | B | B |
| Example 4 | Inorganic acid/inorganic base | 11 | 100 | 10 | 3 | 5 | D | D | B | B |
| Example 5 | Inorganic acid/inorganic base | 11 | 5 | 10 | 1 | 3 | D | D | B | B |
| Example 6 | Inorganic acid/inorganic base | 11 | 10 | 10 | 2 | 3 | C | C | B | B |
| Example 7 | Inorganic acid/inorganic base | 11 | 30 | 10 | 3 | 4 | C | C | B | B |
| Example 8 | Inorganic acid/inorganic base | 11 | 50 | 10 | 3 | 4 | C | C | B | B |
| Example 9 | Inorganic acid/inorganic base | 11 | 80 | 10 | 3 | 5 | B | B | B | B |
| Example 10 | Inorganic acid/inorganic base | 11 | 120 | 10 | 6 | 8 | B | A | B | B |
| Example 11 | Inorganic acid/inorganic base | 11 | 150 | 10 | 8 | 10 | B | A | B | B |

TABLE 1-continued

| | | | | | | | | | | |
|---|---|---|---|---|---|---|---|---|---|---|
| Example 12 | Inorganic acid/inorganic base | 11 | 200 | 10 | 12 | 12 | B | B | B | B |
| Example 13 | Inorganic acid/inorganic base | 11 | 250 | 10 | 15 | 20 | B | B | B | B |
| Example 14 | Inorganic acid/inorganic base | 8 | 100 | 10 | 16 | 3 | D | D | B | B |
| Example 15 | Inorganic acid/inorganic base | 9 | 100 | 10 | 14 | 4 | C | C | B | B |
| Example 16 | Inorganic acid/inorganic base | 10 | 100 | 10 | 8 | 5 | C | C | B | B |
| Example 17 | Inorganic acid/inorganic base | 12 | 100 | 10 | 4 | 10 | B | B | B | B |
| Example 18 | Inorganic acid/inorganic base | 13 | 100 | 10 | 3 | 16 | B | B | B | B |
| Example 19 | Inorganic acid/inorganic base | 11 | 100 | 10 | 3 | 5 | B | A | B | B |

TABLE 2

| | Formulation | | | | | | | | | | |
|---|---|---|---|---|---|---|---|---|---|---|---|
| Table 1-2 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
| Example 20 | HA 10.0% | Amine 1 1.0% | Sol. 16 60% | | Surf. 05 0.1% | Chem. 01 10 ppt | Chem. 02 10 ppt | | | 1.2 | Balance |
| Example 21 | HA 10.0% | Amine 1 0.5% TMAH 0.5% | Sol. 16 60% | | Surf. 05 0.1% | Chem. 01 10 ppt | Chem. 02 10 ppt | | | 1.2 | Balance |
| Example 22 | HA 10.0% | Amine 2 1.0% | Sol. 16 60% | | Surf. 05 0.1% | Chem. 01 10 ppt | Chem. 02 10 ppt | | | 0.9 | Balance |
| Example 23 | HA 10.0% | Amine 2 0.5% TMAH 0.5% | Sol. 16 60% | | Surf. 05 0.1% | Chem. 01 10 ppt | Chem. 02 10 ppt | | | 0.9 | Balance |
| Example 24 | HA 10.0% | Amine 3 1.0% | Sol. 16 60% | | Surf. 05 0.1% | Chem. 01 10 ppt | Chem. 02 10 ppt | | | 0.8 | Balance |
| Example 25 | HA 10.0% | Amine 3 0.5% TMAH 0.5% | Sol. 16 60% | | Surf. 05 0.1% | Chem. 01 10 ppt | Chem. 02 10 ppt | | | 0.8 | Balance |
| Example 26 | HA 10.0% | Amine 4 1.0% | Sol. 16 60% | | Surf. 05 0.1% | Chem. 01 10 ppt | Chem. 02 10 ppt | | | 1.0 | Balance |
| Example 27 | HA 10.0% | Amine 4 0.5% TMAH 0.5% | Sol. 16 60% | | Surf. 05 0.1% | Chem. 01 10 ppt | Chem. 02 10 ppt | | | 1.0 | Balance |
| Example 28 | HA 10.0% | Amine 5 1.0% | Sol. 16 60% | | Surf. 05 0.1% | Chem. 01 10 ppt | Chem. 02 10 ppt | | | 1.0 | Balance |
| Example 29 | HA 10.0% | Amine 5 0.5% TMAH 0.5% | Sol. 16 60% | | Surf. 05 0.1% | Chem. 01 10 ppt | Chem. 02 10 ppt | | | 1.0 | Balance |
| Example 30 | HA 10.0% | Amine 6 1.0% | Sol. 16 60% | | Surf. 05 0.1% | Chem. 01 10 ppt | Chem. 02 10 ppt | | | 0.8 | Balance |
| Example 31 | HA 10.0% | Amine 6 0.5% TMAH 0.5% | Sol. 16 60% | | Surf. 05 0.1% | Chem. 01 10 ppt | Chem. 02 10 ppt | | | 0.8 | Balance |
| Example 32 | HA 10.0% | Amine 7 1.0% | Sol. 16 60% | | Surf. 05 0.1% | Chem. 01 10 ppt | Chem. 02 10 ppt | | | 1.0 | Balance |

| | | | | | | | Evaluation | | |
|---|---|---|---|---|---|---|---|---|---|
| Table 1-2 | Formulation pH Adjusting agent | pH | HA/ surfactant | Basic compound/ surfactant | Co ER (Å/min) | W ER (Å/min) | Defect suppression property | Residue removal property (0 h) | Temporal stability (6 h) | Temporal stability (12 h) |
| Example 20 | DBU 0.1% | 11 | 100 | 11 | 4 | 8 | B | A | B | B |
| Example 21 | Inorganic acid/inorganic base | 11 | 100 | 10 | 4 | 8 | B | A | B | B |

TABLE 2-continued

| | | | | | | | | | | | |
|---|---|---|---|---|---|---|---|---|---|---|---|
| Example 22 | Inorganic acid/inorganic base | 11 | 100 | 10 | 5 | 4 | B | A | B | B | |
| Example 23 | Inorganic acid/inorganic base | 11 | 100 | 10 | 5 | 4 | B | A | B | B | |
| Example 24 | Inorganic acid/inorganic base | 11 | 100 | 10 | 3 | 5 | B | A | B | B | |
| Example 25 | Inorganic acid/inorganic base | 11 | 100 | 10 | 3 | 5 | B | A | B | B | |
| Example 26 | Inorganic acid/inorganic base | 11 | 100 | 10 | 4 | 6 | B | A | B | B | |
| Example 27 | Inorganic acid/inorganic base | 11 | 100 | 10 | 4 | 6 | B | A | B | B | |
| Example 28 | Inorganic acid/inorganic base | 11 | 100 | 10 | 4 | 6 | B | A | B | B | |
| Example 29 | Inorganic acid/inorganic base | 11 | 100 | 10 | 4 | 6 | B | A | B | B | |
| Example 30 | Inorganic acid/inorganic base | 11 | 100 | 10 | 3 | 5 | B | A | B | B | |
| Example 31 | Inorganic acid/inorganic base | 11 | 100 | 10 | 3 | 5 | B | A | B | B | |
| Example 32 | Inorganic acid/inorganic base | 11 | 100 | 10 | 4 | 6 | B | A | B | B | |

TABLE 3

| | Formulation | | | | | | | | | | |
|---|---|---|---|---|---|---|---|---|---|---|---|
| Table 1-3 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
| Example 33 | HA 10.0% | Amine 7 0.5% TMAH 0.5% | Sol. 16 60% | | Surf. 05 0.1% | Chem. 01 10 ppt | Chem. 02 10 ppt | | | 1.0 | Balance |
| Example 34 | HA 10.0% | TMAH 1.0% | Sol. 01 60% | Sol. 11 10% | Surf. 05 0.1% | Chem. 01 10 ppt | Chem. 02 10 ppt | | | 1.1 | Balance |
| Example 35 | HA 10.0% | TMAH 1.0% | Sol. 01 65% | Sol. 11 5% | Surf. 05 0.1% | Chem. 01 10 ppt | Chem. 02 10 ppt | | | 0.5 | Balance |
| Example 36 | HA 10.0% | TMAH 1.0% | Sol. 01 55% | Sol. 11 15% | Surf. 05 0.1% | Chem. 01 10 ppt | Chem. 02 10 ppt | | | 0.5 | Balance |
| Example 37 | HA 10.0% | TMAH 1.0% | Sol. 01 45% | Sol. 11 25% | Surf. 05 0.1% | Chem. 01 10 ppt | Chem. 02 10 ppt | | | 0.5 | Balance |
| Example 38 | HA 10.0% | TMAH 1.0% | Sol. 01 35% | Sol. 11 35% | Surf. 05 0.1% | Chem. 01 10 ppt | Chem. 02 10 ppt | | | 0.5 | Balance |
| Example 39 | HA 10.0% | TMAH 1.0% | Sol. 01 30% | Sol. 11 40% | Surf. 05 0.1% | Chem. 01 10 ppt | Chem. 02 10 ppt | | | 0.5 | Balance |
| Example 40 | HA 10.0% | Amine 1 1.0% | Sol. 01 60% | Sol. 11 10% | Surf 05 0.1% | Chem. 01 10 ppt | Chem. 02 10 ppt | | | 0.9 | Balance |
| Example 41 | HA 10.0% | Amine 2 1.0% | Sol. 01 60% | Sol. 11 10% | Surf. 05 0.1% | Chem. 01 10 ppt | Chem. 02 10 ppt | | | 1.1 | Balance |
| Example 42 | HA 10.0% | Amine 3 1.0% | Sol. 01 60% | Sol. 11 10% | Surf. 05 0.1% | Chem. 01 10 ppt | Chem. 02 10 ppt | | | 1.1 | Balance |
| Example 43 | HA 10.0% | Amine 3 0.5% TMAH 0.5% | Sol. 01 60% | Sol. 11 10% | Surf. 05 0.1% | Chem. 01 10 ppt | Chem. 02 10 ppt | | | 1.1 | Balance |
| Example 44 | HA 10.0% | Amine 4 1.0% | Sol. 01 60% | Sol. 11 10% | Surf. 05 0.1% | Chem. 01 10 ppt | Chem. 02 10 ppt | | | 1.1 | Balance |
| Example 45 | HA 10.0% | Amine 5 1.0% | Sol. 01 60% | Sol. 11 10% | Surf. 05 0.1% | Chem. 01 10 ppt | Chem. 02 10 ppt | | | 0.9 | Balance |
| Example 46 | HA 10.0% | Amine 6 1.0% | Sol. 01 60% | Sol. 11 10% | Surf. 05 0.1% | Chem. 01 10 ppt | Chem. 02 10 ppt | | | 1.1 | Balance |
| Example 47 | HA 10.0% | Amine 7 1.0% | Sol. 01 60% | Sol. 11 10% | Surf. 05 0.1% | Chem. 01 10 ppt | Chem. 02 10 ppt | | | 1.3 | Balance |

TABLE 3-continued

| | | | | | | | | | |
|---|---|---|---|---|---|---|---|---|---|
| Example 48 | HA 10.0% | TMAH 1.0% | Sol. 05 60% | | Surf. 05 0.1% | Chem. 01 10 ppt | Chem. 02 10 ppt | 1.1 | Balance |
| Example 49 | HA 10.0% | Amine 1 1.0% | Sol. 05 60% | | Surf. 05 0.1% | Chem. 01 10 ppt | Chem. 02 10 ppt | 1.0 | Balance |

| | | | | | | | Evaluation | | | |
|---|---|---|---|---|---|---|---|---|---|---|
| Table 1-3 | Formulation pH Adjusting agent | pH | HA/ surfactant | Basic compound/ surfactant | Co ER (Å/min) | W ER (Å/min) | Defect suppression property | Residue removal property (0 h) | Temporal stability (6 h) | Temporal stability (12 h) |
| Example 33 | Inorganic acid/inorganic base | 11 | 100 | 10 | 4 | 6 | B | A | B | B |
| Example 34 | Inorganic acid/inorganic base | 11 | 100 | 10 | 4 | 7 | B | A | B | B |
| Example 35 | Inorganic acid/inorganic base | 11 | 100 | 10 | 3 | 2 | B | A | B | B |
| Example 36 | Inorganic acid/inorganic base | 11 | 100 | 10 | 3 | 2 | B | A | B | B |
| Example 37 | Inorganic acid/inorganic base | 11 | 100 | 10 | 3 | 2 | B | A | B | B |
| Example 38 | Inorganic acid/inorganic base | 11 | 100 | 10 | 3 | 2 | B | A | B | B |
| Example 39 | Inorganic acid/inorganic base | 11 | 100 | 10 | 3 | 2 | B | A | B | B |
| Example 40 | Inorganic acid/inorganic base | 11 | 100 | 10 | 3 | 6 | B | A | B | B |
| Example 41 | Inorganic acid/inorganic base | 11 | 100 | 10 | 4 | 7 | B | A | B | B |
| Example 42 | Inorganic acid/inorganic base | 11 | 100 | 10 | 3 | 8 | B | A | B | B |
| Example 43 | Inorganic acid/inorganic base | 11 | 100 | 10 | 3 | 8 | B | A | B | B |
| Example 44 | Inorganic acid/inorganic base | 11 | 100 | 10 | 4 | 7 | B | A | B | B |
| Example 45 | Inorganic acid/inorganic base | 11 | 100 | 10 | 3 | 6 | B | A | B | B |
| Example 46 | Inorganic acid/inorganic base | 11 | 100 | 10 | 4 | 7 | B | A | B | B |
| Example 47 | Inorganic acid/inorganic base | 11 | 100 | 10 | 5 | 8 | B | A | B | B |
| Example 48 | Inorganic acid/inorganic base | 11 | 100 | 10 | 3 | 8 | B | A | B | B |
| Example 49 | Inorganic acid/inorganic base | 11 | 100 | 10 | 4 | 6 | B | A | B | B |

TABLE 4

| | Formulation | | | | | | | | | | |
|---|---|---|---|---|---|---|---|---|---|---|---|
| Table 1-4 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
| Example 50 | HA 10.0% | Amine 2 1.0% | Sol. 05 60% | | Surf. 05 0.1% | Chem. 01 10 ppt | Chem. 02 10 ppt | | | 1.1 | Balance |
| Example 51 | HA 10.0% | Amine 3 1.0% | Sol. 05 60% | | Surf. 05 0.1% | Chem. 01 10 ppt | Chem. 02 10 ppt | | | 0.9 | Balance |

TABLE 4-continued

| | | | | | | | | | | |
|---|---|---|---|---|---|---|---|---|---|---|
| Example 52 | HA 10.0% | Amine 3 0.5% TMAH 0.5% | Sol. 05 60% | | Surf. 05 0.1% | Chem. 01 10 ppt | Chem. 02 10 ppt | | 0.9 | Balance |
| Example 53 | HA 10.0% | Amine 4 1.0% | Sol. 05 60% | | Surf. 05 0.1% | Chem. 01 10 ppt | Chem. 02 10 ppt | | 1.1 | Balance |
| Example 54 | HA 10.0% | Amine 5 1.0% | Sol. 05 60% | | Surf. 05 0.1% | Chem. 01 10 ppt | Chem. 02 10 ppt | | 0.8 | Balance |
| Example 55 | HA 10.0% | Amine 6 1.0% | Sol. 05 60% | | Surf. 05 0.1% | Chem. 01 10 ppt | Chem. 02 10 ppt | | 1.1 | Balance |
| Example 56 | HA 10.0% | Amine 7 1.0% | Sol. 05 60% | | Surf. 05 0.1% | Chem. 01 10 ppt | Chem. 02 10 ppt | | 0.9 | Balance |
| Example 57 | HA 10.0% | TMAH 1.0% | Sol. 06 60% | | Surf. 05 0.1% | Chem. 01 10 ppt | Chem. 02 10 ppt | | 1.1 | Balance |
| Example 58 | HA 10.0% | Amine 1 1.0% | Sol. 06 60% | | Surf. 05 0.1% | Chem. 01 10 ppt | Chem. 02 10 ppt | | 1.3 | Balance |
| Example 59 | HA 10.0% | Amine 2 1.0% | Sol. 06 60% | | Surf. 05 0.1% | Chem. 01 10 ppt | Chem. 02 10 ppt | | 1.1 | Balance |
| Example 60 | HA 10.0% | Amine 3 1.0% | Sol. 06 60% | | Surf. 05 0.1% | Chem. 01 10 ppt | Chem. 02 10 ppt | | 1.0 | Balance |
| Example 61 | HA 10.0% | Amine 3 0.5% TMAH 0.5% | Sol. 06 60% | | Surf. 05 0.1% | Chem. 01 10 ppt | Chem. 02 10 ppt | | 1.0 | Balance |
| Example 62 | HA 10.0% | Amine 4 1.0% | Sol. 06 60% | | Surf. 05 0.1% | Chem. 01 10 ppt | Chem. 02 10 ppt | | 1.1 | Balance |
| Example 63 | HA 10.0% | Amine 5 1.0% | Sol. 06 60% | | Surf. 05 0.1% | Chem. 01 10 ppt | Chem. 02 10 ppt | | 0.9 | Balance |
| Example 64 | HA 10.0% | Amine 6 1.0% | Sol. 06 60% | | Surf. 05 0.1% | Chem. 01 10 ppt | Chem. 02 10 ppt | | 1.1 | Balance |
| Example 65 | HA 10.0% | Amine 7 1.0% | Sol. 06 60% | | Surf. 05 0.1% | Chem. 01 10 ppt | Chem. 02 10 ppt | | 0.8 | Balance |
| Example 66 | HA 10.0% | TMAH 1.0% | Sol. 07 60% | | Surf 05 0.1% | Chem. 01 10 ppt | Chem. 02 10 ppt | | 1.1 | Balance |

| | | | | | | | Evaluation | | | |
|---|---|---|---|---|---|---|---|---|---|---|
| Table 1-4 | Formulation pH Adjusting agent | pH | HA/ surfactant | Basic compound/ surfactant | Co ER (Å/min) | W ER (Å/min) | Defect suppression property | Residue removal property (0 h) | Temporal stability (6 h) | Temporal stability (12 h) |
| Example 50 | Inorganic acid/inorganic base | 11 | 100 | 10 | 4 | 7 | B | A | B | B |
| Example 51 | Inorganic acid/inorganic base | 11 | 100 | 10 | 3 | 6 | B | A | B | B |
| Example 52 | Inorganic acid/inorganic base | 11 | 100 | 10 | 3 | 6 | B | A | B | B |
| Example 53 | Inorganic acid/inorganic base | 11 | 100 | 10 | 4 | 7 | B | A | B | B |
| Example 54 | Inorganic acid/inorganic base | 11 | 100 | 10 | 3 | 5 | B | A | B | B |
| Example 55 | DBU 0.1% | 11 | 100 | 11 | 4 | 7 | B | A | B | B |
| Example 56 | Inorganic acid/inorganic base | 11 | 100 | 10 | 3 | 6 | B | A | B | B |
| Example 57 | Inorganic acid/inorganic base | 11 | 100 | 10 | 4 | 7 | B | A | B | B |
| Example 58 | Inorganic acid/inorganic base | 11 | 100 | 10 | 5 | 8 | B | A | B | B |
| Example 59 | Inorganic acid/inorganic base | 11 | 100 | 10 | 3 | 8 | B | A | B | B |
| Example 60 | Inorganic acid/inorganic base | 11 | 100 | 10 | 4 | 6 | B | A | B | B |
| Example 61 | Inorganic acid/inorganic base | 11 | 100 | 10 | 4 | 6 | B | A | B | B |
| Example 62 | Inorganic acid/inorganic base | 11 | 100 | 10 | 4 | 7 | B | A | B | B |

TABLE 4-continued

| Table 1-5 | Formulation pH Adjusting agent | pH | HA/ surfactant | Basic compound/ surfactant | Co ER (Å/min) | W ER (Å/min) | Defect suppression property | Residue removal property (0 h) | Temporal stability (6 h) | Temporal stability (12 h) |
|---|---|---|---|---|---|---|---|---|---|---|
| Example 63 | Inorganic acid/inorganic base | 11 | 100 | 10 | 3 | 6 | B | A | B | B |
| Example 64 | Inorganic acid/inorganic base | 11 | 100 | 10 | 4 | 7 | B | A | B | B |
| Example 65 | Inorganic acid/inorganic base | 11 | 100 | 10 | 3 | 5 | B | A | B | B |
| Example 66 | Inorganic acid/inorganic base | 11 | 100 | 10 | 4 | 7 | B | A | B | B |

TABLE 5

| Table 1-5 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
|---|---|---|---|---|---|---|---|---|---|---|---|
| Example 67 | HA 10.0% | Amine 1 1.0% | Sol. 07 60% | | Surf. 05 0.1% | Chem. 01 10 ppt | Chem. 02 10 ppt | | | 1.1 | Balance |
| Example 68 | HA 10.0% | Amine 2 1.0% | Sol. 07 60% | | Surf. 05 0.1% | Chem. 01 10 ppt | Chem. 02 10 ppt | | | 0.8 | Balance |
| Example 69 | HA 10.0% | Amine 3 1.0% | Sol. 07 60% | | Surf. 05 0.1% | Chem. 01 10 ppt | Chem. 02 10 ppt | | | 1.0 | Balance |
| Example 70 | HA 10.0% | Amine 3 0.5% TMAH 0.5% | Sol. 07 60% | | Surf. 05 0.1% | Chem. 01 10 ppt | Chem. 02 10 ppt | | | 1.0 | Balance |
| Example 71 | HA 10.0% | Amine 4 1.0% | Sol. 07 60% | | Surf. 05 0.1% | Chem. 01 10 ppt | Chem. 02 10 ppt | | | 1.0 | Balance |
| Example 72 | HA 10.0% | Amine 5 1.0% | Sol. 07 60% | | Surf. 05 0.1% | Chem. 01 10 ppt | Chem. 02 10 ppt | | | 1.1 | Balance |
| Example 73 | HA 10.0% | Amine 6 1.0% | Sol. 07 60% | | Surf. 05 0.1% | Chem. 01 10 ppt | Chem. 02 10 ppt | | | 0.9 | Balance |
| Example 74 | HA 10.0% | Amine 7 1.0% | Sol. 07 60% | | Surf. 05 0.1% | Chem. 01 10 ppt | Chem. 02 10 ppt | | | 1.0 | Balance |
| Example 75 | HA 10.0% | TMAH 1.0% | Sol. 10 60% | | Surf. 05 0.1% | Chem. 01 10 ppt | Chem. 02 10 ppt | | | 0.8 | Balance |
| Example 76 | HA 10.0% | Amine 1 1.0% | Sol. 10 60% | | Surf. 05 0.1% | Chem. 01 10 ppt | Chem. 02 10 ppt | | | 1.2 | Balance |
| Example 77 | HA 10.0% | Amine 2 1.0% | Sol. 10 60% | | Surf. 05 0.1% | Chem. 01 10 ppt | Chem. 02 10 ppt | | | 1.1 | Balance |
| Example 78 | HA 10.0% | Amine 3 1.0% | Sol. 10 60% | | Surf. 05 0.1% | Chem. 01 10 ppt | Chem. 02 10 ppt | | | 0.8 | Balance |
| Example 79 | HA 10.0% | Amine 3 0.5% TMAH 0.5% | Sol. 10 60% | | Surf. 05 0.1% | Chem. 01. 10 ppt | Chem. 02 10 ppt | | | 1.1 | Balance |
| Example 80 | HA 10.0% | Amine 4 1.0% | Sol. 10 60% | | Surf. 05 0.1% | Chem. 01 10 ppt | Chem. 02 10 ppt | | | 1.0 | Balance |
| Example 81 | HA 10.0% | Amine 5 1.0% | Sol. 10 60% | | Surf. 05 0.1% | Chem. 01 10 ppt | Chem. 02 10 ppt | | | 0.8 | Balance |
| Example 82 | HA 10.0% | Amine 6 1.0% | Sol. 10 60% | | Surf. 05 0.1% | Chem. 01 10 ppt | Chem. 02 10 ppt | | | 0.8 | Balance |
| Example 83 | HA 10.0% | Amine 7 1.0% | Sol. 10 60% | | Surf. 05 0.1% | Chem. 01 10 ppt | Chem. 02 10 ppt | | | 0.9 | Balance |

| Table 1-5 | Formulation pH Adjusting agent | pH | HA/ surfactant | Basic compound/ surfactant | Co ER (Å/min) | W ER (Å/min) | Defect suppression property | Residue removal property (0 h) | Temporal stability (6 h) | Temporal stability (12 h) |
|---|---|---|---|---|---|---|---|---|---|---|
| Example 67 | Inorganic acid/inorganic base | 11 | 100 | 10 | 5 | 6 | B | A | B | B |
| Example 68 | Inorganic acid/inorganic base | 11 | 100 | 10 | 3 | 5 | B | A | B | B |
| Example 69 | Inorganic acid/inorganic base | 11 | 100 | 10 | 4 | 6 | B | A | B | B |

TABLE 5-continued

| Example | | | | | | | | | | | |
|---|---|---|---|---|---|---|---|---|---|---|---|
| Example 70 | Inorganic acid/inorganic base | 11 | 100 | 10 | 4 | 6 | B | A | B | B | |
| Example 71 | Inorganic acid/inorganic base | 11 | 100 | 10 | 4 | 6 | B | A | B | B | |
| Example 72 | Inorganic acid/inorganic base | 11 | 100 | 10 | 3 | 8 | B | A | B | B | |
| Example 73 | Inorganic acid/inorganic base | 11 | 100 | 10 | 3 | 6 | B | A | B | B | |
| Example 74 | Inorganic acid/inorganic base | 11 | 100 | 10 | 4 | 6 | B | A | B | B | |
| Example 75 | Inorganic acid/inorganic base | 11 | 100 | 10 | 3 | 5 | B | A | B | B | |
| Example 76 | Inorganic acid/inorganic base | 11 | 100 | 10 | 4 | 8 | B | A | B | B | |
| Example 77 | Inorganic acid/inorganic base | 11 | 100 | 10 | 5 | 6 | B | A | B | B | |
| Example 78 | Inorganic acid/inorganic base | 11 | 100 | 10 | 3 | 5 | B | A | B | B | |
| Example 79 | Inorganic acid/inorganic base | 11 | 100 | 10 | 4 | 6 | B | A | B | B | |
| Example 80 | Inorganic acid/inorganic base | 11 | 100 | 10 | 4 | 6 | B | A | B | B | |
| Example 81 | Inorganic acid/inorganic base | 11 | 100 | 10 | 4 | 4 | B | A | B | B | |
| Example 82 | Inorganic acid/inorganic base | 11 | 100 | 10 | 3 | 5 | B | A | B | B | |
| Example 83 | Inorganic acid/inorganic base | 11 | 100 | 10 | 3 | 6 | B | A | B | B | |

TABLE 6

| | Formulation | | | | | | | | | | |
|---|---|---|---|---|---|---|---|---|---|---|---|
| Table 1-6 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
| Example 84 | HA 10.0% | TMAH 1.0% | Sol. 11 60% | | Surf. 05 0.1% | Chem. 01 10 ppt | Chem. 02 10 ppt | | | 1.1 | Balance |
| Example 85 | HA 10.0% | Amine 1 1.0% | Sol. 11 60% | | Surf. 05 0.1% | Chem. 01 10 ppt | Chem. 02 10 ppt | | | 0.8 | Balance |
| Example 86 | HA 10.0% | Amine 2 1.0% | Sol. 11 60% | | Surf. 05 0.1% | Chem. 01 10 ppt | Chem. 02 10 ppt | | | 1.2 | Balance |
| Example 87 | HA 10.0% | Amine 3 1.0% | Sol. 11 60% | | Surf. 05 0.1% | Chem. 01 10 ppt | Chem. 02 10 ppt | | | 1.1 | Balance |
| Example 88 | HA 10.0% | Amine 3 0.5% TMAH 0.5% | Sol. 11 60% | | Surf. 05 0.1% | Chem. 01 10 ppt | Chem. 02 10 ppt | | | 1.1 | Balance |
| Example 89 | HA 10.0% | Amine 4 1.0% | Sol. 11 60% | | Surf. 05 0.1% | Chem. 01 10 ppt | Chem. 02 10 ppt | | | 0.8 | Balance |
| Example 90 | HA 10.0% | Amine 5 1.0% | Sol. 11 60% | | Surf. 05 0.1% | Chem. 01 10 ppt | Chem. 02 10 ppt | | | 1.0 | Balance |
| Example 91 | HA 10.0% | Amine 6 1.0% | Sol. 11 60% | | Surf. 05 0.1% | Chem. 01 10 ppt | Chem. 02 10 ppt | | | 1.1 | Balance |
| Example 92 | HA 10.0% | Amine 7 1.0% | Sol. 11 60% | | Surf. 05 0.1% | Chem. 01 10 ppt | Chem. 02 10 ppt | | | 0.8 | Balance |
| Example 93 | HA 10.0% | TMAH 1.0% | Sol. 12 60% | | Surf. 05 0.1% | Chem. 01 10 ppt | Chem. 02 10 ppt | | | 1.2 | Balance |
| Example 94 | HA 10.0% | Amine 1 1.0% | Sol. 12 60% | | Surf. 05 0.1% | Chem. 01 10 ppt | Chem. 02 10 ppt | | | 0.8 | Balance |

TABLE 6-continued

| Example | HA | Amine | Sol. | | Surf. | Chem. 01 | Chem. 02 | | | |
|---|---|---|---|---|---|---|---|---|---|---|
| Example 95 | HA 10.0% | Amine 2 1.0% | Sol. 12 60% | | Surf. 05 0.1% | Chem. 01 10 ppt | Chem. 02 10 ppt | | | 1.1 | Balance |
| Example 96 | HA 10.0% | Amine 3 1.0% | Sol. 12 60% | | Surf. 05 0.1% | Chem. 01 10 ppt | Chem. 02 10 ppt | | | 0.8 | Balance |
| Example 97 | HA 10.0% | Amine 3 0.5% TMAH 0.5% | Sol. 12 60% | | Surf. 05 0.1% | Chem. 01 10 ppt | Chem. 02 10 ppt | | | 0.8 | Balance |
| Example 98 | HA 10.0% | Amine 4 1.0% | Sol. 12 60% | | Surf. 05 0.1% | Chem. 01 10 ppt | Chem. 02 10 ppt | | | 1.0 | Balance |
| Example 99 | HA 10.0% | Amine 5 1.0% | Sol. 12 60% | | Surf. 05 0.1% | Chem. 01 10 ppt | Chem. 02 10 ppt | | | 1.3 | Balance |
| Example 100 | HA 10.0% | Amine 6 1.0% | Sol. 12 60% | | Surf. 05 0.1% | Chem. 01 10 ppt | Chem. 02 10 ppt | | | 0.8 | Balance |

| | | | | | | | Evaluation | | | |
|---|---|---|---|---|---|---|---|---|---|---|
| Table 1-6 | Formulation pH Adjusting agent | pH | HA/ surfactant | Basic compound/ surfactant | Co ER (Å/min) | W ER (Å/min) | Defect suppression property | Residue removal property (0 h) | Temporal stability (6 h) | Temporal stability (12 h) |
| Example 84 | Inorganic acid/inorganic base | 11 | 100 | 10 | 4 | 7 | B | A | B | B |
| Example 85 | Inorganic acid/inorganic base | 11 | 100 | 10 | 3 | 5 | B | A | B | B |
| Example 86 | Inorganic acid/inorganic base | 11 | 100 | 10 | 4 | 8 | B | A | B | B |
| Example 87 | Inorganic acid/inorganic base | 11 | 100 | 10 | 5 | 6 | B | A | B | B |
| Example 88 | Inorganic acid/inorganic base | 11 | 100 | 10 | 5 | 6 | B | A | B | B |
| Example 89 | Inorganic acid/inorganic base | 11 | 100 | 10 | 3 | 5 | B | A | B | B |
| Example 90 | Inorganic acid/inorganic base | 11 | 100 | 10 | 4 | 6 | B | A | B | B |
| Example 91 | Inorganic acid/inorganic base | 11 | 100 | 10 | 4 | 7 | B | A | B | B |
| Example 92 | Inorganic acid/inorganic base | 11 | 100 | 10 | 3 | 5 | B | A | B | B |
| Example 93 | Inorganic acid/inorganic base | 11 | 100 | 10 | 4 | 8 | B | A | B | B |
| Example 94 | Inorganic acid/inorganic base | 11 | 100 | 10 | 3 | 5 | B | A | B | B |
| Example 95 | Inorganic acid/inorganic base | 11 | 100 | 10 | 4 | 7 | B | A | B | B |
| Example 96 | Inorganic acid/inorganic base | 11 | 100 | 10 | 3 | 5 | B | A | B | B |
| Example 97 | Inorganic acid/inorganic base | 11 | 100 | 10 | 3 | 5 | B | A | B | B |
| Example 98 | Inorganic acid/inorganic base | 11 | 100 | 10 | 4 | 6 | B | A | B | B |
| Example 99 | Inorganic acid/inorganic base | 11 | 100 | 10 | 5 | 8 | B | A | B | B |
| Example 100 | Inorganic acid/inorganic base | 11 | 100 | 10 | 3 | 5 | B | A | B | B |

TABLE 7

| Table 1-7 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water | Formulation pH Adjusting agent | pH | HA/surfactant | Basic compound/surfactant | Co ER (Å/min) | W ER (Å/min) | Defect suppression property | Residue removal property (0 h) | Temporal stability (6 h) | Temporal stability (12 h) |
|---|---|---|---|---|---|---|---|---|---|---|---|---|---|---|---|---|---|---|---|---|---|
| Example 101 | HA 10.0% | Amine 7 1.0% | Sol. 12 60% | | Surf. 05 0.1% | Chem. 01 10 ppt | Chem. 02 10 ppt | | | 1.0 | Balance | Inorganic acid/inorganic base | 11 | 100 | 10 | 4 | 6 | B | A | B | B |
| Example 102 | HA 10.0% | TMAH 1.0% | Sol. 13 60% | | Surf. 05 0.1% | Chem. 01 10 ppt | Chem. 02 10 ppt | | | 1.1 | Balance | Inorganic acid/inorganic base | 11 | 100 | 10 | 4 | 7 | B | A | B | B |
| Example 103 | HA 10.0% | Amine 1 1.0% | Sol. 13 60% | | Surf. 05 0.1% | Chem. 01 10 ppt | Chem. 02 10 ppt | | | 0.8 | Balance | Inorganic acid/inorganic base | 11 | 100 | 10 | 3 | 5 | B | A | B | B |
| Example 104 | HA 10.0% | Amine 2 1.0% | Sol. 13 60% | | Surf. 05 0.1% | Chem. 01 10 ppt | Chem. 02 10 ppt | | | 1.2 | Balance | Inorganic acid/inorganic base | 11 | 100 | 10 | 4 | 8 | B | A | B | B |
| Example 105 | HA 10.0% | Amine 3 1.0% | Sol. 13 60% | | Surf. 05 0.1% | Chem. 01 10 ppt | Chem. 02 10 ppt | | | 0.8 | Balance | Inorganic acid/inorganic base | 11 | 100 | 10 | 3 | 5 | B | A | B | B |
| Example 106 | HA 10.0% | Amine 3 0.5% TMAH 0.5% | Sol. 13 60% | | Surf. 05 0.1% | Chem. 01 10 ppt | Chem. 02 10 ppt | | | 0.8 | Balance | Inorganic acid/inorganic base | 11 | 100 | 10 | 3 | 5 | B | A | B | B |
| Example 107 | HA 10.0% | Amine 4 1.0% | Sol. 13 60% | | Surf. 05 0.1% | Chem, 01 10 ppt | Chem. 02 10 ppt | | | 1.0 | Balance | Inorganic acid/inorganic base | 11 | 100 | 10 | 4 | 6 | B | A | B | B |
| Example 108 | HA 10.0% | Amine 5 1.0% | Sol. 13 60% | | Surf. 05 0.1% | Chem. 01 10 ppt | Chem. 02 10 ppt | | | 0.8 | Balance | Inorganic acid/inorganic base | 11 | 100 | 10 | 3 | 5 | B | A | B | B |
| Example 109 | HA 10.0% | Amine 6 1.0% | Sol. 13 60% | | Surf. 05 0.1% | Chem. 01 10 ppt | Chem. 02 10 ppt | | | 1.1 | Balance | Inorganic acid/inorganic base | 11 | 100 | 10 | 4 | 7 | B | A | B | B |
| Example 110 | HA 10.0% | Amine 7 1.0% | Sol. 13 60% | | Surf. 05 0.1% | Chem. 01 10 ppt | Chem. 02 10 ppt | | | 1.3 | Balance | | | | | | | | | | |
| Example 111 | HA 10.0% | TMAH 1.0% | Sol. 14 60% | | Surf 05 0.1% | Chem. 01 10 ppt | Chem. 02 10 ppt | | | 0.8 | Balance | | | | | | | | | | |
| Example 112 | HA 10.0% | Amine 1 1.0% | Sol. 14 60% | | Surf. 05 0.1% | Chem. 01 10 ppt | Chem. 02 10 ppt | | | 0.8 | Balance | | | | | | | | | | |
| Example 113 | HA 10.0% | Amine 2 1.0% | Sol. 14 60% | | Surf. 05 0.1% | Chem. 01 10 ppt | Chem. 02 10 ppt | | | 1.1 | Balance | | | | | | | | | | |
| Example 114 | HA 10.0% | Amine 3 1.0% | Sol. 14 60% | | Surf. 05 0.1% | Chem. 01 10 ppt | Chem. 02 10 ppt | | | 0.9 | Balance | | | | | | | | | | |
| Example 115 | HA 10.0% | Amine 3 0.5% TMAH 0.5% | Sol. 14 60% | | Surf. 05 0.1% | Chem. 01 10 ppt | Chem. 02 10 ppt | | | 0.9 | Balance | | | | | | | | | | |
| Example 116 | HA 10.0% | Amine 4 1.0% | Sol. 14 60% | | Surf. 05 0.1% | Chem. 01 10 ppt | Chem. 02 10 ppt | | | 1.2 | Balance | | | | | | | | | | |
| Example 117 | HA 10.0% | Amine 5 1.0% | Sol. 14 60% | | Surf. 05 0.1% | Chem. 01 10 ppt | Chem. 02 10 ppt | | | 1.1 | Balance | | | | | | | | | | |

TABLE 7-continued

| | | | | | | | | | | |
|---|---|---|---|---|---|---|---|---|---|---|
| Example 110 | Inorganic acid/inorganic base | 11 | 100 | 10 | 5 | 8 | B | A | B | B |
| Example 111 | Inorganic acid/inorganic base | 11 | 100 | 10 | 3 | 5 | B | A | B | B |
| Example 112 | Inorganic acid/inorganic base | 11 | 100 | 10 | 3 | 5 | B | A | B | B |
| Example 113 | Inorganic acid/inorganic base | 11 | 100 | 10 | 4 | 7 | B | A | B | B |
| Example 114 | Inorganic acid/inorganic base | 11 | 100 | 10 | 3 | 6 | B | A | B | B |
| Example 115 | Inorganic acid/inorganic base | 11 | 100 | 10 | 3 | 6 | B | A | B | B |
| Example 116 | Inorganic acid/inorganic base | 11 | 100 | 10 | 4 | 8 | B | A | B | B |
| Example 117 | Inorganic acid/inorganic base | 11 | 100 | 10 | 5 | 6 | B | A | B | B |

TABLE 8

| | Formulation | | | | | | | | | | |
|---|---|---|---|---|---|---|---|---|---|---|---|
| Table 1-8 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
| Example 118 | HA 10.0% | Amine 6 1.0% | Sol. 14 60% | | Surf. 05 0.1% | Chem. 01 10 ppt | Chem. 02 10 ppt | | | 0.8 | Balance |
| Example 119 | HA 10.0% | Amine 7 1.0% | Sol. 14 60% | | Surf. 05 0.1% | Chem. 01 10 ppt | Chem. 02 10 ppt | | | 1.0 | Balance |
| Example 120 | HA 10.0% | TMAH 1.0% | Sol. 15 60% | | Surf. 05 0.1% | Chem. 01 10 ppt | Chem. 02 10 ppt | | | 1.0 | Balance |
| Example 121 | HA 10.0% | Amine 1 1.0% | Sol. 15 60% | | Surf. 05 0.1% | Chem. 01 10 ppt | Chem. 02 10 ppt | | | 0.8 | Balance |
| Example 122 | HA 10.0% | Amine 2 1.0% | Sol. 15 60% | | Surf. 05 0.1% | Chem. 01 10 ppt | Chem. 02 10 ppt | | | 1.1 | Balance |
| Example 123 | HA 10.0% | Amine 3 1.0% | Sol. 15 60% | | Surf. 05 0.1% | Chem. 01 10 ppt | Chem. 02 10 ppt | | | 0.8 | Balance |
| Example 124 | HA 10.0% | Amine 3 0.5% TMAH 0.5% | Sol. 15 60% | | Surf. 05 0.1% | Chem. 01 10 ppt | Chem. 02 10 ppt | | | 0.8 | Balance |
| Example 125 | HA 10.0% | Amine 4 1.0% | Sol. 15 60% | | Surf. 05 0.1% | Chem. 01 10 ppt | Chem. 02 10 ppt | | | 1.0 | Balance |
| Example 126 | HA 10.0% | Amine 5 1.0% | Sol. 15 60% | | Surf. 05 0.1% | Chem. 01 10 ppt | Chem. 02 10 ppt | | | 0.8 | Balance |
| Example 127 | HA 10.0% | Amine 6 1.0% | Sol. 15 60% | | Surf. 05 0.1% | Chem. 01 10 ppt | Chem. 02 10 ppt | | | 1.2 | Balance |
| Example 128 | HA 10.0% | Amine 7 1.0% | Sol. 15 60% | | Surf. 05 0.1% | Chem. 01 10 ppt | Chem. 02 10 ppt | | | 1.3 | Balance |
| Example 129 | HA 10.0% | Amine 1 1.0% | Sol. 16 60% | | Surf. 05 0.1% | Chem. 01 10 ppt | Chem. 02 10 ppt | | | 1.1 | Balance |
| Example 130 | HA 10.0% | Amine 2 1.0% | Sol. 16 60% | | Surf. 05 0.1% | Chem. 01 10 ppt | Chem. 02 10 ppt | | | 1.0 | Balance |
| Example 131 | HA 10.0% | Amine 5 1.0% | Sol. 16 60% | | Surf. 05 0.1% | Chem. 01 10 ppt | Chem. 02 10 ppt | | | 0.8 | Balance |
| Example 132 | HA 10.0% | Amine 6 1.0% | Sol. 16 60% | | Surf. 05 0.1% | Chem. 01 10 ppt | Chem. 02 10 ppt | | | 1.1 | Balance |
| Example 133 | HA 10.0% | Amine 7 1.0% | Sol. 16 60% | | Surf. 05 0.1% | Chem. 01 10 ppt | Chem. 02 10 ppt | | | 1.1 | Balance |
| Example 134 | HA 10.0% | TMAH 1.0% | Sol. 14 60% | Sol. 11 10% | Surf. 05 0.1% | Chem. 01 10 ppt | Chem. 02 10 ppt | | | 0.8 | Balance |
| Example 135 | HA 10.0% | Amine 1 1.0% | Sol. 14 60% | Sol. 11 10% | Surf. 05 0.1% | Chem. 01 10 ppt | Chem. 02 10 ppt | | | 1.0 | Balance |

TABLE 8-continued

|  | Table 1-8 | Formulation pH Adjusting agent | pH | HA/ surfactant | Basic compound/ surfactant | Co ER (Å/min) | W ER (Å/min) | Defect suppression property | Residue removal property (0 h) | Temporal stability (6 h) | Temporal stability (12 h) |
| --- | --- | --- | --- | --- | --- | --- | --- | --- | --- | --- | --- |
| Example 118 | | Inorganic acid/inorganic base | 11 | 100 | 10 | 3 | 5 | B | A | B | B |
| Example 119 | | Inorganic acid/inorganic base | 11 | 100 | 10 | 4 | 6 | B | A | B | B |
| Example 120 | | Inorganic acid/inorganic base | 11 | 100 | 10 | 4 | 6 | B | A | B | B |
| Example 121 | | Inorganic acid/inorganic base | 11 | 100 | 10 | 3 | 5 | B | A | B | B |
| Example 122 | | Inorganic acid/inorganic base | 11 | 100 | 10 | 4 | 7 | B | A | B | B |
| Example 123 | | Inorganic acid/inorganic base | 11 | 100 | 10 | 3 | 5 | B | A | B | B |
| Example 124 | | Inorganic acid/inorganic base | 11 | 100 | 10 | 3 | 5 | B | A | B | B |
| Example 125 | | Inorganic acid/inorganic base | 11 | 100 | 10 | 4 | 6 | B | A | B | B |
| Example 126 | | Inorganic acid/inorganic base | 11 | 100 | 10 | 3 | 5 | B | A | B | B |
| Example 127 | | Inorganic acid/inorganic base | 11 | 100 | 10 | 4 | 8 | B | A | B | B |
| Example 128 | | Inorganic acid/inorganic base | 11 | 100 | 10 | 5 | 8 | B | A | B | B |
| Example 129 | | Inorganic acid/inorganic base | 11 | 100 | 10 | 4 | 7 | B | A | B | B |
| Example 130 | | Inorganic acid/inorganic base | 11 | 100 | 10 | 4 | 6 | B | A | B | B |
| Example 131 | | Inorganic acid/inorganic base | 11 | 100 | 10 | 3 | 5 | B | A | B | B |
| Example 132 | | Inorganic acid/inorganic base | 11 | 100 | 10 | 4 | 7 | B | A | B | B |
| Example 133 | | Inorganic acid/inorganic base | 11 | 100 | 10 | 5 | 6 | B | A | B | B |
| Example 134 | | Inorganic acid/inorganic base | 11 | 100 | 10 | 3 | 5 | B | A | B | B |
| Example 135 | | Inorganic acid/inorganic base | 11 | 100 | 10 | 4 | 6 | B | A | B | B |

TABLE 9

| | Formulation | | | | | | | | | |
| --- | --- | --- | --- | --- | --- | --- | --- | --- | --- | --- |
| Table 1-9 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
| Example 136 | HA 10.0% | Amine 2 1.0% | Sol. 14 60% | Sol. 11 10% | Surf. 05 0.1% | Chem. 01 10 ppt | Chem. 02 10 ppt | | | 1.1 | Balance |
| Example 137 | HA 10.0% | Amine 3 1.0% | Sol. 14 60% | Sol. 11 10% | Surf. 05 0.1% | Chem. 01 10 ppt | Chem. 02 10 ppt | | | 0.8 | Balance |
| Example 138 | HA 10.0% | Amine 3 0.5% TMAH 0.5% | Sol. 14 60% | Sol. 11 10% | Surf. 05 0.1% | Chem. 01 10 ppt | Chem. 02 10 ppt | | | 0.8 | Balance |
| Example 139 | HA 10.0% | Amine 4 1.0% | Sol. 14 60% | Sol. 11 10% | Surf. 05 0.1% | Chem. 01 10 ppt | Chem. 02 10 ppt | | | 1.0 | Balance |
| Example 140 | HA 10.0% | Amine 5 1.0% | Sol. 14 60% | Sol. 11 10% | Surf. 05 0.1% | Chem. 01 10 ppt | Chem. 02 10 ppt | | | 0.8 | Balance |
| Example 141 | HA 10.0% | Amine 6 1.0% | Sol. 14 60% | Sol. 11 10% | Surf. 05 0.1% | Chem. 01 10 ppt | Chem. 02 10 ppt | | | 1.1 | Balance |
| Example 142 | HA 10.0% | Amine 7 1.0% | Sol. 14 60% | Sol. 11 10% | Surf. 05 0.1% | Chem. 01 10 ppt | Chem. 02 10 ppt | | | 0.8 | Balance |
| Example 143 | HA 10.0% | TMAH 1.0% | Sol. 15 60% | Sol. 11 10% | Surf. 05 0.1% | Chem. 01 10 ppt | Chem. 02 10 ppt | | | 1.0 | Balance |
| Example 144 | HA 10.0% | Amine 1 1.0% | Sol. 15 60% | Sol. 11 10% | Surf. 05 0.1% | Chem. 01 10 ppt | Chem. 02 10 ppt | | | 1.1 | Balance |
| Example 145 | HA 10.0% | Amine 2 1.0% | Sol. 15 60% | Sol. 11 10% | Surf. 05 0.1% | Chem. 01 10 ppt | Chem. 02 10 ppt | | | 0.8 | Balance |
| Example 146 | HA 10.0% | Amine 3 1.0% | Sol. 15 60% | Sol. 11 10% | Surf. 05 0.1% | Chem. 01 10 ppt | Chem. 02 10 ppt | | | 0.9 | Balance |

TABLE 9-continued

| Example | | | | | | | | | | |
|---|---|---|---|---|---|---|---|---|---|---|
| Example 147 | HA 10.0% | Amine 3 0.5% TMAH 0.5% | Sol. 15 60% | Sol. 11 10% | Surf. 05 0.1% | Chem. 01 10 ppt | Chem. 02 10 ppt | | 0.9 | Balance |
| Example 148 | HA 10.0% | Amine 4 1.0% | Sol. 15 60% | Sol. 11 10% | Surf. 05 0.1% | Chem. 01 10 ppt | Chem. 02 10 ppt | | 1.0 | Balance |
| Example 149 | HA 10.0% | Amine 5 1.0% | Sol. 15 60% | Sol. 11 10% | Surf. 05 0.1% | Chem. 01 10 ppt | Chem. 02 10 ppt | | 0.8 | Balance |
| Example 150 | HA 10.0% | Amine 6 1.0% | Sol. 15 60% | Sol. 11 10% | Surf. 05 0.1% | Chem. 01 10 ppt | Chem. 02 10 ppt | | 0.8 | Balance |
| Example 151 | HA 10.0% | Amine 7 1.0% | Sol. 15 60% | Sol. 11 10% | Surf. 05 0.1% | Chem. 01 10 ppt | Chem. 02 10 ppt | | 1.1 | Balance |
| Example 152 | HA 10.0% | TMAH 1.0% | Sol. 16 60% | Sol. 11 10% | Surf. 05 0.1% | Chem. 01 10 ppt | Chem. 02 10 ppt | | 0.8 | Balance |

| | | | | | | | Evaluation | | | |
|---|---|---|---|---|---|---|---|---|---|---|
| Table 1-9 | Formulation pH Adjusting agent | pH | HA/ surfactant | Basic compound/ surfactant | Co ER (Å/min) | W ER (Å/min) | Defect suppression property | Residue removal property (0 h) | Temporal stability (6 h) | Temporal stability (12 h) |
| Example 136 | Inorganic acid/inorganic base | 11 | 100 | 10 | 4 | 7 | B | A | B | B |
| Example 137 | Inorganic acid/inorganic base | 11 | 100 | 10 | 3 | 5 | B | A | B | B |
| Example 138 | Inorganic acid/inorganic base | 11 | 100 | 10 | 3 | 5 | B | A | B | B |
| Example 139 | Inorganic acid/inorganic base | 11 | 100 | 10 | 4 | 6 | B | A | B | B |
| Example 140 | Inorganic acid/inorganic base | 11 | 100 | 10 | 3 | 5 | B | A | B | B |
| Example 141 | Inorganic acid/inorganic base | 11 | 100 | 10 | 4 | 7 | B | A | B | B |
| Example 142 | Inorganic acid/inorganic base | 11 | 100 | 10 | 3 | 5 | B | A | B | B |
| Example 143 | Inorganic acid/inorganic base | 11 | 100 | 10 | 4 | 6 | B | A | B | B |
| Example 144 | Inorganic acid/inorganic base | 11 | 100 | 10 | 5 | 6 | B | A | B | B |
| Example 145 | Inorganic acid/inorganic base | 11 | 100 | 10 | 3 | 5 | B | A | B | B |
| Example 146 | Inorganic acid/inorganic base | 11 | 100 | 10 | 4 | 5 | B | A | B | B |
| Example 147 | Inorganic acid/inorganic base | 11 | 100 | 10 | 4 | 5 | B | A | B | B |
| Example 148 | Inorganic acid/inorganic base | 11 | 100 | 10 | 4 | 6 | B | A | B | B |
| Example 149 | Inorganic acid/inorganic base | 11 | 100 | 10 | 3 | 5 | B | A | B | B |
| Example 150 | Inorganic acid/inorganic base | 11 | 100 | 10 | 3 | 5 | B | A | B | B |
| Example 151 | Inorganic acid/inorganic base | 11 | 100 | 10 | 4 | 7 | B | A | B | B |
| Example 152 | Inorganic acid/inorganic base | 11 | 100 | 10 | 3 | 5 | B | A | B | B |

TABLE 10

| Table 1-10 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
|---|---|---|---|---|---|---|---|---|---|---|---|
| Example 153 | HA 10.0% | Amine 1 1.0% | Sol. 16 60% | Sol. 11 10% | Surf. 05 0.1% | Chem. 01 10 ppt | Chem. 02 10 ppt | | | 1.2 | Balance |
| Example 154 | HA 10.0% | Amine 1 0.5% TMAH 0.5% | Sol. 16 60% | Sol. 11 10% | Surf. 05 0.1% | Chem. 01 10 ppt | Chem. 02 10 ppt | | | 1.2 | Balance |
| Example 155 | HA 10.0% | Amine 2 1.0% | Sol. 16 60% | Sol. 11 10% | Surf. 05 0.1% | Chem. 01 10 ppt | Chem. 02 10 ppt | | | 0.9 | Balance |
| Example 156 | HA . 10.0% | Amine 2 0.5% TMAH 0.5% | Sol. 16 60% | Sol. 11 10% | Surf. 05 0.1% | Chem. 01 10 ppt | Chem. 02 10 ppt | | | 0.9 | Balance |
| Example 157 | HA 10.0% | Amine 3 1.0% | Sol. 16 60% | Sol. 11 10% | Surf. 05 0.1% | Chem. 01 10 ppt | Chem. 02 10 ppt | | | 0.8 | Balance |
| Example 158 | HA 10.0% | Amine 3 0.5% TMAH 0.5% | Sol. 16 60% | Sol. 11 10% | Surf. 05 0.1% | Chem. 01 10 ppt | Chem. 02 10 ppt | | | 0.8 | Balance |
| Example 159 | HA 10.0% | Amine 4 1.0% | Sol. 16 60% | Sol. 11 10% | Surf. 05 0.1% | Chem. 01 10 ppt | Chem. 02 10 ppt | | | 1.0 | Balance |
| Example 160 | HA 10.0% | Amine 4 0.5% TMAH 0.5% | Sol. 16 60% | Sol. 11 10% | Surf. 05 0.1% | Chem. 01 10 ppt | Chem. 02 10 ppt | | | 1.0 | Balance |
| Example 161 | HA 10.0% | Amine 5 1.0% | Sol. 16 60% | Sol. 11 10% | Surf. 05 0.1% | Chem. 01 10 ppt | Chem. 02 10 ppt | | | 1.0 | Balance |
| Example 162 | HA 10.0% | Amine 5 0.5% TMAH 0.5% | Sol. 16 60% | Sol. 11 10% | Surf. 05 0.1% | Chem. 01 10 ppt | Chem. 02 10 ppt | | | 1.0 | Balance |
| Example 163 | HA 10.0% | Amine 6 1.0% | Sol. 16 60% | Sol. 11 10% | Surf. 05 0.1% | Chem. 01 10 ppt | Chem. 02 10 ppt | | | 0.8 | Balance |
| Example 164 | HA 10.0% | Amine 6 0.5% TMAH 0.5% | Sol. 16 60% | Sol. 11 10% | Surf. 05 0.1% | Chem. 01 10 ppt | Chem. 02 10 ppt | | | 0.8 | Balance |
| Example 165 | HA 10.0% | Amine 7 1.0% | Sol. 16 60% | Sol. 11 10% | Surf. 05 0.1% | Chem. 01 10 ppt | Chem. 02 10 ppt | | | 1.0 | Balance |

| Table 1-10 | Formulation pH Adjusting agent | pH | HA/ surfactant | Basic compound/ surfactant | Co ER (Å/min) | W ER (Å/min) | Defect suppression property | Residue removal property (0 h) | Temporal stability (6 h) | Temporal stability (12 h) |
|---|---|---|---|---|---|---|---|---|---|---|
| Example 153 | Inorganic acid/inorganic base | 11 | 100 | 10 | 4 | 8 | B | A | B | B |
| Example 154 | Inorganic acid/inorganic base | 11 | 100 | 10 | 4 | 8 | B | A | B | B |
| Example 155 | Inorganic acid/inorganic base | 11 | 100 | 10 | 5 | 4 | B | A | B | B |
| Example 156 | Inorganic acid/inorganic base | 11 | 100 | 10 | 5 | 4 | B | A | B | B |
| Example 157 | Inorganic acid/inorganic base | 11 | 100 | 10 | 3 | 5 | B | A | B | B |
| Example 158 | Inorganic acid/inorganic base | 11 | 100 | 10 | 3 | 5 | B | A | B | B |
| Example 159 | Inorganic acid/inorganic base | 11 | 100 | 10 | 4 | 6 | B | A | B | B |
| Example 160 | Inorganic acid/inorganic base | 11 | 100 | 10 | 4 | 6 | B | A | B | B |
| Example 161 | Inorganic acid/inorganic base | 11 | 100 | 10 | 4 | 6 | B | A | B | B |

TABLE 10-continued

| | | | | | | | | | | |
|---|---|---|---|---|---|---|---|---|---|---|
| Example 162 | Inorganic acid/inorganic base | 11 | 100 | 10 | 4 | 6 | B | A | B | B |
| Example 163 | Inorganic acid/inorganic base | 11 | 100 | 10 | 3 | 5 | B | A | B | B |
| Example 164 | Inorganic acid/inorganic base | 11 | 100 | 10 | 3 | 5 | B | A | B | B |
| Example 165 | Inorganic acid/inorganic base | 11 | 100 | 10 | 4 | 6 | B | A | B | B |

TABLE 11

| | Formulation | | | | | | | | | | |
|---|---|---|---|---|---|---|---|---|---|---|---|
| Table 1-11 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
| Example 166 | HA 10.0% | Amine 7 0.5% TMAH 0.5% | Sol. 16 60% | Sol. 11 10% | Surf. 05 0.1% | Chem. 01 10 ppt | Chem. 02 10 ppt | | | 1.0 | Balance |
| Example 167 | HA 10.0% | TMAH 1.0% | Sol. 02 60% | | Surf. 05 0.1% | Chem. 01 10 ppt | Chem. 02 10 ppt | | | 0.9 | Balance |
| Example 168 | HA 10.0% | TMAH 1.0% | Sol. 03 60% | | Surf. 05 0.1% | Chem. 01 10 ppt | Chem. 02 10 ppt | | | 1.2 | Balance |
| Example 169 | HA 10.0% | TMAH 1.0% | Sol. 04 60% | | Surf. 05 0.1% | Chem. 01 10 ppt | Chem. 02 10 ppt | | | 0.8 | Balance |
| Example 170 | HA 10.0% | TMAH 1.0% | Sol. 08 60% | | Surf. 05 0.1% | Chem. 01 10 ppt | Chem. 02 10 ppt | | | 0.9 | Balance |
| Example 171 | HA 10.0% | TMAH 1.0% | Sol. 09 60% | | Surf. 05 0.1% | Chem. 01 10 ppt | Chem. 02 10 ppt | | | 0.8 | Balance |
| Example 172 | HA 10.0% | TMAH 1.0% | Sol. 17 60% | | Surf. 05 0.1% | Chem. 01 10 ppt | Chem. 02 10 ppt | | | 1.1 | Balance |
| Example 173 | HA 10.0% | TMAH 1.0% | Sol. 01 60% | | Surf. 01 0.1% | | | | | 1.0 | Balance |
| Example 174 | HA 10.0% | TMAH 1.0% | Sol. 01 60% | | Surf. 02 0.1% | | | | | 2.1 | Balance |
| Example 175 | HA 10.0% | TMAH 1.0% | Sol. 01 60% | | Surf. 03 0.1% | | | | | 2.1 | Balance |
| Example 176 | HA 10.0% | TMAH 1.0% | Sol. 01 60% | | Surf. 04 0.1% | | | | | 1.8 | Balance |
| Example 177 | HA 10.0% | TMAH 1.0% | Sol. 01 60% | | Surf. 06 0.1% | Chem. 03 10 ppt | Chem. 02 10 ppt | | | 0.6 | Balance |
| Example 178 | HA 10.0% | TMAH 1.0% | Sol. 01 60% | | Surf. 07 0.1% | Chem. 04 10 ppt | Chem. 05 10 ppt | | | 0.5 | Balance |
| Example 179 | HA 10.0% | TMAH 1.0% | Sol. 01 60% | | Surf. 08 0.1% | | | | | 0.8 | Balance |
| Example 180 | HA 10.0% | TMAH 1.0% | Sol. 01 60% | | Surf. 09 0.1% | Chem. 06 10 ppt | Chem. 07 10 ppt | | | 0.8 | Balance |
| Example 181 | HA 10.0% | TMAH 1.0% | Sol. 01 60% | | Surf. 10 0.1% | Chem. 05 10 ppt | Chem. 05 10 ppt | | | 0.5 | Balance |
| Example 182 | HA 10.0% | TMAH 1.0% | Sol. 01 60% | | Surf. 11 0.1% | Chem. 08 10 ppt | Chem. 09 10 ppt | | | 0.6 | Balance |
| Example 183 | HA 10.0% | TMAH 1.0% | Sol. 01 60% | | Surf. 12 0.1% | Chem. 01 10 ppt | Chem. 10 10 ppt | | | 0.8 | Balance |

| | | | | | | | Evaluation | | |
|---|---|---|---|---|---|---|---|---|---|
| Table 1-11 | Formulation pH Adjusting agent | pH | HA/ surfactant | Basic compound/ surfactant | Co ER (Å/min) | W ER (Å/min) | Defect suppression property | Residue removal property (0 h) | Temporal stability (6 h) | Temporal stability (12 h) |
| Example 166 | Inorganic acid/inorganic base | 11 | 100 | 10 | 4 | 6 | B | A | B | B |
| Example 167 | Inorganic acid/inorganic base | 11 | 100 | 10 | 3 | 6 | B | A | B | B |
| Example 168 | Inorganic acid/inorganic base | 11 | 100 | 10 | 4 | 8 | B | A | B | B |
| Example 169 | Inorganic acid/inorganic base | 11 | 100 | 10 | 3 | 5 | B | A | B | B |

TABLE 11-continued

| | | | | | | | | | | |
|---|---|---|---|---|---|---|---|---|---|---|
| Example 170 | Inorganic acid/inorganic base | 11 | 100 | 10 | 4 | 5 | B | A | B | B |
| Example 171 | Inorganic acid/inorganic base | 11 | 100 | 10 | 3 | 5 | B | A | B | B |
| Example 172 | Inorganic acid/inorganic base | 11 | 100 | 10 | 5 | 6 | B | A | B | B |
| Example 173 | Inorganic acid/inorganic base | 11 | 100 | 10 | 4 | 6 | C | B | B | B |
| Example 174 | Inorganic acid/inorganic base | 11 | 100 | 10 | 9 | 12 | C | B | B | B |
| Example 175 | Inorganic acid/inorganic base | 11 | 100 | 10 | 12 | 9 | C | B | B | B |
| Example 176 | Inorganic acid/inorganic base | 11 | 100 | 10 | 10 | 8 | C | B | B | B |
| Example 177 | Inorganic acid/inorganic base | 11 | 100 | 10 | 4 | 2 | B | A | B | B |
| Example 178 | Inorganic acid/inorganic base | 11 | 100 | 10 | 3 | 2 | B | A | B | B |
| Example 179 | Inorganic acid/inorganic base | 11 | 100 | 10 | 5 | 3 | B | A | B | B |
| Example 180 | Inorganic acid/inorganic base | 11 | 100 | 10 | 5 | 3 | B | A | B | B |
| Example 181 | Inorganic acid/inorganic base | 11 | 100 | 10 | 3 | 2 | B | A | B | B |
| Example 182 | Inorganic acid/inorganic base | 11 | 100 | 10 | 4 | 2 | B | A | B | B |
| Example 183 | Inorganic acid/inorganic base | 11 | 100 | 10 | 5 | 3 | B | A | B | B |

TABLE 12

| | Formulation | | | | | | | | | | |
|---|---|---|---|---|---|---|---|---|---|---|---|
| Table 1-12 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
| Example 184 | HA 10.0% | TMAH 1.0% | Sol. 01 60% | | Surf. 13 0.1% | Chem. 01 10 ppt | Chem. 07 10 ppt | | | 0.6 | Balance |
| Example 185 | HA 10.0% | TMAH 1.0% | Sol. 01 60% | | Surf. 14 0.1% | Chem. 03 10 ppt | Chem. 11 10 ppt | | | 0.5 | Balance |
| Example 186 | HA 10.0% | TMAH 1.0% | Sol. 01 60% | | Surf. 15 0.1% | | | | | 0.5 | Balance |
| Example 187 | HA 10.0% | TMAH 1.0% | Sol. 01 60% | | Surf. 16 0.1% | | | | | 1.6 | Balance |
| Example 188 | HA 10.0% | TMAH 1.0% | Sol. 01 60% | | Surf. 17 0.1% | | | | | 1.9 | Balance |
| Example 189 | HA 10.0% | TMAH 1.0% | Sol. 01 60% | | Surf. 18 0.1% | | | | | 2.4 | Balance |
| Example 190 | HA 10.0% | TMAH 1.0% | Sol. 01 60% | | Surf. 19 0.1% | | | | | 1.6 | Balance |
| Example 191 | HA 10.0% | TMAH 1.0% | Sol. 01 60% | | Surf. 05 0.01% | Chem. 01 10 ppt | Chem. 02 10 ppt | | | 1.3 | Balance |
| Example 192 | HA 10.0% | TMAH 1.0% | Sol. 01 60% | | Surf. 05 0.0085% | Chem. 01 10 ppt | Chem. 02 10 ppt | | | 3.7 | Balance |
| Example 193 | HA 10.0% | TMAH 1.0% | Sol. 01 60% | | Surf. 05 0.0045% | Chem. 01 10 ppt | Chem. 02 10 ppt | | | 2.6 | Balance |
| Example 194 | HA 1.0% | TMAH 1.0% | Sol. 01 60% | | Surf. 05 2% | Chem. 01 10 ppt | Chem. 02 10 ppt | | | 1.2 | Balance |
| Example 195 | HA 0.5% | TMAH 1.0% | Sol. 01 60% | | Surf. 05 1% | Chem. 01 10 ppt | Chem. 02 10 ppt | | | 1.2 | Balance |
| Example 196 | HA 10.0% | TMAH 0.5% | Sol. 01 60% | | Surf. 05 1% | Chem. 01 10 ppt | Chem. 02 10 ppt | | | 1.2 | Balance |
| Example 197 | HA 10.0% | TMAH 0.5% | Sol. 01 60% | | Surf. 05 0.1% | Chem. 01 10 ppt | Chem. 02 10 ppt | | | 1.4 | Balance |
| Example 198 | HA 5.0% HAS 5% | TMAH 0.5% | Sol. 01 60% | | Surf. 05 0.1% | Chem. 01 10 ppt | Chem. 02 10 ppt | | | 1.2 | Balance |
| Example 199 | HA 10.0% | TMAH 1.0% | Sol. 01 60% | | Surf. 06 0.1% | Chem. 03 10 ppt | Chem. 02 10 ppt | | | 0.5 | Balance |
| Example 200 | HA 10.0% | TMAH 1.0% | Sol. 01 60% | | Surf. 07 0.1% | Chem. 04 10 ppt | Chem. 05 10 ppt | | | 0.6 | Balance |
| Example 201 | HA 10.0% | TMAH 1.0% | Sol. 01 60% | | Surf. 08 0.1% | | | | | 0.3 | Balance |

TABLE 12-continued

| Table 1-12 | Formulation pH Adjusting agent | pH | HA/ surfactant | Basic compound/ surfactant | Co ER (Å/min) | W ER (Å/min) | Defect suppression property | Residue removal property (0 h) | Temporal stability (6 h) | Temporal stability (12 h) |
|---|---|---|---|---|---|---|---|---|---|---|
| Example 184 | Inorganic acid/inorganic base | 11 | 100 | 10 | 4 | 2 | B | A | B | B |
| Example 185 | Inorganic acid/inorganic base | 11 | 100 | 10 | 3 | 2 | B | A | B | B |
| Example 186 | Inorganic acid/inorganic base | 11 | 100 | 10 | 3 | 2 | C | B | B | B |
| Example 187 | Inorganic acid/inorganic base | 11 | 100 | 10 | 10 | 6 | C | B | B | B |
| Example 188 | Inorganic acid/inorganic base | 11 | 100 | 10 | 12 | 7 | C | B | B | B |
| Example 189 | Inorganic acid/inorganic base | 11 | 100 | 10 | 15 | 9 | C | B | B | B |
| Example 190 | Inorganic acid/inorganic base | 11 | 100 | 10 | 10 | 6 | C | B | B | B |
| Example 191 | Inorganic acid/inorganic base | 11 | 1,000 | 100 | 8 | 5 | B | A | B | B |
| Example 192 | Inorganic acid/inorganic base | 11 | 1,176 | 118 | 16 | 21 | D | C | B | B |
| Example 193 | Inorganic acid/inorganic base | 11 | 2,222 | 222 | 21 | 5 | D | C | D | D |
| Example 194 | Inorganic acid/inorganic base | 11 | 0.5 | 0.5 | 8 | 4 | D | D | C | D |
| Example 195 | Inorganic acid/inorganic base | 11 | 0.5 | 1 | 8 | 4 | C | D | C | C |
| Example 196 | Inorganic acid/inorganic base | 11 | 10 | 0.5 | 8 | 4 | D | C | C | D |
| Example 197 | Inorganic acid/inorganic base | 11 | 100 | 5 | 8 | 4 | C | B | B | D |
| Example 198 | Inorganic acid/inorganic base | 11 | 100 | 5 | 8 | 4 | C | B | B | D |
| Example 199 | Inorganic acid/inorganic base | 11 | 100 | 10 | 3 | 2 | B | A | B | B |
| Example 200 | Inorganic acid/inorganic base | 11 | 100 | 10 | 4 | 2 | B | A | B | B |
| Example 201 | Inorganic acid/inorganic base | 11 | 100 | 10 | 2 | 1 | B | A | B | B |

TABLE 13

| | Formulation | | | | | | | | | | |
|---|---|---|---|---|---|---|---|---|---|---|---|
| Table 1-13 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
| Example 202 | HA 10.0% | TMAH 1.0% | Sol. 01 60% | | Surf. 09 0.1% | Chem. 06 10 ppt | Chem. 07 10 ppt | | | 0.5 | Balance |
| Example 203 | HA 10.0% | TMAH 1.0% | Sol. 01 60% | | Surf. 11 0.1% | Chem. 08 10 ppt | Chem. 09 10 ppt | | | 0.5 | Balance |
| Example 204 | HA 10.0% | TMAH 1.0% | Sol. 01 60% | | Surf. 12 0.1% | Chem. 01 10 ppt | Chem. 10 10 ppt | | | 0.5 | Balance |
| Example 205 | HA 10.0% | TMAH 1.0% | Sol. 01 60% | | Surf. 05 0.05% Surf. 06 0.05% | Chem. 01 10 ppt Chem. 03 10 ppt | Chem. 02 20 ppt | | | 1.2 | Balance |
| Example 206 | HA 10.0% | TMAH 1.0% | Sol. 01 60% | | Surf. 05 0.05% Surf. 07 0.05% | Chem. 01 10 ppt Chem. 04 10 ppt | Chem. 02 10 ppt Chem. 05 10 ppt | | | 0.5 | Balance |
| Example 207 | HA 10.0% | TMAH 1.0% | Sol. 01 60% | | Surf. 05 0.05% Surf. 08 0.05% | Chem. 01 10 ppt | Chem. 02 10 ppt | | | 0.6 | Balance |
| Example 208 | HA 10.0% | TMAH 1.0% | Sol. 01 60% | | Surf. 05 0.05% Surf. 09 0.05% | Chem. 01 10 ppt Chem. 06 10 ppt | Chem. 02 10 ppt Chem. 07 10 ppt | | | 0.3 | Balance |

TABLE 13-continued

| | | | | | | | | | |
|---|---|---|---|---|---|---|---|---|---|
| Example 209 | HA 10.0% | TMAH 1.0% | Sol. 01 60% | Surf. 05 0.05% Surf. 10 0.05% | Chem. 01 20 ppt | Chem. 02 10 ppt Chem. 05 10 ppt | | 0.5 | Balance |
| Example 210 | HA 10.0% | TMAH 1.0% | Sol. 01 60% | Surf. 05 0.05% Surf. 11 0.05% | Chem. 01 10 ppt | Chem. 02 10 ppt Chem. 08 Chem. 09 10 ppt | | 0.5 | Balance |
| Example 211 | HA 10.0% | TMAH 1.0% | Sol. 01 60% | Surf. 05 0.05% Surf. 12 0.05% | Chem. 01 20 ppt | Chem. 02 10 ppt Chem. 10 10 ppt | | 0.5 | Balance |
| Example 212 | HA 10.0% | TBAH 1.0% | Sol. 01 60% | Surf. 06 0.1% | Chem. 03 10 ppt | Chem. 02 10 ppt | | 0.5 | Balance |
| Example 213 | HA 10.0% | TBAH 1.0% | Sol. 01 60% | Surf. 07 0.1% | Chem. 04 10 ppt | Chem. 05 10 ppt | | 0.6 | Balance |

| | Formulation | | | | | | Evaluation | | |
|---|---|---|---|---|---|---|---|---|---|
| Table 1-13 | pH Adjusting agent | pH | HA/ surfactant | Basic compound/ surfactant | Co ER (Å/min) | W ER (Å/min) | Defect suppression property | Residue removal property (0 h) | Temporal stability (6 h) | Temporal stability (12 h) |
| Example 202 | Inorganic acid/inorganic base | 11 | 100 | 10 | 3 | 2 | B | A | B | B |
| Example 203 | Inorganic acid/inorganic base | 11 | 100 | 10 | 3 | 2 | B | A | B | B |
| Example 204 | Inorganic acid/inorganic base | 11 | 100 | 10 | 3 | 2 | B | A | B | B |
| Example 205 | Inorganic acid/inorganic base | 11 | 100 | 5 | 8 | 4 | B | A | B | B |
| Example 206 | Inorganic acid/inorganic base | 11 | 100 | 10 | 3 | 2 | B | A | B | B |
| Example 207 | Inorganic acid/inorganic base | 11 | 100 | 10 | 4 | 2 | B | A | B | B |
| Example 208 | Inorganic acid/inorganic base | 11 | 100 | 10 | 2 | 1 | B | A | B | B |
| Example 209 | Inorganic acid/inorganic base | 11 | 100 | 10 | 3 | 2 | B | A | B | B |
| Example 210 | Inorganic acid/inorganic base | 11 | 100 | 10 | 3 | 2 | B | A | B | B |
| Example 211 | Inorganic acid/inorganic base | 11 | 100 | 10 | 3 | 2 | B | A | B | B |
| Example 212 | Inorganic acid/inorganic base | 11 | 100 | 10 | 3 | 2 | B | A | B | B |
| Example 213 | Inorganic acid/inorganic base | 11 | 100 | 10 | 4 | 2 | B | A | B | B |

TABLE 14

| | Formulation | | | | | | | | | | |
|---|---|---|---|---|---|---|---|---|---|---|---|
| Table 1-14 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
| Example 214 | HA 10.0% | TBAH 1.0% | Sol. 01 60% | | Surf. 08 0.1% | | | | | 0.3 | Balance |
| Example 215 | HA 10.0% | TBAH 1.0% | Sol. 01 60% | | Surf. 09 0.1% | Chem. 06 10 ppt | Chem. 07 10 ppt | | | 0.5 | Balance |
| Example 216 | HA 10.0% | TBAH 1.0% | Sol. 01 60% | | Surf. 10 0.1% | Chem. 01 10 ppt | Chem. 05 10 ppt | | | 0.5 | Balance |
| Example 217 | HA 10.0% | TBAH 1.0% | Sol. 01 60% | | Surf. 11 0.1% | Chem. 08 10 ppt | Chem. 05 10 ppt | | | 0.5 | Balance |
| Example 218 | HA 10.0% | TBAH 1.0% | Sol. 01 60% | | Surf. 12 0.1% | Chem. 01 10 ppt | Chem. 10 10 ppt | | | 0.5 | Balance |
| Example 219 | HA 10.0% | TBAH 1.0% | Sol. 01 60% | | Surf. 13 0.1% | Chem. 01 10 ppt | Chem. 07 10 ppt | | | 0.6 | Balance |
| Example 220 | HA 10.0% | TBAH 1.0% | Sol. 01 60% | | Surf. 14 0.1% | Chem. 03 10 ppt | Chem. 11 10 ppt | | | 0.5 | Balance |
| Example 221 | HA 10.0% | BeTMAH 1.0% | Sol. 01 60% | | Surf. 06 0.1% | Chem. 03 10 ppt | Chem. 02 10 ppt | | | 0.5 | Balance |
| Example 222 | HA 10.0% | BeTMAH 1.0% | Sol. 01 60% | | Surf. 07 0.1% | Chem. 04 10 ppt | Chem. 05 10 ppt | | | 0.6 | Balance |

TABLE 14-continued

| | Table 1-14 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
|---|---|---|---|---|---|---|---|---|---|---|---|---|
| Example 223 | | HA 10.0% | BeTMAH 1.0% | Sol. 01 60% | | Surf. 08 0.1% | | | | | 0.3 | Balance |
| Example 224 | | HA 10.0% | BeTMAH 1.0% | Sol. 01 60% | | Surf. 09 0.1% | Chem. 06 10 ppt | Chem. 07 10 ppt | | | 0.5 | Balance |
| Example 225 | | HA 10.0% | BeTMAH 1.0% | Sol. 01 60% | | Surf. 10 0.1% | Chem. 01 10 ppt | Chem. 05 10 ppt | | | 0.5 | Balance |
| Example 226 | | HA 10.0% | BeTMAH 1.0% | Sol. 01 60% | | Surf. 11 0.1% | Chem. 08 10 ppt | Chem. 09 10 ppt | | | 0.5 | Balance |
| Example 227 | | HA 10.0% | BeTMAH 1.0% | Sol. 01 60% | | Surf. 12 0.1% | Chem. 01 10 ppt | Chem. 10 10 ppt | | | 0.5 | Balance |
| Example 228 | | HA 10.0% | BeTMAH 1.0% | Sol. 01 60% | | Surf. 13 0.1% | Chem. 01 10 ppt | Chem. 07 10 ppt | | | 0.6 | Balance |
| Example 229 | | HA 10.0% | BeTMAH 1.0% | Sol. 01 60% | | Surf. 14 0.1% | Chem. 03 10 ppt | Chem. 11 10 ppt | | | 0.5 | Balance |
| Example 230 | | HA 10.0% | Amine 3 1.0% | Sol. 01 60% | | Surf. 06 0.1% | Chem. 03 10 ppt | Chem. 02 10 ppt | | | 0.6 | Balance |
| Example 231 | | HA 10.0% | Amine 3 1.0% | Sol. 01 60% | | Surf. 07 0.1% | Chem. 04 10 ppt | Chem. 05 10 ppt | | | 0.3 | Balance |
| Example 232 | | HA 10.0% | Amine 3 1.0% | Sol. 01 60% | | Surf. 08 0.1% | | | | | 0.3 | Balance |

| | Formulation | | | | | | Evaluation | | | |
|---|---|---|---|---|---|---|---|---|---|---|
| Table 1-14 | pH Adjusting agent | pH | HA/ surfactant | Basic compound/ surfactant | Co ER (Å/min) | W ER (Å/min) | Defect suppression property | Residue removal property (0 h) | Temporal stability (6 h) | Temporal stability (12 h) |
| Example 214 | Inorganic acid/inorganic base | 11 | 100 | 10 | 2 | 1 | B | A | B | B |
| Example 215 | Inorganic acid/inorganic base | 11 | 100 | 10 | 3 | 2 | B | A | B | B |
| Example 216 | Inorganic acid/inorganic base | 11 | 100 | 10 | 3 | 2 | B | A | B | B |
| Example 217 | Inorganic acid/inorganic base | 11 | 100 | 10 | 3 | 2 | B | A | B | B |
| Example 218 | Inorganic acid/inorganic base | 11 | 100 | 10 | 3 | 2 | B | A | B | B |
| Example 219 | Inorganic acid/inorganic base | 11 | 100 | 10 | 4 | 2 | B | A | B | B |
| Example 220 | Inorganic acid/inorganic base | 11 | 100 | 10 | 3 | 2 | B | A | B | B |
| Example 221 | Inorganic acid/inorganic base | 11 | 100 | 10 | 3 | 2 | B | A | B | B |
| Example 222 | Inorganic acid/inorganic base | 11 | 100 | 10 | 4 | 2 | B | A | B | B |
| Example 223 | Inorganic acid/inorganic base | 11 | 100 | 10 | 2 | 1 | B | A | B | B |
| Example 224 | Inorganic acid/inorganic base | 11 | 100 | 10 | 3 | 2 | B | A | B | B |
| Example 225 | Inorganic acid/inorganic base | 11 | 100 | 10 | 3 | 2 | B | A | B | B |
| Example 226 | Inorganic acid/inorganic base | 11 | 100 | 10 | 3 | 2 | B | A | B | B |
| Example 227 | Inorganic acid/inorganic base | 11 | 100 | 10 | 3 | 2 | B | A | B | B |
| Example 228 | Inorganic acid/inorganic base | 11 | 100 | 10 | 4 | 2 | B | A | B | B |
| Example 229 | Inorganic acid/inorganic base | 11 | 100 | 10 | 3 | 2 | B | A | B | B |
| Example 230 | Inorganic acid/inorganic base | 11 | 100 | 10 | 4 | 2 | B | A | B | B |
| Example 231 | Inorganic acid/inorganic base | 11 | 100 | 10 | 2 | 1 | B | A | B | B |
| Example 232 | Inorganic acid/inorganic base | 11 | 100 | 10 | 2 | 1 | B | A | B | B |

TABLE 15

| | Formulation | | | | | | | | | | |
|---|---|---|---|---|---|---|---|---|---|---|---|
| Table 1-15 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
| Example 233 | HA 10.0% | Amine 3 1.0% | Sol. 01 60% | | Surf. 09 0.1% | Chem. 06 10 ppt | Chem. 07 10 ppt | | | 0.5 | Balance |

TABLE 15-continued

| | | | | | | | | | |
|---|---|---|---|---|---|---|---|---|---|
| Example 234 | HA 10.0% | Amine 3 1.0% | Sol. 01 60% | | Surf. 10 0.1% | Chem. 01 10 ppt | Chem. 05 10 ppt | 0.6 | Balance |
| Example 235 | HA 10.0% | Amine 3 1.0% | Sol. 01 60% | | Surf. 11 0.1% | Chem. 08 10 pp | Chem. 09 10 ppt | 0.3 | Balance |
| Example 236 | HA 10.0% | Amine 3 1.0% | Sol. 01 60% | | Surf. 12 0.1% | Chem. 01 10 ppt | Chem. 10 10 ppt | 0.5 | Balance |
| Example 237 | HA 10.0% | Amine 3 1.0% | Sol. 01 60% | | Surf. 13 0.1% | Chem. 01 10 ppt | Chem. 07 10 ppt | 0.5 | Balance |
| Example 238 | HA 10.0% | Amine 3 1.0% | Sol. 01 60% | | Surf. 14 0.1% | Chem. 03 10 ppt | Chem. 11 10 ppt | 0.5 | Balance |
| Example 239 | HA 10.0% | Amine 7 1.0% | Sol. 01 60% | | Surf. 06 0.1% | Chem. 03 10 ppt | Chem. 02 10 ppt | 0.5 | Balance |
| Example 240 | HA 10.0% | Amine 7 1.0% | Sol. 01 60% | | Surf. 07 0.1% | Chem. 04 10 ppt | Chem. 05 10 ppt | 0.6 | Balance |
| Example 241 | HA 10.0% | Amine 7 1.0% | Sol. 01 60% | | Surf. 08 0.1% | | | 0.5 | Balance |
| Example 242 | HA 10.0% | Amine 7 1.0% | Sol. 01 60% | | Surf. 09 0.1% | Chem. 06 10 ppt | Chem. 07 10 ppt | 0.6 | Balance |
| Example 243 | HA 10.0% | Amine 7 1.0% | Sol. 01 60% | | Surf. 10 0.1% | Chem. 01 10 ppt | Chem. 05 10 ppt | 0.3 | Balance |
| Example 244 | HA 10.0% | Amine 7 1.0% | Sol. 01 60% | | Surf. 11 0.1% | Chem. 08 10 ppt | Chem. 09 10 ppt | 0.5 | Balance |
| Example 245 | HA 10.0% | Amine 7 1.0% | Sol. 01 60% | | Surf. 12 0.1% | Chem. 01 10 ppt | Chem. 10 10 ppt | 0.5 | Balance |
| Example 246 | HA 10.0% | Amine 7 1.0% | Sol. 01 60% | | Surf. 13 0.1% | Chem. 01 10 ppt | Chem. 07 10 ppt | 0.6 | Balance |
| Example 247 | HA 10.0% | Amine 7 1.0% | Sol. 01 60% | | Surf. 14 0.1% | Chem. 03 10 ppt | Chem. 11 10 ppt | 0.5 | Balance |
| Example 248 | HA 10.0% | TMAH 1.0% | Sol. 01 60% | Sol. 11 10% | Surf. 06 0.1% | Chem. 03 10 ppt | Chem. 02 10 ppt | 0.6 | Balance |
| Example 249 | HA 10.0% | TMAH 1.0% | Sol. 01 60% | Sol. 11 10% | Surf. 07 0.1% | Chem. 04 10 ppt | Chem. 05 10 ppt | 0.3 | Balance |
| Example 250 | HA 10.0% | TMAH 1.0% | Sol. 01 60% | Sol. 11 10% | Surf. 08 0.1% | | | 0.3 | Balance |
| Example 251 | HA 10.0% | TMAH 1.0% | Sol. 01 60% | Sol. 11 10% | Surf. 09 0.1% | Chem. 06 10 ppt | Chem. 07 10 ppt | 0.5 | Balance |

| Table 1-15 | Formulation pH Adjusting agent | pH | HA/ surfactant | Basic compound/ surfactant | Co ER (A/min) | W ER (A/min) | Defect suppression property | Residue removal property (0 h) | Temporal stability (6 h) | Temporal stability (12 h) |
|---|---|---|---|---|---|---|---|---|---|---|
| Example 233 | Inorganic acid/inorganic base | 11 | 100 | 10 | 3 | 2 | B | A | B | B |
| Example 234 | Inorganic acid/inorganic base | 11 | 100 | 10 | 4 | 2 | B | A | B | B |
| Example 235 | Inorganic acid/inorganic base | 11 | 100 | 10 | 2 | 1 | B | A | B | B |
| Example 236 | Inorganic acid/inorganic base | 11 | 100 | 10 | 3 | 2 | B | A | B | B |
| Example 237 | Inorganic acid/inorganic base | 11 | 100 | 10 | 3 | 2 | B | A | B | B |
| Example 238 | Inorganic acid/inorganic base | 11 | 100 | 10 | 3 | 2 | B | A | B | B |
| Example 239 | Inorganic acid/inorganic base | 11 | 100 | 10 | 3 | 2 | B | A | B | B |
| Example 240 | Inorganic acid/inorganic base | 11 | 100 | 10 | 4 | 2 | B | A | B | B |
| Example 241 | Inorganic acid/inorganic base | 11 | 100 | 10 | 3 | 2 | B | A | B | B |
| Example 242 | Inorganic acid/inorganic base | 11 | 100 | 10 | 4 | 2 | B | A | B | B |
| Example 243 | Inorganic acid/inorganic base | 11 | 100 | 10 | 2 | 1 | B | A | B | B |
| Example 244 | Inorganic acid/inorganic base | 11 | 100 | 10 | 3 | 2 | B | A | B | B |
| Example 245 | Inorganic acid/inorganic base | 11 | 100 | 10 | 3 | 2 | B | A | B | B |
| Example 246 | Inorganic acid/inorganic base | 11 | 100 | 10 | 4 | 2 | B | A | B | B |
| Example 247 | Inorganic acid/inorganic base | 11 | 100 | 10 | 3 | 2 | B | A | B | B |
| Example 248 | Inorganic acid/inorganic base | 11 | 100 | 10 | 4 | 2 | B | A | B | B |
| Example 249 | Inorganic acid/inorganic base | 11 | 100 | 10 | 2 | 1 | B | A | B | B |
| Example 250 | Inorganic acid/inorganic base | 11 | 100 | 10 | 2 | 1 | B | A | B | B |

TABLE 15-continued

| | | | | | | | | | | |
|---|---|---|---|---|---|---|---|---|---|---|
| Example 251 | Inorganic acid/inorganic base | 11 | 100 | 10 | 3 | 2 | B | A | B | B |

TABLE 16

| | Formulation | | | | | | | | | | |
|---|---|---|---|---|---|---|---|---|---|---|---|
| Table 1-16 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
| Example 252 | HA 10.0% | TMAH 1.0% | Sol. 01 60% | Sol. 11 10% | Surf. 10 0.1% | Chem. 01 10 ppt | Chem. 05 10 ppt | | | 0.6 | Balance |
| Example 253 | HA 10.0% | TMAH 1.0% | Sol. 01 60% | Sol. 11 10% | Surf. 11 0.1% | Chem. 08 10 ppt | Chem. 09 10 ppt | | | 0.3 | Balance |
| Example 254 | HA 10.0% | TMAH 1.0% | Sol. 01 60% | Sol. 11 10% | Surf. 12 0.1% | Chem. 01 10 ppt | Chem. 10 10 ppt | | | 0.5 | Balance |
| Example 255 | HA 10.0% | TMAH 1.0% | Sol. 01 60% | Sol. 11 10% | Surf. 13 0.1% | Chem. 01 10 ppt | Chem. 07 10 ppt | | | 0.5 | Balance |
| Example 256 | HA 10.0% | TMAH 1.0% | Sol. 01 60% | Sol. 11 10% | Surf. 14 0.1% | Chem. 03 10 ppt | Chem. 11 10 ppt | | | 0.5 | Balance |
| Example 257 | HA 10.0% | Amine 3 1.0% | Sol. 01 60% | Sol. 11 10% | Surf. 06 0.1% | Chem. 03 10 ppt | Chem. 02 10 ppt | | | 0.6 | Balance |
| Example 258 | HA 10.0% | Amine 3 1.0% | Sol. 01 60% | Sol. 11 10% | Surf. 07 0.1% | Chem. 04 10 ppt | Chem. 05 10 ppt | | | 0.5 | Balance |
| Example 259 | HA 10.0% | Amine 3 1.0% | Sol. 01 60% | Sol. 11 10% | Surf. 08 0.1% | | | | | 0.6 | Balance |
| Example 260 | HA 10.0% | Amine 3 1.0% | Sol. 01 60% | Sol. 11 10% | Surf. 09 0.1% | Chem. 06 10 ppt | Chem. 07 10 ppt | | | 0.3 | Balance |
| Example 261 | HA 10.0% | Amine 3 1.0% | Sol. 01 60% | Sol. 11 10% | Surf. 10 0.1% | Chem. 01 10 ppt | Chem. 05 10 ppt | | | 0.3 | Balance |
| Example 262 | HA 10.0% | Amine 3 1.0% | Sol. 01 60% | Sol. 11 10% | Surf. 11 0.1% | Chem. 08 10 ppt | Chem. 09 10 ppt | | | 0.5 | Balance |
| Example 263 | HA 10.0% | Amine 3 1.0% | Sol. 01 60% | Sol. 11 10% | Surf. 12 0.1% | Chem. 01 10 ppt | Chem. 10 10 ppt | | | 0.6 | Balance |
| Example 264 | HA 10.0% | Amine 3 1.0% | Sol. 01 60% | Sol. 11 10% | Surf. 13 0.1% | Chem. 01 10 ppt | Chem. 07 10 ppt | | | 0.3 | Balance |
| Example 265 | HA 10.0% | Amine 3 1.0% | Sol. 01 60% | Sol. 11 10% | Surf. 14 0.1% | Chem. 03 10 ppt | Chem. 11 10 ppt | | | 0.5 | Balance |
| Example 266 | HA 10.0% | Amine 7 1.0% | Sol. 01 60% | Sol. 11 10% | Surf. 06 0.1% | Chem. 03 10 ppt | Chem. 02 10 ppt | | | 0.5 | Balance |
| Example 267 | HA 10.0% | Amine 7 1.0% | Sol. 01 60% | Sol. 11 10% | Surf. 07 0.1% | Chem. 04 10 ppt | Chem. 05 10 ppt | | | 0.5 | Balance |
| Example 268 | HA 10.0% | Amine 7 1.0% | Sol. 01 60% | Sol. 11 10% | Surf. 08 0.1% | | | | | 0.5 | Balance |
| Example 269 | HA 10.0% | Amine 7 1.0% | Sol. 01 60% | Sol. 11 10% | Surf. 09 0.1% | Chem. 06 10 ppt | Chem. 07 10 ppt | | | 0.5 | Balance |
| Example 270 | HA 10.0% | Amine 7 1.0% | Sol. 01 60% | Sol. 11 10% | Surf. 10 0.1% | Chem. 01 10 ppt | Chem. 05 10 ppt | | | 0.5 | Balance |

| | | | | | | | Evaluation | | | |
|---|---|---|---|---|---|---|---|---|---|---|
| Table 1-16 | Formulation pH Adjusting agent | pH | HA/ surfactant | Basic compound/ surfactant | Co ER (A/min) | W ER (A/min) | Defect suppression property | Residue removal property (0 h) | Temporal stability (6 h) | Temporal stability (12 h) |
| Example 252 | Inorganic acid/inorganic base | 11 | 100 | 10 | 4 | 2 | B | A | B | B |
| Example 253 | Inorganic acid/inorganic base | 11 | 100 | 10 | 2 | 1 | B | A | B | B |
| Example 254 | Inorganic acid/inorganic base | 11 | 100 | 10 | 3 | 2 | B | A | B | B |
| Example 255 | Inorganic acid/inorganic base | 11 | 100 | 10 | 3 | 2 | B | A | B | B |
| Example 256 | Inorganic acid/inorganic base | 11 | 100 | 10 | 3 | 2 | B | A | B | B |
| Example 257 | Inorganic acid/inorganic base | 11 | 100 | 10 | 4 | 2 | B | A | B | B |
| Example 258 | Inorganic acid/inorganic base | 11 | 100 | 10 | 3 | 2 | B | A | B | B |
| Example 259 | Inorganic acid/inorganic base | 11 | 100 | 10 | 4 | 2 | B | A | B | B |
| Example 260 | Inorganic acid/inorganic base | 11 | 100 | 10 | 2 | 1 | B | A | B | B |

TABLE 16-continued

| | | | | | | | | | | |
|---|---|---|---|---|---|---|---|---|---|---|
| Example 261 | Inorganic acid/inorganic base | 11 | 100 | 10 | 2 | 1 | B | A | B | B |
| Example 262 | Inorganic acid/inorganic base | 11 | 100 | 10 | 3 | 2 | B | A | B | B |
| Example 263 | Inorganic acid/inorganic base | 11 | 100 | 10 | 4 | 2 | B | A | B | B |
| Example 264 | Inorganic acid/inorganic base | 11 | 100 | 10 | 2 | 1 | B | A | B | B |
| Example 265 | Inorganic acid/inorganic base | 11 | 100 | 10 | 3 | 2 | B | A | B | B |
| Example 266 | Inorganic acid/inorganic base | 11 | 100 | 10 | 3 | 2 | B | A | B | B |
| Example 267 | Inorganic acid/inorganic base | 11 | 100 | 10 | 3 | 2 | B | A | B | B |
| Example 268 | Inorganic acid/inorganic base | 11 | 100 | 10 | 3 | 2 | B | A | B | B |
| Example 269 | Inorganic acid/inorganic base | 11 | 100 | 10 | 3 | 2 | B | A | B | B |
| Example 270 | Inorganic acid/inorganic base | 11 | 100 | 10 | 3 | 2 | B | A | B | B |

TABLE 17

| | Formulation | | | | | | | | | |
|---|---|---|---|---|---|---|---|---|---|---|
| Table 1-17 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
| Example 271 | HA 10.0% | Amine 7 1.0% | Sol. 01 60% | Sol. 11 10% | Surf. 11 0.1% | Chem. 08 10 ppt | Chem. 09 10 ppt | | | 0.6 | Balance |
| Example 272 | HA 10.0% | Amine 7 1.0% | Sol. 01 60% | Sol. 11 10% | Surf. 12 0.1% | Chem. 01 10 ppt | Chem. 10 10 ppt | | | 0.5 | Balance |
| Example 273 | HA 10.0% | Amine 7 1.0% | Sol. 01 60% | Sol. 11 10% | Surf. 13 0.1% | Chem. 01 10 ppt | Chem. 07 10 ppt | | | 0.6 | Balance |
| Example 274 | HA 10.0% | Amine 7 1.0% | Sol. 01 60% | Sol. 11 10% | Surf. 14 0.1% | Chem. 03 10 ppt | Chem. 11 10 ppt | | | 0.3 | Balance |
| Example 275 | HA 10.0% | TMAH 1.0% | Sol. 05 60% | | Surf. 06 0.1% | Chem. 03 10 ppt | Chem. 02 10 ppt | | | 0.3 | Balance |
| Example 276 | HA 10.0% | TMAH 1.0% | Sol. 05 60% | | Surf. 07 0.1% | Chem. 04 10 ppt | Chem. 05 10 ppt | | | 0.5 | Balance |
| Example 277 | HA 10.0% | TMAH 1.0% | Sol. 05 60% | | Surf. 08 0.1% | | | | | 0.6 | Balance |
| Example 278 | HA 10.0% | TMAH 1.0% | Sol. 05 60% | | Surf. 09 0.1% | Chem. 06 10 ppt | Chem. 07 10 ppt | | | 0.3 | Balance |
| Example 279 | HA 10.0% | TMAH 1.0% | Sol. 05 60% | | Surf. 10 0.1% | Chem. 01 10 ppt | Chem. 05 10 ppt | | | 0.5 | Balance |
| Example 280 | HA 10.0% | TMAH 1.0% | Sol. 05 60% | | Surf. 11 0.1% | Chem. 08 10 ppt | Chem. 09 10 ppt | | | 0.5 | Balance |
| Example 281 | HA 10.0% | TMAH 1.0% | Sol. 05 60% | | Surf. 12 0.1% | Chem. 01 10 ppt | Chem. 10 10 ppt | | | 0.5 | Balance |
| Example 282 | HA 10.0% | TMAH 1.0% | Sol. 05 60% | | Surf. 13 0.1% | Chem. 01 10 ppt | Chem. 07 10 ppt | | | 0.5 | Balance |
| Example 283 | HA 10.0% | TMAH 1.0% | Sol. 05 60% | | Surf. 14 0.1% | Chem. 03 10 ppt | Chem. 11 10 ppt | | | 0.6 | Balance |
| Example 284 | HA 10.0% | Amine 3 1.0% | Sol. 05 60% | | Surf. 06 0.1% | Chem. 03 10 ppt | Chem. 02 10 ppt | | | 0.3 | Balance |
| Example 285 | HA 10.0% | Amine 3 1.0% | Sol. 05 60% | | Surf. 07 0.1% | Chem. 04 10 ppt | Chem. 05 10 ppt | | | 0.5 | Balance |
| Example 286 | HA 10.0% | Amine 3 1.0% | Sol. 05 60% | | Surf. 08 0.1% | | | | | 0.6 | Balance |
| Example 287 | HA 10.0% | Amine 3 1.0% | Sol. 05 60% | | Surf. 09 0.1% | Chem. 06 10 ppt | Chem. 07 10 ppt | | | 0.3 | Balance |
| Example 288 | HA 10.0% | Amine 3 1.0% | Sol. 05 60% | | Surf. 10 0.1% | Chem. 01 10 ppt | Chem. 05 10 ppt | | | 0.5 | Balance |
| Example 289 | HA 10.0% | Amine 3 1.0% | Sol. 05 60% | | Surf. 11 0.1% | Chem. 08 10 ppt | Chem. 09 10 ppt | | | 0.5 | Balance |

| | | | | | | Evaluation | | | |
|---|---|---|---|---|---|---|---|---|---|
| Table 1-17 | Formulation pH Adjusting agent | pH | HA/ surfactant | Basic compound/ surfactant | Co ER (A/min) | W ER (A/min) | Defect suppression property | Residue removal property (0 h) | Temporal stability (6 h) | Temporal stability (12 h) |
| Example 271 | Inorganic acid/inorganic base | 11 | 100 | 10 | 4 | 2 | B | A | B | B |

TABLE 17-continued

| | | | | | | | | | | |
|---|---|---|---|---|---|---|---|---|---|---|
| Example 272 | Inorganic acid/inorganic base | 11 | 100 | 10 | 3 | 2 | B | A | B | B |
| Example 273 | Inorganic acid/inorganic base | 11 | 100 | 10 | 4 | 2 | B | A | B | B |
| Example 274 | Inorganic acid/inorganic base | 11 | 100 | 10 | 2 | 1 | B | A | B | B |
| Example 275 | Inorganic acid/inorganic base | 11 | 100 | 10 | 2 | 1 | B | A | B | B |
| Example 276 | Inorganic acid/inorganic base | 11 | 100 | 10 | 3 | 2 | B | A | B | B |
| Example 277 | Inorganic acid/inorganic base | 11 | 100 | 10 | 4 | 2 | B | A | B | B |
| Example 278 | Inorganic acid/inorganic base | 11 | 100 | 10 | 2 | 1 | B | A | B | B |
| Example 279 | Inorganic acid/inorganic base | 11 | 100 | 10 | 3 | 2 | B | A | B | B |
| Example 280 | Inorganic acid/inorganic base | 11 | 100 | 10 | 3 | 2 | B | A | B | B |
| Example 281 | Inorganic acid/inorganic base | 11 | 100 | 10 | 3 | 2 | B | A | B | B |
| Example 282 | Inorganic acid/inorganic base | 11 | 100 | 10 | 3 | 2 | B | A | B | B |
| Example 283 | Inorganic acid/inorganic base | 11 | 100 | 10 | 4 | 2 | B | A | B | B |
| Example 284 | Inorganic acid/inorganic base | 11 | 100 | 10 | 2 | 1 | B | A | B | B |
| Example 285 | Inorganic acid/inorganic base | 11 | 100 | 10 | 3 | 2 | B | A | B | B |
| Example 286 | Inorganic acid/inorganic base | 11 | 100 | 10 | 4 | 2 | B | A | B | B |
| Example 287 | Inorganic acid/inorganic base | 11 | 100 | 10 | 2 | 1 | B | A | B | B |
| Example 288 | Inorganic acid/inorganic base | 11 | 100 | 10 | 3 | 2 | B | A | B | B |
| Example 289 | Inorganic acid/inorganic base | 11 | 100 | 10 | 3 | 2 | B | A | B | B |

TABLE 18

| | Formulation | | | | | | | | | | |
|---|---|---|---|---|---|---|---|---|---|---|---|
| Table 1-18 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
| Example 290 | HA 10.0% | Amine 3 1.0% | Sol. 05 60% | | Surf. 12 0.1% | Chem. 01 10 ppt | Chem. 10 10 ppt | | | 0.5 | Balance |
| Example 291 | HA 10.0% | Amine 3 1.0% | Sol. 05 60% | | Surf. 13 0.1% | Chem. 01 10 ppt | Chem. 07 10 ppt | | | 0.5 | Balance |
| Example 292 | HA 10.0% | Amine 3 1.0% | Sol. 05 60% | | Surf. 14 0.1% | Chem. 03 10 ppt | Chem. 11 10 ppt | | | 0.5 | Balance |
| Example 293 | HA 10.0% | Amine 7 1.0% | Sol. 05 60% | | Surf. 06 0.1% | Chem. 03 10 ppt | Chem. 02 10 ppt | | | 0.5 | Balance |
| Example 294 | HA 10.0% | Amine 7 1.0% | Sol. 05 60% | | Surf. 07 0.1% | Chem. 04 10 ppt | Chem. 05 10 ppt | | | 0.6 | Balance |
| Example 295 | HA 10.0% | Amine 7 1.0% | Sol. 05 60% | | Surf. 08 0.1% | | | | | 0.5 | Balance |
| Example 296 | HA 10.0% | Amine 7 1.0% | Sol. 05 60% | | Surf. 09 0.1% | Chem. 06 10 ppt | Chem. 07 10 ppt | | | 0.6 | Balance |
| Example 297 | HA 10.0% | Amine 7 1.0% | Sol. 05 60% | | Surf. 10 0.1% | Chem. 01 10 ppt | Chem. 05 10 ppt | | | 0.3 | Balance |
| Example 298 | HA 10.0% | Amine 7 1.0% | Sol. 05 60% | | Surf. 11 0.1% | Chem. 08 10 ppt | Chem. 09 10 ppt | | | 0.3 | Balance |
| Example 299 | HA 10.0% | Amine 7 1.0% | Sol. 05 60% | | Surf. 12 0.1% | Chem. 01 10 ppt | Chem. 10 10 ppt | | | 0.5 | Balance |
| Example 300 | HA 10.0% | Amine 7 1.0% | Sol. 05 60% | | Surf. 13 0.1% | Chem. 01 10 ppt | Chem. 07 10 ppt | | | 0.6 | Balance |
| Example 301 | HA 10.0% | Amine 7 1.0% | Sol. 05 60% | | Surf. 14 0.1% | Chem. 03 10 ppt | Chem. 11 10 ppt | | | 0.3 | Balance |
| Example 302 | HA 10.0% | TMAH 1.0% | Sol. 10 60% | | Surf. 06 0.1% | Chem. 03 10 ppt | Chem. 02 10 ppt | | | 0.3 | Balance |
| Example 303 | HA 10.0% | TMAH 1.0% | Sol. 10 60% | | Surf. 07 0.1% | Chem. 04 10 ppt | Chem. 05 10 ppt | | | 0.5 | Balance |
| Example 304 | HA 10.0% | TMAH 1.0% | Sol. 10 60% | | Surf. 08 0.1% | | | | | 0.5 | Balance |

TABLE 18-continued

| | | | | | | | | | |
|---|---|---|---|---|---|---|---|---|---|
| Example 305 | HA 10.0% | TMAH 1.0% | Sol. 10 60% | | Surf. 09 0.1% | Chem. 06 10 ppt | Chem. 07 10 ppt | | 0.5 | Balance |
| Example 306 | HA 10.0% | TMAH 1.0% | Sol. 10 60% | | Surf. 10 0.1% | Chem. 01 10 ppt | Chem. 05 10 ppt | | 0.5 | Balance |
| Example 307 | HA 10.0% | TMAH 1.0% | Sol. 10 60% | | Surf. 11 0.1% | Chem. 08 10 ppt | Chem. 09 10 ppt | | 0.5 | Balance |
| Example 308 | HA 10.0% | TMAH 1.0% | Sol. 10 60% | | Surf. 12 0.1% | Chem. 01 10 ppt | Chem. 10 10 ppt | | 0.5 | Balance |

| Table 1-18 | Formulation pH Adjusting agent | pH | HA/ surfactant | Basic compound/ surfactant | Co ER (A/min) | W ER (A/min) | Defect suppression property | Residue removal property (0 h) | Temporal stability (6 h) | Temporal stability (12 h) |
|---|---|---|---|---|---|---|---|---|---|---|
| Example 290 | Inorganic acid/inorganic base | 11 | 100 | 10 | 3 | 2 | B | A | B | B |
| Example 291 | Inorganic acid/inorganic base | 11 | 100 | 10 | 3 | 2 | B | A | B | B |
| Example 292 | Inorganic acid/inorganic base | 11 | 100 | 10 | 3 | 2 | B | A | B | B |
| Example 293 | Inorganic acid/inorganic base | 11 | 100 | 10 | 3 | 2 | B | A | B | B |
| Example 294 | Inorganic acid/inorganic base | 11 | 100 | 10 | 4 | 2 | B | A | B | B |
| Example 295 | Inorganic acid/inorganic base | 11 | 100 | 10 | 3 | 2 | B | A | B | B |
| Example 296 | Inorganic acid/inorganic base | 11 | 100 | 10 | 4 | 2 | B | A | B | B |
| Example 297 | Inorganic acid/inorganic base | 11 | 100 | 10 | 2 | 1 | B | A | B | B |
| Example 298 | Inorganic acid/inorganic base | 11 | 100 | 10 | 2 | 1 | B | A | B | B |
| Example 299 | Inorganic acid/inorganic base | 11 | 100 | 10 | 3 | 2 | B | A | B | B |
| Example 300 | Inorganic acid/inorganic base | 11 | 100 | 10 | 4 | 2 | B | A | B | B |
| Example 301 | Inorganic acid/inorganic base | 11 | 100 | 10 | 2 | 1 | B | A | B | B |
| Example 302 | Inorganic acid/inorganic base | 11 | 100 | 10 | 2 | 1 | B | A | B | B |
| Example 303 | Inorganic acid/inorganic base | 11 | 100 | 10 | 3 | 2 | B | A | B | B |
| Example 304 | Inorganic acid/inorganic base | 11 | 100 | 10 | 3 | 2 | B | A | B | B |
| Example 305 | Inorganic acid/inorganic base | 11 | 100 | 10 | 3 | 2 | B | A | B | B |
| Example 306 | Inorganic acid/inorganic base | 11 | 100 | 10 | 3 | 2 | B | A | B | B |
| Example 307 | Inorganic acid/inorganic base | 11 | 100 | 10 | 3 | 2 | B | A | B | B |
| Example 308 | Inorganic acid/inorganic base | 11 | 100 | 10 | 3 | 2 | B | A | B | B |

TABLE 19

| Table 1-19 | Hydroxylamine compound | Basic compound | Alcohol- based solvent 1 | Alcohol- based solvent 2 | Surfactant | Tertiary amine compound | Alkyl halide compound | Acetic acid | Other additives | Metal- containing particles (ppb) | Water |
|---|---|---|---|---|---|---|---|---|---|---|---|
| Example 309 | HA 10.0% | TMAH 1.0% | Sol. 10 60% | | Surf. 13 0.1% | Chem. 01 10 ppt | Chem. 07 10 ppt | | | 0.6 | Balance |
| Example 310 | HA 10.0% | TMAH 1.0% | Sol. 10 60% | | Surf. 14 0.1% | Chem. 03 10 ppt | Chem. 11 10 ppt | | | 0.5 | Balance |
| Example 311 | HA 10.0% | Amine 3 1.0% | Sol. 10 60% | | Surf. 06 0.1% | Chem. 03 10 ppt | Chem. 02 10 ppt | | | 0.6 | Balance |
| Example 312 | HA 10.0% | Amine 3 1.0% | Sol. 10 60% | | Surf. 07 0.1% | Chem. 04 10 ppt | Chem. 05 10 ppt | | | 0.3 | Balance |
| Example 313 | HA 10.0% | Amine 3 1.0% | Sol. 10 60% | | Surf. 08 0.1% | | | | | 0.3 | Balance |
| Example 314 | HA 10.0% | Amine 3 1.0% | Sol. 10 60% | | Surf. 09 0.1% | Chem. 06 10 ppt | Chem. 07 10 ppt | | | 0.5 | Balance |

TABLE 19-continued

| Example | | | | | | | | | |
|---|---|---|---|---|---|---|---|---|---|
| Example 315 | HA 10.0% | Amine 3 1.0% | Sol. 10 60% | | Surf. 10 0.1% | Chem. 01 10 ppt | Chem. 05 10 ppt | 0.3 | Balance |
| Example 316 | HA 10.0% | Amine 3 1.0% | Sol. 10 60% | | Surf. 11 0.1% | Chem. 08 10 ppt | Chem. 09 10 ppt | 0.3 | Balance |
| Example 317 | HA 10.0% | Amine 3 1.0% | Sol. 10 60% | | Surf. 12 0.1% | Chem. 01 10 ppt | Chem. 10 10 ppt | 0.5 | Balance |
| Example 318 | HA 10.0% | Amine 3 1.0% | Sol. 10 60% | | Surf. 13 0.1% | Chem. 01 10 ppt | Chem. 07 10 ppt | 0.6 | Balance |
| Example 319 | HA 10.0% | Amine 3 1.0% | Sol. 10 60% | | Surf. 14 0.1% | Chem. 03 10 ppt | Chem. 11 10 ppt | 0.3 | Balance |
| Example 320 | HA 10.0% | Amine 7 1.0% | Sol. 10 60% | | Surf. 06 0.1% | Chem. 03 10 ppt | Chem. 02 10 ppt | 0.3 | Balance |
| Example 321 | HA 10.0% | Amine 7 1.0% | Sol. 10 60% | | Surf. 07 0.1% | Chem. 04 10 ppt | Chem. 05 10 ppt | 0.5 | Balance |
| Example 322 | HA 10.0% | Amine 7 1.0% | Sol. 10 60% | | Surf. 08 0.1% | | | 0.5 | Balance |
| Example 323 | HA 10.0% | Amine 7 1.0% | Sol. 10 60% | | Surf. 09 0.1% | Chem. 06 10 ppt | Chem. 07 10 ppt | 0.5 | Balance |
| Example 324 | HA 10.0% | Amine 7 1.0% | Sol. 10 60% | | Surf. 10 0.1% | Chem. 01 10 ppt | Chem. 05 10 ppt | 0.5 | Balance |
| Example 325 | HA 10.0% | Amine 7 1.0% | Sol. 10 60% | | Surf. 11 0.1% | Chem. 08 10 ppt | Chem. 09 10 ppt | 0.5 | Balance |
| Example 326 | HA 10.0% | Amine 7 1.0% | Sol. 10 60% | | Surf. 12 0.1% | Chem. 01 10 ppt | Chem. 10 10 ppt | 0.5 | Balance |
| Example 327 | HA 10.0% | Amine 7 1.0% | Sol. 10 60% | | Surf. 13 0.1% | Chem. 01 10 ppt | Chem. 07 10 ppt | 0.6 | Balance |

| Table 1-19 | Formulation pH Adjusting agent | pH | HA/ surfactant | Basic compound/ surfactant | Co ER (A/min) | W ER (A/min) | Defect suppression property | Residue removal property (0 h) | Temporal stability (6 h) | Temporal stability (12 h) |
|---|---|---|---|---|---|---|---|---|---|---|
| Example 309 | Inorganic acid/inorganic base | 11 | 100 | 10 | 4 | 2 | B | A | B | B |
| Example 310 | Inorganic acid/inorganic base | 11 | 100 | 10 | 3 | 2 | B | A | B | B |
| Example 311 | Inorganic acid/inorganic base | 11 | 100 | 10 | 4 | 2 | B | A | B | B |
| Example 312 | Inorganic acid/inorganic base | 11 | 100 | 10 | 2 | 1 | B | A | B | B |
| Example 313 | Inorganic acid/inorganic base | 11 | 100 | 10 | 2 | 1 | B | A | B | B |
| Example 314 | Inorganic acid/inorganic base | 11 | 100 | 10 | 3 | 2 | B | A | B | B |
| Example 315 | Inorganic acid/inorganic base | 11 | 100 | 10 | 2 | 1 | B | A | B | B |
| Example 316 | Inorganic acid/inorganic base | 11 | 100 | 10 | 2 | 1 | B | A | B | B |
| Example 317 | Inorganic acid/inorganic base | 11 | 100 | 10 | 3 | 2 | B | A | B | B |
| Example 318 | Inorganic acid/inorganic base | 11 | 100 | 10 | 4 | 2 | B | A | B | B |
| Example 319 | Inorganic acid/inorganic base | 11 | 100 | 10 | 2 | 1 | B | A | B | B |
| Example 320 | Inorganic acid/inorganic base | 11 | 100 | 10 | 2 | 1 | B | A | B | B |
| Example 321 | Inorganic acid/inorganic base | 11 | 100 | 10 | 3 | 2 | B | A | B | B |
| Example 322 | Inorganic acid/inorganic base | 11 | 100 | 10 | 3 | 2 | B | A | B | B |
| Example 323 | Inorganic acid/inorganic base | 11 | 100 | 10 | 3 | 2 | B | A | B | B |
| Example 324 | Inorganic acid/inorganic base | 11 | 100 | 10 | 3 | 2 | B | A | B | B |
| Example 325 | Inorganic acid/inorganic base | 11 | 100 | 10 | 3 | 2 | B | A | B | B |
| Example 326 | Inorganic acid/inorganic base | 11 | 100 | 10 | 3 | 2 | B | A | B | B |
| Example 327 | Inorganic acid/inorganic base | 11 | 100 | 10 | 4 | 2 | B | A | B | B |

TABLE 20

| Table 1-20 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
|---|---|---|---|---|---|---|---|---|---|---|---|
| Example 328 | HA 10.0% | Amine 7 1.0% | Sol. 10 60% | | Surf. 14 0.1% | Chem. 03 10 ppt | Chem. 11 10 ppt | | | 0.5 | Balance |
| Example 329 | HA 10.0% | TMAH 1.0% | Sol. 14 60% | | Surf. 06 0.1% | Chem. 03 10 ppt | Chem. 02 10 ppt | | | 0.6 | Balance |
| Example 330 | HA 10.0% | TMAH 1.0% | Sol. 14 60% | | Surf. 07 0.1% | Chem. 04 10 ppt | Chem. 05 10 ppt | | | 0.3 | Balance |
| Example 331 | HA 10.0% | TMAH 1.0% | Sol. 14 60% | | Surf. 08 0.1% | | | | | 0.3 | Balance |
| Example 332 | HA 10.0% | TMAH 1.0% | Sol. 14 60% | | Surf. 09 0.1% | Chem. 06 10 ppt | Chem. 07 10 ppt | | | 0.5 | Balance |
| Example 333 | HA 10.0% | TMAH 1.0% | Sol. 14 60% | | Surf. 10 0.1% | Chem. 01 10 ppt | Chem. 05 10 ppt | | | 0.6 | Balance |
| Example 334 | HA 10.0% | TMAH 1.0% | Sol. 14 60% | | Surf. 11 0.1% | Chem. 08 10 ppt | Chem. 09 10 ppt | | | 0.3 | Balance |
| Example 335 | HA 10.0% | TMAH 1.0% | Sol. 14 60% | | Surf. 12 0.1% | Chem. 01 10 ppt | Chem. 10 10 ppt | | | 0.3 | Balance |
| Example 336 | HA 10.0% | TMAH 1.0% | Sol. 14 60% | | Surf. 13 0.1% | Chem. 01 10 ppt | Chem. 07 10 ppt | | | 0.3 | Balance |
| Example 337 | HA 10.0% | TMAH 1.0% | Sol. 14 60% | | Surf. 14 0.1% | Chem. 03 10 ppt | Chem. 11 10 ppt | | | 0.5 | Balance |
| Example 338 | HA 10.0% | Amine 3 1.0% | Sol. 14 60% | | Surf. 06 0.1% | Chem. 03 10 ppt | Chem. 02 10 ppt | | | 0.6 | Balance |
| Example 339 | HA 10.0% | Amine 3 1.0% | Sol. 14 60% | | Surf. 07 0.1% | Chem. 04 10 ppt | Chem. 05 10 ppt | | | 0.3 | Balance |
| Example 340 | HA 10.0% | Amine 3 1.0% | Sol. 14 60% | | Surf. 08 0.1% | | | | | 0.3 | Balance |
| Example 341 | HA 10.0% | Amine 3 1.0% | Sol. 14 60% | | Surf. 09 0.1% | Chem. 06 10 ppt | Chem. 07 10 ppt | | | 0.5 | Balance |
| Example 342 | HA 10.0% | Amine 3 1.0% | Sol. 14 60% | | Surf. 10 0.1% | Chem. 01 10 ppt | Chem. 05 10 ppt | | | 0.5 | Balance |
| Example 343 | HA 10.0% | Amine 3 1.0% | Sol. 14 60% | | Surf. 11 0.1% | Chem. 08 10 ppt | Chem. 09 10 ppt | | | 0.5 | Balance |
| Example 344 | HA 10.0% | Amine 3 1.0% | Sol. 14 60% | | Surf. 12 0.1% | Chem. 01 10 ppt | Chem. 10 10 ppt | | | 0.5 | Balance |
| Example 345 | HA 10.0% | Amine 3 1.0% | Sol. 14 60% | | Surf. 13 0.1% | Chem. 01 10 ppt | Chem. 07 10 ppt | | | 0.5 | Balance |
| Example 346 | HA 10.0% | Amine 3 1.0% | Sol. 14 60% | | Surf. 14 0.1% | Chem. 03 10 ppt | Chem. 11 10 ppt | | | 0.5 | Balance |

| Table 1-20 | Formulation pH Adjusting agent | pH | HA/ surfactant | Basic compound/ surfactant | Co ER (A/min) | W ER (A/min) | Defect suppression property | Residue removal property (0 h) | Temporal stability (6 h) | Temporal stability (12 h) |
|---|---|---|---|---|---|---|---|---|---|---|
| Example 328 | Inorganic acid/inorganic base | 11 | 100 | 10 | 3 | 2 | B | A | B | B |
| Example 329 | Inorganic acid/inorganic base | 11 | 100 | 10 | 4 | 2 | B | A | B | B |
| Example 330 | Inorganic acid/inorganic base | 11 | 100 | 10 | 2 | 1 | B | A | B | B |
| Example 331 | Inorganic acid/inorganic base | 11 | 100 | 10 | 2 | 1 | B | A | B | B |
| Example 332 | Inorganic acid/inorganic base | 11 | 100 | 10 | 3 | 2 | B | A | B | B |
| Example 333 | Inorganic acid/inorganic base | 11 | 100 | 10 | 4 | 2 | B | A | B | B |
| Example 334 | Inorganic acid/inorganic base | 11 | 100 | 10 | 2 | 1 | B | A | B | B |
| Example 335 | Inorganic acid/inorganic base | 11 | 100 | 10 | 2 | 1 | B | A | B | B |
| Example 336 | Inorganic acid/inorganic base | 11 | 100 | 10 | 2 | 1 | B | A | B | B |
| Example 337 | Inorganic acid/inorganic base | 11 | 100 | 10 | 3 | 2 | B | A | B | B |
| Example 338 | Inorganic acid/inorganic base | 11 | 100 | 10 | 4 | 2 | B | A | B | B |
| Example 339 | Inorganic acid/inorganic base | 11 | 100 | 10 | 2 | 1 | B | A | B | B |
| Example 340 | Inorganic acid/inorganic base | 11 | 100 | 10 | 2 | 1 | B | A | B | B |

TABLE 20-continued

| | | | | | | | | | | |
|---|---|---|---|---|---|---|---|---|---|---|
| Example 341 | Inorganic acid/inorganic base | 11 | 100 | 10 | 3 | 2 | B | A | B | B |
| Example 342 | Inorganic acid/inorganic base | 11 | 100 | 10 | 3 | 2 | B | A | B | B |
| Example 343 | Inorganic acid/inorganic base | 11 | 100 | 10 | 3 | 2 | B | A | B | B |
| Example 344 | Inorganic acid/inorganic base | 11 | 100 | 10 | 3 | 2 | B | A | B | B |
| Example 345 | Inorganic acid/inorganic base | 11 | 100 | 10 | 3 | 2 | B | A | B | B |
| Example 346 | Inorganic acid/inorganic base | 11 | 100 | 10 | 3 | 2 | B | A | B | B |

TABLE 21

| | Formulation | | | | | | | | | | |
|---|---|---|---|---|---|---|---|---|---|---|---|
| Table 1-21 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
| Example 347 | HA 10.0% | Amine 7 1.0% | Sol. 14 60% | | Surf. 06 0.1% | Chem. 03 10 ppt | Chem. 02 10 ppt | | | 0.6 | Balance |
| Example 348 | HA 10.0% | Amine 7 1.0% | Sol. 14 60% | | Surf. 07 0.1% | Chem. 04 10 ppt | Chem. 05 10 ppt | | | 0.5 | Balance |
| Example 349 | HA 10.0% | Amine 7 1.0% | Sol. 14 60% | | Surf. 08 0.1% | | | | | 0.6 | Balance |
| Example 350 | HA 10.0% | Amine 7 1.0% | Sol. 14 60% | | Surf. 09 0.1% | Chem. 06 10 ppt | Chem. 07 10 ppt | | | 0.3 | Balance |
| Example 351 | HA 10.0% | Amine 7 1.0% | Sol. 14 60% | | Surf. 10 0.1% | Chem. 01 10 ppt | Chem. 05 10 ppt | | | 0.3 | Balance |
| Example 352 | HA 10.0% | Amine 7 1.0% | Sol. 14 60% | | Surf. 11 0.1% | Chem. 08 10 ppt | Chem. 09 10 ppt | | | 0.5 | Balance |
| Example 353 | HA 10.0% | Amine 7 1.0% | Sol. 14 60% | | Surf. 12 0.1% | Chem. 01 10 ppt | Chem. 10 10 ppt | | | 0.6 | Balance |
| Example 354 | HA 10.0% | Amine 7 1.0% | Sol. 14 60% | | Surf. 13 0.1% | Chem. 01 10 ppt | Chem. 07 10 ppt | | | 0.3 | Balance |
| Example 355 | HA 10.0% | Amine 7 1.0% | Sol. 14 60% | | Surf. 14 0.1% | Chem. 03 10 ppt | Chem, 11 10 ppt | | | 0.5 | Balance |
| Example 356 | HA 10.0% | TMAH 1.0% | Sol. 15 60% | | Surf. 06 0.1% | Chem. 03 10 ppt | Chem. 02 10 ppt | | | 0.6 | Balance |
| Example 357 | HA 10.0% | TMAH 1.0% | Sol. 15 60% | | Surf. 07 0.1% | Chem. 04 10 ppt | Chem. 05 10 ppt | | | 0.3 | Balance |
| Example 358 | HA 10.0% | TMAH 1.0% | Sol. 15 60% | | Surf. 08 0.1% | | | | | 0.3 | Balance |
| Example 359 | HA 10.0% | TMAH 1.0% | Sol. 15 60% | | Surf. 09 0.1% | Chem. 06 10 ppt | Chem. 07 10 ppt | | | 0.5 | Balance |
| Example 360 | HA 10.0% | TMAH 1.0% | Sol. 15 60% | | Surf. 10 0.1% | Chem. 01 10 ppt | Chem. 05 10 ppt | | | 0.5 | Balance |
| Example 361 | HA 10.0% | TMAH 1.0% | Sol. 15 60% | | Surf. 11 0.1% | Chem. 08 10 ppt | Chem. 09 10 ppt | | | 0.5 | Balance |
| Example 362 | HA 10.0% | TMAH 1.0% | Sol. 15 60% | | Surf. 12 0.1% | Chem. 01 10 ppt | Chem. 10 10 ppt | | | 0.5 | Balance |
| Example 363 | HA 10.0% | TMAH 1.0% | Sol. 15 60% | | Surf. 13 0.1% | Chem. 01 10 ppt | Chem. 07 10 ppt | | | 0.5 | Balance |
| Example 364 | HA 10.0% | TMAH 1.0% | Sol. 15 60% | | Surf. 14 0.1% | Chem. 03 10 ppt | Chem. 11 10 ppt | | | 0.5 | Balance |
| Example 365 | HA 10.0% | Amine 3 1.0% | Sol. 15 60% | | Surf. 06 0.1% | Chem. 03 10 ppt | Chem. 02 10 ppt | | | 0.6 | Balance |

| | | | | | | | Evaluation | | | |
|---|---|---|---|---|---|---|---|---|---|---|
| Table 1-21 | Formulation pH Adjusting agent | pH | HA/ surfactant | Basic compound/ surfactant | Co ER (A/min) | W ER (A/min) | Defect suppression property | Residue removal property (0 h) | Temporal stability (6 h) | Temporal stability (12 h) |
| Example 347 | Inorganic acid/inorganic base | 11 | 100 | 10 | 4 | 2 | B | A | B | B |
| Example 348 | Inorganic acid/inorganic base | 11 | 100 | 10 | 3 | 2 | B | A | B | B |
| Example 349 | Inorganic acid/inorganic base | 11 | 100 | 10 | 4 | 2 | B | A | B | B |
| Example 350 | Inorganic acid/inorganic base | 11 | 100 | 10 | 2 | 1 | B | A | B | B |
| Example 351 | Inorganic acid/inorganic base | 11 | 100 | 10 | 2 | 1 | B | A | B | B |

TABLE 21-continued

| | | | | | | | | | | |
|---|---|---|---|---|---|---|---|---|---|---|
| Example 352 | Inorganic acid/inorganic base | 11 | 100 | 10 | 3 | 2 | B | A | B | B |
| Example 353 | Inorganic acid/inorganic base | 11 | 100 | 10 | 4 | 2 | B | A | B | B |
| Example 354 | Inorganic acid/inorganic base | 11 | 100 | 10 | 2 | 1 | B | A | B | B |
| Example 355 | Inorganic acid/inorganic base | 11 | 100 | 10 | 3 | 2 | B | A | B | B |
| Example 356 | Inorganic acid/inorganic base | 11 | 100 | 10 | 4 | 2 | B | A | B | B |
| Example 357 | Inorganic acid/inorganic base | 11 | 100 | 10 | 2 | 1 | B | A | B | B |
| Example 358 | Inorganic acid/inorganic base | 11 | 100 | 10 | 2 | 1 | B | A | B | B |
| Example 359 | Inorganic acid/inorganic base | 11 | 100 | 10 | 3 | 2 | B | A | B | B |
| Example 360 | Inorganic acid/inorganic base | 11 | 100 | 10 | 3 | 2 | B | A | B | B |
| Example 361 | Inorganic acid/inorganic base | 11 | 100 | 10 | 3 | 2 | B | A | B | B |
| Example 362 | Inorganic acid/inorganic base | 11 | 100 | 10 | 3 | 2 | B | A | B | B |
| Example 363 | Inorganic acid/inorganic base | 11 | 100 | 10 | 3 | 2 | B | A | B | B |
| Example 364 | Inorganic acid/inorganic base | 11 | 100 | 10 | 3 | 2 | B | A | B | B |
| Example 365 | Inorganic acid/inorganic base | 11 | 100 | 10 | 4 | 2 | B | A | B | B |

TABLE 22

| Table 1-22 | Formulation | | | | | | | | | | |
|---|---|---|---|---|---|---|---|---|---|---|---|
| | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
| Example 366 | HA 10.0% | Amine 3 1.0% | Sol. 15 60% | | Surf. 07 0.1% | Chem. 04 10 ppt | Chem. 05 10 ppt | | | 0.5 | Balance |
| Example 367 | HA 10.0% | Amine 3 1.0% | Sol. 15 60% | | Surf. 08 0.1% | | | | | 0.6 | Balance |
| Example 368 | HA 10.0% | Amine 3 1.0% | Sol. 15 60% | | Surf. 09 0.1% | Chem. 06 10 ppt | Chem. 07 10 ppt | | | 0.3 | Balance |
| Example 369 | HA 10.0% | Amine 3 1.0% | Sol. 15 60% | | Surf. 10 0.1% | Chem. 01 10 ppt | Chem. 05 10 ppt | | | 0.3 | Balance |
| Example 370 | HA 10.0% | Amine 3 1.0% | Sol. 15 60% | | Surf. 11 0.1% | Chem. 08 10 ppt | Chem. 09 10 ppt | | | 0.5 | Balance |
| Example 371 | HA 10.0% | Amine 3 1.0% | Sol. 15 60% | | Surf. 12 0.1% | Chem. 01 10 ppt | Chem. 10 10 ppt | | | 0.6 | Balance |
| Example 372 | HA 10.0% | Amine 3 1.0% | Sol. 15 60% | | Surf. 13 0.1% | Chem. 01 10 ppt | Chem. 07 10 ppt | | | 0.6 | Balance |
| Example 373 | HA 10.0% | Amine 3 1.0% | Sol. 15 60% | | Surf. 14 0.1% | Chem. 03 10 ppt | Chem. 11 10 ppt | | | 0.3 | Balance |
| Example 374 | HA 10.0% | Amine 7 1.0% | Sol. 15 60% | | Surf. 06 0.1% | Chem. 03 10 ppt | Chem. 02 10 ppt | | | 0.3 | Balance |
| Example 375 | HA 10.0% | Amine 7 1.0% | Sol. 15 60% | | Surf. 07 0.1% | Chem. 04 10 ppt | Chem. 05 10 ppt | | | 0.5 | Balance |
| Example 376 | HA 10.0% | Amine 7 1.0% | Sol. 15 60% | | Surf. 08 0.1% | | | | | 0.5 | Balance |
| Example 377 | HA 10.0% | Amine 7 1.0% | Sol. 15 60% | | Surf. 09 0.1% | Chem. 06 10 ppt | Chem. 07 10 ppt | | | 0.5 | Balance |
| Example 378 | HA 10.0% | Amine 7 1.0% | Sol. 15 60% | | Surf. 10 0.1% | Chem. 01 10 ppt | Chem. 05 10 ppt | | | 0.5 | Balance |
| Example 379 | HA 10.0% | Amine 7 1.0% | Sol. 15 60% | | Surf. 11 0.1% | Chem. 08 10 ppt | Chem. 09 10 ppt | | | 0.5 | Balance |
| Example 380 | HA 10.0% | Amine 7 1.0% | Sol. 15 60% | | Surf. 12 0.1% | Chem. 01 10 ppt | Chem. 10 10 ppt | | | 0.5 | Balance |
| Example 381 | HA 10.0% | Amine 7 1.0% | Sol. 15 60% | | Surf. 13 0.1% | Chem. 01 10 ppt | Chem. 07 10 ppt | | | 0.6 | Balance |
| Example 382 | HA 10.0% | Amine 7 1.0% | Sol. 15 60% | | Surf. 14 0.1% | Chem. 03 10 ppt | Chem. 11 10 ppt | | | 0.5 | Balance |
| Example 383 | HA 10.0% | TMAH 1.0% | Sol. 16 60% | | Surf. 06 0.1% | Chem. 03 10 ppt | Chem. 02 10 ppt | | | 0.6 | Balance |
| Example 384 | HA 10.0% | TMAH 1.0% | Sol. 16 60% | | Surf. 07 0.1% | Chem. 04 10 ppt | Chem. 05 10 ppt | | | 0.3 | Balance |

TABLE 22-continued

| Table 1-22 | Formulation pH Adjusting agent | pH | HA/ surfactant | Basic compound/ surfactant | Co ER (A/min) | W ER (A/min) | Evaluation Defect suppression property | Residue removal property (0 h) | Temporal stability (6 h) | Temporal stability (12 h) |
|---|---|---|---|---|---|---|---|---|---|---|
| Example 366 | Inorganic acid/inorganic base | 11 | 100 | 10 | 3 | 2 | B | A | B | B |
| Example 367 | Inorganic acid/inorganic base | 11 | 100 | 10 | 4 | 2 | B | A | B | B |
| Example 368 | Inorganic acid/inorganic base | 11 | 100 | 10 | 2 | 1 | B | A | B | B |
| Example 369 | Inorganic acid/inorganic base | 11 | 100 | 10 | 2 | 1 | B | A | B | B |
| Example 370 | Inorganic acid/inorganic base | 11 | 100 | 10 | 3 | 2 | B | A | B | B |
| Example 371 | Inorganic acid/inorganic base | 11 | 100 | 10 | 4 | 2 | B | A | B | B |
| Example 372 | Inorganic acid/inorganic base | 11 | 100 | 10 | 4 | 2 | B | A | B | B |
| Example 373 | Inorganic acid/inorganic base | 11 | 100 | 10 | 2 | 1 | B | A | B | B |
| Example 374 | Inorganic acid/inorganic base | 11 | 100 | 10 | 2 | 1 | B | A | B | B |
| Example 375 | Inorganic acid/inorganic base | 11 | 100 | 10 | 3 | 2 | B | A | B | B |
| Example 376 | Inorganic acid/inorganic base | 11 | 100 | 10 | 3 | 2 | B | A | B | B |
| Example 377 | Inorganic acid/inorganic base | 11 | 100 | 10 | 3 | 2 | B | A | B | B |
| Example 378 | Inorganic acid/inorganic base | 11 | 100 | 10 | 3 | 2 | B | A | B | B |
| Example 379 | Inorganic acid/inorganic base | 11 | 100 | 10 | 3 | 2 | B | A | B | B |
| Example 380 | Inorganic acid/inorganic base | 11 | 100 | 10 | 3 | 2 | B | A | B | B |
| Example 381 | Inorganic acid/inorganic base | 11 | 100 | 10 | 4 | 2 | B | A | B | B |
| Example 382 | Inorganic acid/inorganic base | 11 | 100 | 10 | 3 | 2 | B | A | B | B |
| Example 383 | Inorganic acid/inorganic base | 11 | 100 | 10 | 4 | 2 | B | A | B | B |
| Example 384 | Inorganic acid/inorganic base | 11 | 100 | 10 | 2 | 1 | B | A | B | B |

TABLE 23

| Table 1-23 | Formulation Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
|---|---|---|---|---|---|---|---|---|---|---|---|
| Example 385 | HA 10.0% | TMAH 1.0% | Sol. 16 60% | | Surf. 08 0.1% | | | | | 0.3 | Balance |
| Example 386 | HA 10.0% | TMAH 1.0% | Sol. 16 60% | | Surf. 09 0.1% | Chem. 06 10 ppt | Chem. 07 10 ppt | | | 0.5 | Balance |
| Example 387 | HA 10.0% | TMAH 1.0% | Sol. 16 60% | | Surf. 10 0.1% | Chem. 01 10 ppt | Chem. 05 10 ppt | | | 0.6 | Balance |
| Example 388 | HA 10.0% | TMAH 1.0% | Sol. 16 60% | | Surf. 11 0.1% | Chem. 08 10 ppt | Chem. 09 10 ppt | | | 0.3 | Balance |
| Example 389 | HA 10.0% | TMAH 1.0% | Sol. 16 60% | | Surf. 12 0.1% | Chem. 01 10 ppt | Chem. 10 10 ppt | | | 0.5 | Balance |
| Example 390 | HA 10.0% | TMAH 1.0% | Sol. 16 60% | | Surf. 13 0.1% | Chem. 01 10 ppt | Chem. 07 10 ppt | | | 0.6 | Balance |
| Example 391 | HA 10.0% | TMAH 1.0% | Sol. 16 60% | | Surf. 14 0.1% | Chem. 03 10 ppt | Chem. 11 10 ppt | | | 0.3 | Balance |
| Example 392 | HA 10.0% | Amine 3 1.0% | Sol. 16 60% | | Surf. 06 0.1% | Chem. 03 10 ppt | Chem. 02 10 ppt | | | 0.3 | Balance |
| Example 393 | HA 10.0% | Amine 3 1.0% | Sol. 16 60% | | Surf. 07 0.1% | Chem. 04 10 ppt | Chem. 05 10 ppt | | | 0.5 | Balance |
| Example 394 | HA 10.0% | Amine 3 1.0% | Sol. 16 60% | | Surf. 08 0.1% | | | | | 0.5 | Balance |
| Example 395 | HA 10.0% | Amine 3 1.0% | Sol. 16 60% | | Surf. 09 0.1% | Chem. 06 10 ppt | Chem. 07 10 ppt | | | 0.5 | Balance |

TABLE 23-continued

| | | | | | | | | | |
|---|---|---|---|---|---|---|---|---|---|
| Example 396 | HA 10.0% | Amine 3 1.0% | Sol. 16 60% | | Surf. 10 0.1% | Chem. 01 10 ppt | Chem. 05 10 ppt | 0.5 | Balance |
| Example 397 | HA 10.0% | Amine 3 1.0% | Sol. 16 60% | | Surf. 11 0.1% | Chem. 08 10 ppt | Chem. 09 10 ppt | 0.5 | Balance |
| Example 398 | HA 10.0% | Amine 3 1.0% | Sol. 16 60% | | Surf. 12 0.1% | Chem. 01 10 ppt | Chem. 10 10 ppt | 0.5 | Balance |
| Example 399 | HA 10.0% | Amine 3 1.0% | Sol. 16 60% | | Surf. 13 0.1% | Chem. 01 10 ppt | Chem. 07 10 ppt | 0.6 | Balance |
| Example 400 | HA 10.0% | Amine 3 1.0% | Sol. 16 60% | | Surf. 14 0.1% | Chem. 03 10 ppt | Chem. 11 10 ppt | 0.5 | Balance |
| Example 401 | HA 10.0% | Amine 7 1.0% | Sol. 16 60% | | Surf. 06 0.1% | Chem. 03 10 ppt | Chem. 02 10 ppt | 0.6 | Balance |
| Example 402 | HA 10.0% | Amine 7 1.0% | Sol. 16 60% | | Surf. 07 0.1% | Chem. 04 10 ppt | Chem. 05 10 ppt | 0.3 | Balance |
| Example 403 | HA 10.0% | Amine 7 1.0% | Sol. 16 60% | | Surf. 08 0.1% | | | 0.3 | Balance |

| Table 1-23 | Formulation pH Adjusting agent | pH | HA/ surfactant | Basic compound/ surfactant | Co ER (A/min) | W ER (A/min) | Evaluation Defect suppression property | Residue removal property (0 h) | Temporal stability (6 h) | Temporal stability (12 h) |
|---|---|---|---|---|---|---|---|---|---|---|
| Example 385 | Inorganic acid/inorganic base | 11 | 100 | 10 | 2 | 1 | B | A | B | B |
| Example 386 | Inorganic acid/inorganic base | 11 | 100 | 10 | 3 | 2 | B | A | B | B |
| Example 387 | Inorganic acid/inorganic base | 11 | 100 | 10 | 4 | 2 | B | A | B | B |
| Example 388 | Inorganic acid/inorganic base | 11 | 100 | 10 | 2 | 1 | B | A | B | B |
| Example 389 | Inorganic acid/inorganic base | 11 | 100 | 10 | 3 | 2 | B | A | B | B |
| Example 390 | Inorganic acid/inorganic base | 11 | 100 | 10 | 4 | 2 | B | A | B | B |
| Example 391 | Inorganic acid/inorganic base | 11 | 100 | 10 | 2 | 1 | B | A | B | B |
| Example 392 | Inorganic acid/inorganic base | 11 | 100 | 10 | 2 | 1 | B | A | B | B |
| Example 393 | Inorganic acid/inorganic base | 11 | 100 | 10 | 3 | 2 | B | A | B | B |
| Example 394 | Inorganic acid/inorganic base | 11 | 100 | 10 | 3 | 2 | B | A | B | B |
| Example 395 | Inorganic acid/inorganic base | 11 | 100 | 10 | 3 | 2 | B | A | B | B |
| Example 396 | Inorganic acid/inorganic base | 11 | 100 | 10 | 3 | 2 | B | A | B | B |
| Example 397 | Inorganic acid/inorganic base | 11 | 100 | 10 | 3 | 2 | B | A | B | B |
| Example 398 | Inorganic acid/inorganic base | 11 | 100 | 10 | 3 | 2 | B | A | B | B |
| Example 399 | Inorganic acid/inorganic base | 11 | 100 | 10 | 4 | 2 | B | A | B | B |
| Example 400 | Inorganic acid/inorganic base | 11 | 100 | 10 | 3 | 2 | B | A | B | B |
| Example 401 | Inorganic acid/inorganic base | 11 | 100 | 10 | 4 | 2 | B | A | B | B |
| Example 402 | Inorganic acid/inorganic base | 11 | 100 | 10 | 2 | 1 | B | A | B | B |
| Example 403 | Inorganic acid/inorganic base | 11 | 100 | 10 | 2 | 1 | B | A | B | B |

TABLE 24

| Table 1-24 | Formulation | | | | | | | | | | |
|---|---|---|---|---|---|---|---|---|---|---|---|
| | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
| Example 404 | HA 10.0% | Amine 7 1.0% | Sol. 16 60% | | Surf. 09 0.1% | Chem. 06 10 ppt | Chem. 07 10 ppt | | | 0.5 | Balance |
| Example 405 | HA 10.0% | Amine 7 1.0% | Sol. 16 60% | | Surf. 10 0.1% | Chem. 01 10 ppt | Chem. 05 10 ppt | | | 0.6 | Balance |
| Example 406 | HA 10.0% | Amine 7 1.0% | Sol. 16 60% | | Surf. 11 0.1% | Chem. 08 10 ppt | Chem. 09 10 ppt | | | 0.6 | Balance |

TABLE 24-continued

| Example | | | | | | | | | | |
|---|---|---|---|---|---|---|---|---|---|---|
| Example 407 | HA 10.0% | Amine 7 1.0% | Sol. 16 60% | | Surf. 12 0.1% | Chem. 01 10 ppt | Chem. 10 10 ppt | | 0.3 | Balance |
| Example 408 | HA 10.0% | Amine 7 1.0% | Sol. 16 60% | | Surf. 13 0.1% | Chem. 01 10 ppt | Chem. 07 10 ppt | | 0.3 | Balance |
| Example 409 | HA 10.0% | Amine 7 1.0% | Sol. 16 60% | | Surf. 14 0.1% | Chem. 03 10 ppt | Chem. 11 10 ppt | | 0.5 | Balance |
| Example 410 | HA 10.0% | TMAH 1.0% | Sol. 16 60% | Sol. 11 10% | Surf. 06 0.1% | Chem. 03 10 ppt | Chem. 02 10 ppt | | 0.5 | Balance |
| Example 411 | HA 10.0% | TMAH 1.0% | Sol. 16 60% | Sol. 11 10% | Surf. 07 0.1% | Chem. 04 10 ppt | Chem. 05 10 ppt | | 0.5 | Balance |
| Example 412 | HA 10.0% | TMAH 1.0% | Sol. 16 60% | Sol. 11 10% | Surf. 08 0.1% | | | | 0.5 | Balance |
| Example 413 | HA 10.0% | TMAH 1.0% | Sol. 16 60% | Sol. 11 10% | Surf. 09 0.1% | Chem. 06 10 ppt | Chem. 07 10 ppt | | 0.5 | Balance |
| Example 414 | HA 10.0% | TMAH 1.0% | Sol. 16 60% | Sol. 11 10% | Surf. 10 0.1% | Chem. 01 10 ppt | Chem. 05 10 ppt | | 0.5 | Balance |
| Example 415 | HA 10.0% | TMAH 1.0% | Sol. 16 60% | Sol. 11 10% | Surf. 11 0.1% | Chem. 08 10 ppt | Chem. 09 10 ppt | | 0.6 | Balance |
| Example 416 | HA 10.0% | TMAH 1.0% | Sol. 16 60% | Sol. 11 10% | Surf. 12 0.1% | Chem. 01 10 ppt | Chem. 10 10 ppt | | 0.5 | Balance |
| Example 417 | HA 10.0% | TMAH 1.0% | Sol. 16 60% | Sol. 11 10% | Surf. 13 0.1% | Chem. 01 10 ppt | Chem. 07 10 ppt | | 0.6 | Balance |
| Example 418 | HA 10.0% | TMAH 1.0% | Sol. 16 60% | Sol. 11 10% | Surf. 14 0.1% | Chem. 03 10 ppt | Chem. 11 10 ppt | | 0.3 | Balance |
| Example 419 | HA 10.0% | Amine 3 1.0% | Sol. 16 60% | Sol. 11 10% | Surf. 06 0.1% | Chem. 03 10 ppt | Chem. 02 10 ppt | | 0.3 | Balance |
| Example 420 | HA 10.0% | Amine 3 1.0% | Sol. 16 60% | Sol. 11 10% | Surf. 07 0.1% | Chem. 04 10 ppt | Chem. 05 10 ppt | | 0.5 | Balance |
| Example 421 | HA 10.0% | Amine 3 1.0% | Sol. 16 60% | Sol. 11 10% | Surf. 08 0.1% | | | | 0.6 | Balance |
| Example 422 | HA 10.0% | Amine 3 1.0% | Sol. 16 60% | Sol. 11 10% | Surf. 09 0.1% | Chem. 06 10 ppt | Chem. 07 10 ppt | | 0.6 | Balance |

| Table 1-24 | Formulation pH Adjusting agent | pH | HA/ surfactant | Basic compound/ surfactant | Co ER (A/min) | W ER (A/min) | Evaluation Defect suppression property | Residue removal property (0 h) | Temporal stability (6 h) | Temporal stability (12 h) |
|---|---|---|---|---|---|---|---|---|---|---|
| Example 404 | Inorganic acid/inorganic base | 11 | 100 | 10 | 3 | 2 | B | A | B | B |
| Example 405 | Inorganic acid/inorganic base | 11 | 100 | 10 | 4 | 2 | B | A | B | B |
| Example 406 | Inorganic acid/inorganic base | 11 | 100 | 10 | 4 | 2 | B | A | B | B |
| Example 407 | Inorganic acid/inorganic base | 11 | 100 | 10 | 2 | 1 | B | A | B | B |
| Example 408 | Inorganic acid/inorganic base | 11 | 100 | 10 | 2 | 1 | B | A | B | B |
| Example 409 | Inorganic acid/inorganic base | 11 | 100 | 10 | 3 | 2 | B | A | B | B |
| Example 410 | Inorganic acid/inorganic base | 11 | 100 | 10 | 3 | 2 | B | A | B | B |
| Example 411 | Inorganic acid/inorganic base | 11 | 100 | 10 | 3 | 2 | B | A | B | B |
| Example 412 | Inorganic acid/inorganic base | 11 | 100 | 10 | 3 | 2 | B | A | B | B |
| Example 413 | Inorganic acid/inorganic base | 11 | 100 | 10 | 3 | 2 | B | A | B | B |
| Example 414 | Inorganic acid/inorganic base | 11 | 100 | 10 | 3 | 2 | B | A | B | B |
| Example 415 | Inorganic acid/inorganic base | 11 | 100 | 10 | 4 | 2 | B | A | B | B |
| Example 416 | Inorganic acid/inorganic base | 11 | 100 | 10 | 3 | 2 | B | A | B | B |
| Example 417 | Inorganic acid/inorganic base | 11 | 100 | 10 | 4 | 2 | B | A | B | B |
| Example 418 | Inorganic acid/inorganic base | 11 | 100 | 10 | 2 | 1 | B | A | B | B |
| Example 419 | Inorganic acid/inorganic base | 11 | 100 | 10 | 2 | 1 | B | A | B | B |
| Example 420 | Inorganic acid/inorganic base | 11 | 100 | 10 | 3 | 2 | B | A | B | B |
| Example 421 | Inorganic acid/inorganic base | 11 | 100 | 10 | 4 | 2 | B | A | B | B |
| Example 422 | Inorganic acid/inorganic base | 11 | 100 | 10 | 4 | 2 | B | A | B | B |

TABLE 25

| Table 1-25 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
|---|---|---|---|---|---|---|---|---|---|---|---|
| Example 423 | HA 10.0% | Amine 3 1.0% | Sol. 16 60% | Sol. 11 10% | Surf. 10 0.1% | Chem. 01 10 ppt | Chem. 05 10 ppt | | | 0.3 | Balance |
| Example 424 | HA 10.0% | Amine 3 1.0% | Sol. 16 60% | Sol. 11 10% | Surf. 11 0.1% | Chem. 08 10 ppt | Chem. 09 10 ppt | | | 0.3 | Balance |
| Example 425 | HA 10.0% | Amine 3 1.0% | Sol. 16 60% | Sol. 11 10% | Surf. 12 0.1% | Chem. 01 10 ppt | Chem. 10 10 ppt | | | 0.5 | Balance |
| Example 426 | HA 10.0% | Amine 3 1.0% | Sol. 16 60% | Sol. 11 10% | Surf. 13 0.1% | Chem. 01 10 ppt | Chem. 07 10 ppt | | | 0.5 | Balance |
| Example 427 | HA 10.0% | Amine 3 1.0% | Sol. 16 60% | Sol. 11 10% | Surf. 14 0.1% | Chem. 03 10 ppt | Chem. 11 10 ppt | | | 0.5 | Balance |
| Example 428 | HA 10.0% | Amine 7 1.0% | Sol. 16 60% | Sol. 11 10% | Surf. 06 0.1% | Chem. 03 10 ppt | Chem. 02 10 ppt | | | 0.5 | Balance |
| Example 429 | HA 10.0% | Amine 7 1.0% | Sol. 16 60% | Sol. 11 10% | Surf. 07 0.1% | Chem. 04 10 ppt | Chem. 05 10 ppt | | | 0.5 | Balance |
| Example 430 | HA 10.0% | Amine 7 1.0% | Sol. 16 60% | Sol. 11 10% | Surf. 08 0.1% | | | | | 0.5 | Balance |
| Example 431 | HA 10.0% | Amine 7 1.0% | Sol. 16 60% | Sol. 11 10% | Surf. 09 0.1% | Chem. 06 10 ppt | Chem. 07 10 ppt | | | 0.6 | Balance |
| Example 432 | HA 10.0% | Amine 7 1.0% | Sol. 16 60% | Sol. 11 10% | Surf. 10 0.1% | Chem. 01 10 ppt | Chem. 05 10 ppt | | | 0.5 | Balance |
| Example 433 | HA 10.0% | Amine 7 1.0% | Sol. 16 60% | Sol. 11 10% | Surf. 11 0.1% | Chem. 08 10 ppt | Chem. 09 10 ppt | | | 0.6 | Balance |
| Example 434 | HA 10.0% | Amine 7 1.0% | Sol. 16 60% | Sol. 11 10% | Surf. 12 0.1% | Chem. 01 10 ppt | Chem. 10 10 ppt | | | 0.3 | Balance |
| Example 435 | HA 10.0% | Amine 7 1.0% | Sol. 16 60% | Sol. 11 10% | Surf. 13 0.1% | Chem. 01 10 ppt | Chem. 07 10 ppt | | | 0.3 | Balance |
| Example 436 | HA 10.0% | Amine 7 1.0% | Sol. 16 60% | Sol. 11 10% | Surf. 14 0.1% | Chem. 03 10 ppt | Chem. 11 10 ppt | | | 0.5 | Balance |
| Example 437 | HA 10.0% | TMAH 1.0% | Sol. 01 60% | | Surf. 05 0.1% | Chem. 01 10 ppt | | | | 0.5 | Balance |
| Example 438 | HA 10.0% | TMAH 1.0% | Sol. 01 60% | | Surf. 05 0.1% | Chem. 01 500 ppt | | | | 0.5 | Balance |
| Example 439 | HA 10.0% | TMAH 1.0% | Sol. 01 60% | | Surf. 05 0.1% | Chem. 01 5,000 ppt | | | | 0.6 | Balance |
| Example 440 | HA 10.0% | TMAH 1.0% | Sol. 01 60% | | Surf. 05 0.1% | Chem. 01 100 ppt | | | | 0.6 | Balance |
| Example 441 | HA 10.0% | TMAH 1.0% | Sol. 01 60% | | Surf. 05 0.1% | Chem. 01 5,000 ppb | | | | 0.8 | Balance |

| Table 1-25 | Formulation pH Adjusting agent | pH | HA/ surfactant | Basic compound/ surfactant | Co ER (A/min) | W ER (A/min) | Defect suppression property | Residue removal property (0 h) | Temporal stability (6 h) | Temporal stability (12 h) |
|---|---|---|---|---|---|---|---|---|---|---|
| Example 423 | Inorganic acid/inorganic base | 11 | 100 | 10 | 2 | 1 | B | A | B | B |
| Example 424 | Inorganic acid/inorganic base | 11 | 100 | 10 | 2 | 1 | B | A | B | B |
| Example 425 | Inorganic acid/inorganic base | 11 | 100 | 10 | 3 | 2 | B | A | B | B |
| Example 426 | Inorganic acid/inorganic base | 11 | 100 | 10 | 3 | 2 | B | A | B | B |
| Example 427 | Inorganic acid/inorganic base | 11 | 100 | 10 | 3 | 2 | B | A | B | B |
| Example 428 | Inorganic acid/inorganic base | 11 | 100 | 10 | 3 | 2 | B | A | B | B |
| Example 429 | Inorganic acid/inorganic base | 11 | 100 | 10 | 3 | 2 | B | A | B | B |
| Example 430 | Inorganic acid/inorganic base | 11 | 100 | 10 | 3 | 2 | B | A | B | B |
| Example 431 | Inorganic acid/inorganic base | 11 | 100 | 10 | 4 | 2 | B | A | B | B |
| Example 432 | Inorganic acid/inorganic base | 11 | 100 | 10 | 3 | 2 | B | A | B | B |
| Example 433 | Inorganic acid/inorganic base | 11 | 100 | 10 | 4 | 2 | B | A | B | B |
| Example 434 | Inorganic acid/inorganic base | 11 | 100 | 10 | 2 | 1 | B | A | B | B |
| Example 435 | Inorganic acid/inorganic base | 11 | 100 | 10 | 2 | 1 | B | A | B | B |

TABLE 25-continued

| | | | | | | | | | | |
|---|---|---|---|---|---|---|---|---|---|---|
| Example 436 | Inorganic acid/inorganic base | 11 | 100 | 10 | 3 | 2 | B | A | B | B |
| Example 437 | Inorganic acid/inorganic base | 11 | 100 | 10 | 3 | 2 | B | A | B | B |
| Example 438 | Inorganic acid/inorganic base | 11 | 100 | 10 | 3 | 2 | A | A | B | B |
| Example 439 | Inorganic acid/inorganic base | 11 | 100 | 10 | 4 | 2 | A | A | B | B |
| Example 440 | Inorganic acid/inorganic base | 11 | 100 | 10 | 4 | 2 | A | A | B | B |
| Example 441 | Inorganic acid/inorganic base | 11 | 100 | 10 | 5 | 3 | B | A | B | B |

TABLE 26

| | Formulation | | | | | | | | | | |
|---|---|---|---|---|---|---|---|---|---|---|---|
| Table 1-26 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (ppb) | Water |
| Example 442 | HA 10.0% | TMAH 1.0% | Sol. 01 60% | | Surf. 05 0.1% | | Chem. 02 10 ppt | | | 0.8 | Balance |
| Example 443 | HA 10.0% | TMAH 1.0% | Sol. 01 60% | | Surf. 05 0.1% | | Chem. 02 500 ppt | | | 0.5 | Balance |
| Example 444 | HA 10.0% | TMAH 1.0% | Sol. 01 60% | | Surf. 05 0.1% | | Chem. 02 5,000 ppt | | | 0.5 | Balance |
| Example 445 | HA 10.0% | TMAH 1.0% | Sol. 01 60% | | Surf. 05 0.1% | | Chem. 02 100 ppb | | | 0.5 | Balance |
| Example 446 | HA 10.0% | TMAH 1.0% | Sol. 01 60% | | Surf. 05 0.1% | | Chem. 02 5,000 ppb | | | 0.6 | Balance |
| Example 447 | HA 10.0% | TMAH 1.0% | Sol. 01 60% | | Surf. 05 0.1% | Chem. 01 100 ppt | Chem. 02 100 ppt | | | 0.3 | Balance |
| Example 448 | HA 10.0% | TMAH 1.0% | Sol. 01 60% | | Surf. 05 0.1% | Chem. 01 500 ppt | Chem. 02 500 ppt | | | 0.3 | Balance |
| Example 449 | HA 10.0% | TMAH 1.0% | Sol. 01 60% | | Surf. 05 0.1% | Chem. 01 5000 ppt | Chem. 02 5,000 ppt | | | 0.3 | Balance |
| Example 450 | HA 10.0% | TMAH 1.0% | Sol. 01 60% | | Surf. 05 0.1% | Chem. 01 100 ppb | Chem. 02 100 ppb | | | 0.3 | Balance |
| Example 451 | HA 10.0% | TMAH 1.0% | Sol. 01 60% | | Surf. 05 0.1% | Chem. 01 5000 ppb | Chem. 02 5,000 ppb | | | 0.5 | Balance |
| Example 452 | HA 10.0% | TMAH 1.0% | Sol. 01 60% | | Surf. 05 0.1% | Chem. 01 10 ppt | Chem. 02 10 ppt | 0.8 ppt | | 0.3 | Balance |
| Example 453 | HA 10.0% | TMAH 1.0% | Sol. 01 60% | | Surf. 05 0.1% | Chem. 01 10 ppt | Chem. 02 10 ppt | 8 ppt | | 0.5 | Balance |
| Example 454 | HA 10.0% | TMAH 1.0% | Sol. 01 60% | | Surf. 05 0.1% | Chem. 01 10 ppt | Chem. 02 10 ppt | 70 ppt | | 0.5 | Balance |
| Example 455 | HA 10.0% | TMAH 1.0% | Sol. 01 60% | | Surf. 05 0.1% | Chem. 01 10 ppt | Chem. 02 10 ppt | 500 ppt | | 0.5 | Balance |
| Example 456 | HA 10.0% | TMAH 1.0% | Sol. 01 60% | | Surf. 05 0.1% | Chem. 01 10 ppt | Chem. 02 10 ppt | 5,000 ppt | | 0.5 | Balance |
| Example 457 | HA 10.0% | TMAH 1.0% | Sol. 01 60% | | Surf. 05 0.1% | Chem. 01 10 ppt | Chem. 02 10 ppt | 100 ppb | | 0.5 | Balance |
| Example 458 | HA 10.0% | TMAH 1.0% | Sol. 01 60% | | Surf. 05 0.1% | Chem. 01 10 ppt | Chem. 02 10 ppt | 1 ppm | | 0.5 | Balance |
| Example 459 | HA 10.0% | TMAH 1.0% | Sol. 01 60% | | Surf. 05 0.1% | Chem. 01 10 ppt | Chem. 02 10 ppt | 0.005% | | 0.5 | Balance |
| Example 460 | HA 10.0% | TMAH 1.0% | Sol. 01 60% | | Surf. 05 0.1% | Chem. 01 10 ppt | Chem. 02 10 ppt | 0.03% | | 0.3 | Balance |

| | | | | | | | Evaluation | | | |
|---|---|---|---|---|---|---|---|---|---|---|
| Table 1-26 | Formulation pH Adjusting agent | pH | HA/ surfactant | Basic compound/ surfactant | Co ER (A/min) | W ER (A/min) | Defect suppression property | Residue removal property (0 h) | Temporal stability (6 h) | Temporal stability (12 h) |
| Example 442 | Inorganic acid/inorganic base | 11 | 100 | 10 | 5 | 3 | B | A | B | B |
| Example 443 | Inorganic acid/inorganic base | 11 | 100 | 10 | 3 | 2 | A | A | B | B |
| Example 444 | Inorganic acid/inorganic base | 11 | 100 | 10 | 3 | 2 | A | A | B | B |
| Example 445 | Inorganic acid/inorganic base | 11 | 100 | 10 | 3 | 2 | A | A | B | B |
| Example 446 | Inorganic acid/inorganic base | 11 | 100 | 10 | 4 | 2 | B | A | B | B |

TABLE 26-continued

| | | | | | | | | | | |
|---|---|---|---|---|---|---|---|---|---|---|
| Example 447 | Inorganic acid/inorganic base | 11 | 100 | 10 | 2 | 1 | A | A | B | B |
| Example 448 | Inorganic acid/inorganic base | 11 | 100 | 10 | 2 | 1 | A | A | B | B |
| Example 449 | Inorganic acid/inorganic base | 11 | 100 | 10 | 2 | 1 | A | A | B | B |
| Example 450 | Inorganic acid/inorganic base | 11 | 100 | 10 | 2 | 1 | A | A | B | B |
| Example 451 | Inorganic acid/inorganic base | 11 | 100 | 10 | 3 | 2 | B | A | B | B |
| Example 452 | Inorganic acid/inorganic base | 11 | 100 | 10 | 2 | 1 | B | A | B | B |
| Example 453 | Inorganic acid/inorganic base | 11 | 100 | 10 | 3 | 2 | A | A | B | B |
| Example 454 | Inorganic acid/inorganic base | 11 | 100 | 10 | 3 | 2 | A | A | B | B |
| Example 455 | Inorganic acid/inorganic base | 11 | 100 | 10 | 3 | 2 | A | A | B | B |
| Example 456 | Inorganic acid/inorganic base | 11 | 100 | 10 | 3 | 2 | A | A | B | B |
| Example 457 | Inorganic acid/inorganic base | 11 | 100 | 10 | 3 | 2 | A | A | B | B |
| Example 458 | Inorganic acid/inorganic base | 11 | 100 | 10 | 3 | 2 | A | A | B | B |
| Example 459 | Inorganic acid/inorganic base | 11 | 100 | 10 | 3 | 2 | A | A | B | B |
| Example 460 | Inorganic acid/inorganic base | 11 | 100 | 10 | 2 | 1 | A | A | B | B |

TABLE 27

| | Formulation | | | | | | | | | | |
|---|---|---|---|---|---|---|---|---|---|---|---|
| Table 1-27 | Hydroxylamine compound | Basic compound | Alcohol-based solvent 1 | Alcohol-based solvent 2 | Surfactant | Tertiary amine compound | Alkyl halide compound | Acetic acid | Other additives | Metal-containing particles (PPb) | Water |
| Example 461 | HA 10.0% | TMAH 1.0% | Sol. 01 60% | | Surf. 05 0.1% | Chem. 01 10 ppt | Chem. 02 10 ppt | 0.12% | | 0.3 | Balance |
| Example 462 | HA 10.0% | TMAH 1.0% | Sol. 01 60% | | Surf. 05 0.1% | Chem. 01 10 ppt | Chem. 02 10 ppt | | | 0.001 | Balance |
| Example 463 | HA 10.0% | TMAH 1.0% | Sol. 01 60% | | Surf. 05 0.1% | Chem. 01 10 ppt | Chem. 02 10 ppt | | | 12 | Balance |
| Example 464 | HA 10.0% | TMAH 1.0% | Sol. 01 60% | | Surf. 05 0.1% | Chem. 01 10 ppt | Chem. 02 10 ppt | | O.A.1 0.5% | 0.5 | Balance |
| Example 465 | HA 10.0% | TMAH 1.0% | Sol. 01 60% | | Surf. 05 0.1% | Chem. 01 10 ppt | Chem. 02 10 ppt | | Red. 1 0.5% | 0.6 | Balance |
| Example 466 | HA 10.0% | TMAH 1.0% | Sol. 01 60% | | Surf. 05 0.1% | Chem. 01 10 ppt | Chem. 02 10 ppt | | Red. 2 0.5% | 0.3 | Balance |
| Example 467 | HA 10.0% | TMAH 1.0% | Sol. 01 60% | | Surf. 05 0.1% | Chem. 01 10 ppt | Chem. 02 10 ppt | | Red. 3 0.5% | 0.5 | Balance |
| Example 468 | HA 10.0% | TMAH 1.0% | Sol. 01 60% | | Surf. 05 0.1% | Chem. 01 10 ppt | Chem. 02 10 ppt | | Red. 4 0.5% | 0.5 | Balance |
| Example 469 | HA 10.0% | TMAH 1.0% | Sol. 01 60% | | Surf. 05 0.1% | Chem. 01 10 ppt | Chem. 02 10 ppt | 0.06% | | 0.3 | Balance |
| Comparative Example 1 | HA 10.0% | TMAH 1.0% | Sol. 01 60% | | Surf. 05 0.1% | Chem. 01 10 ppt | Chem. 02 10 ppt | | | 5 | Balance |
| Comparative Example 2 | HA 10.0% | TMAH 1.0% | Sol. 01 60% | | Surf. 05 0.1% | Chem. 01 10 ppt | Chem. 02 10 ppt | | | 1.5 | Balance |
| Comparative Example 3 | HA 10.0% | TMAH 1.0% | Sol. 01 60% | | | | | | | 5.7 | Balance |
| Comparative Example 4 | HA 10.0% | TMAH 1.0% | Sol. 01 60% | | Surf. 05 0.1% | Chem. 01 10 ppt | Chem. 02 10 ppt | | | 2.9 | Balance |

| | | | | | | | Evaluation | | |
|---|---|---|---|---|---|---|---|---|---|
| Table 1-27 | Formulation pH Adjusting agent | pH | HA/ surfactant | Basic compound/ surfactant | Co ER (A/min) | W ER (A/min) | Defect suppression property | Residue removal property (0 h) | Temporal stability (6 h) | Temporal stability (12 h) |
| Example 461 | Inorganic acid/inorganic base | 11 | 100 | 10 | 2 | 1 | C | A | B | B |
| Example 462 | Inorganic acid/inorganic base | 11 | 100 | 10 | 3 | 2 | D | A | B | B |

TABLE 27-continued

| | | | | | | | | | | |
|---|---|---|---|---|---|---|---|---|---|---|
| Example 463 | Inorganic acid/inorganic base | 11 | 100 | 10 | 4 | 2 | D | A | B | B |
| Example 464 | Inorganic acid/inorganic base | 11 | 100 | 10 | 3 | 2 | A | A | A | A |
| Example 465 | Inorganic acid/inorganic base | 11 | 100 | 10 | 4 | 2 | A | A | A | A |
| Example 466 | Inorganic acid/inorganic base | 11 | 100 | 10 | 2 | 1 | A | A | A | A |
| Example 467 | Inorganic acid/inorganic base | 11 | 100 | 10 | 3 | 2 | A | A | A | A |
| Example 468 | Inorganic acid/inorganic base | 11 | 100 | 10 | 3 | 2 | A | A | A | A |
| Example 469 | Inorganic acid/inorganic base | 11 | 100 | 10 | 2 | 1 | A | A | B | B |
| Comparative Example 1 | Inorganic acid/inorganic base | 11 | 100 | 10 | 25 | 25 | E | C | E | E |
| Comparative Example 2 | Inorganic acid/inorganic base | 11 | 100 | 10 | 6 | 9 | E | E | A | A |
| Comparative Example 3 | Inorganic acid/inorganic base | 11 | | | 12 | 45 | E | C | A | A |
| Comparative Example 4 | Inorganic acid/inorganic base | 7 | 100 | 10 | 21 | 8 | E | E | A | A |

<Review of Results>

From the results shown in the tables, it was confirmed that the problem of the present invention could be solved by using the treatment liquid of the embodiment of the present invention.

It has been confirmed that in a case where the content of the alcohol-based solvent is 50% by mass or more with respect to the total mass of the treatment liquid, the residue removal property, the defect suppression property, the anti-corrosion property, and the temporal stability tend to be more excellent, and in a case where the content of the alcohol-based solvent is 80% by mass or less, the defect suppression property and the residue removal property tend to be more excellent (the results of Examples 1 to 4, and the like).

It has been confirmed that in a case where the content of the hydroxylamine compound is 1% by mass or more (more preferably 6% by mass or more) with respect to the total mass of the treatment liquid, the defect suppression property and the residue removal property of the treatment liquid tend to be more excellent.

It has been confirmed that in a case where the content of the hydroxylamine compound is 20% by mass or less (more preferably 15% by mass or less, and still more preferably 12% by mass or less) with respect to the total mass of the treatment liquid, the residue removal property and the anti-corrosion property of the treatment liquid tend to be more excellent.

(The Results of Examples 2, and 5 to 13, and The Like)

It has been confirmed that in a case where the pH is 9 or more (more preferably 10 or more, and still more preferably more than 10), the anticorrosion property against Co, the defect suppression property, and the residue removal property of the treatment liquid tend to be more excellent.

It has been confirmed that in a case where the pH is 12 or less (more preferably less than 12), the anticorrosion property against W and the defect suppression property of the treatment liquid tend to be more excellent.

(The Results of Examples 2 and 14 to 18, and The Like)

It has been confirmed that in a case where a mass ratio of the content of the hydroxylamine compound to the content of the surfactant in the treatment liquid is 1 or more (more preferably 10 or more, and still more preferably 80 or more), the residue removal property, the defect suppression property, the anticorrosion property, and the temporal stability of the treatment liquid tend to be more excellent, and in a case where the mass ratio is 1,000 or less (more preferably 150 or less, and still more preferably 250 or less), the residue removal property, the defect suppression property, and the temporal stability of the treatment liquid tend to be more excellent.

(The Results of Examples 2, 5 to 13, and 191 to 196, and The Like)

It has been confirmed that in a case where a mass ratio of the content of the organic basic compound to the content of the surfactant in the treatment liquid is 1 or more (more preferably more than 1 and less than 118), the anticorrosion property, the defect suppression property, the residue removal property, and the temporal stability of the treatment liquid tend to be more excellent.

(The Results of Examples 2, 191 to 194, and 196, and The Like)

It has been confirmed that in a case where the surfactant has a nitrogen atom (preferably in a case where the surfactant is a nonionic or cationic one), the defect suppression property and the residue removal property tend to be more excellent.

(The Results of Examples 2, and 173 to 190, and The Like)

It was confirmed that in a case where the content of the surfactant is 1 ppm by mass or more (more preferably 85 ppm by mass or more, and still more preferably 0.01% by mass or more) and 2% by mass or less (more preferably 1% by mass or less, and still more preferably 0.1% by mass or less) with respect to the total mass of the treatment liquid, the defect suppression property, the residue removal property, and the temporal stability of the treatment liquid tend to be more excellent.

(The Results of Examples 2, 191 to 194, and 196, and The Like)

It was confirmed that in a case where the content of the metal-containing particles is 10 ppt by mass to 10 ppb by mass with respect to the total mass of the treatment liquid, the defect suppression property of the treatment liquid tends to be more excellent.

(The Results of Examples 2, 462, and 463, and The Like)

It was confirmed that in a case where the treatment liquid contains a tertiary amine compound in an amount of 50 ppt by mass to 100 ppb by mass with respect to the total mass of the treatment liquid, the defect suppression property tends to be more excellent.

(The Results of Examples 2, and 437 to 441, and The Like)

It was confirmed that in a case where the treatment liquid contains an alkyl halide compound in an amount of 50 ppt by mass to 100 ppb by mass with respect to the total mass of the treatment liquid, the defect suppression property tends to be more excellent.

(The Results of Examples 2, and 442 to 446, and The Like)

It was confirmed that in a case where the treatment liquid contains a reducing agent, the defect suppression property and the temporal stability tend to be more excellent.

(The Results of Examples 2, and 465 to 468, and The Like)

It was confirmed that in a case where the treatment liquid contains acetic acid in an amount of 1 ppt by mass to 0.1% by mass with respect to the total mass of the treatment liquid, the defect suppression property tends to be more excellent.

(The Results of Examples 2, 452 to 461, and 469, and The Like)

It was confirmed that in a case where the treatment liquid contains another organic acid, the defect suppression property and the temporal stability tend to be more excellent.

(The Results of Examples 2 and 464, and The Like)

It was confirmed that in a case where the addition amount of the inorganic base used as a pH adjusting agent for increasing the pH of the treatment liquid is 0.1% by mass or less with respect to the total mass of the treatment liquid, a tendency of the same results as those in a case where the pH is adjusted by adjusting the addition amount of the organic basic compound is exhibited.

(The Results of Examples 20 and 55, and The Like)

EXPLANATION OF REFERENCES

1: substrate
2: metal layer
3: etching stop layer
4: interlayer insulating layer
5: metal hard mask
6: hole
10: laminate
11: inner wall
11a: cross-sectional wall
11b: bottom wall
12: dry etching residue

What is claimed is:

1. A treatment liquid for a semiconductor device, comprising:
   one or more hydroxylamine compounds selected from the group consisting of hydroxylamine and a hydroxylamine salt;
   an organic basic compound;
   an alcohol-based solvent; and
   a surfactant,
   wherein the content of the alcohol-based solvent is 40% to 85% by mass with respect to the total mass of the treatment liquid,
   the pH is 8 or higher, and
   the mass ratio of the content of the hydroxylamine compound to the content of the surfactant is 1 to 1,000.

2. The treatment liquid according to claim 1,
   wherein the content of the hydroxylamine compound is 1% to 20% by mass with respect to the total mass of the treatment liquid.

3. The treatment liquid according to claim 1,
   wherein the organic basic compound includes one or more selected from the group consisting of tetramethylammonium hydroxide, tetrabutylammonium hydroxide, benzyltrimethylammonium hydroxide, tetrahydrofurfurylamine, N-(2-aminoethyl)piperazine, 1,8-diazabicyclo[5.4.0]-7-undecene, and 1,4-diazabicyclo[2.2.2]octane.

4. The treatment liquid according to claim 1,
   wherein the organic basic compound contains a tertiary amine compound,
   the tertiary amine compound contains a tertiary amino group other than a tertiary amino group contained in a nitrogen-containing non-aromatic ring, and
   the content of the tertiary amine compound is 1 ppt by mass to 5 ppm by mass with respect to the total mass of the treatment liquid.

5. The treatment liquid according to claim 1,
   wherein the mass ratio of the content of the organic basic compound to the content of the surfactant is 1 to 150.

6. The treatment liquid according to claim 1,
   wherein the surfactant is a cationic surfactant.

7. The treatment liquid according to claim 6,
   wherein the cationic surfactant contains a quaternary nitrogen atom.

8. The treatment liquid according to claim 1,
   wherein the surfactant contains one or more selected from the group consisting of cetyltrimethylammonium bromide, cetylpyridinium chloride, benzethonium chloride, chlorhexidine dihydrochloride, distearyldimethylammonium chloride, benzalkonium chloride, dequalinium chloride, dodecyltrimethylammonium chloride, octadecylamine hydrochloride, and dodecylpyridinium chloride.

9. The treatment liquid according to claim 1,
   wherein the content of the surfactant is 1 ppm by mass to 0.5% by mass with respect to the total mass of the treatment liquid.

10. The treatment liquid according to claim 1,
    wherein the alcohol-based solvent contains an alkoxy group.

11. The treatment liquid according to claim 1, wherein the alcohol-based solvent contains one or more selected from the group consisting of 3-methoxy-3-methyl 1-butanol, furfuryl alcohol, glycerin, 2-methyl-2,4-pentanediol, ethylene glycol, 1,2-propanediol, ethylene glycol monoethyl ether, ethylene glycol monobutyl ether, diethylene glycol monomethyl ether, diethylene glycol monoethyl ether, and dipropylene glycol monomethyl ether.

12. The treatment liquid according to claim 1, further comprising an alkyl halide compound,
    wherein the content of the alkyl halide compound is 1 ppt by mass to 5 ppm by mass with respect to the total mass of the treatment liquid.

13. The treatment liquid according to claim 1, further comprising a reducing agent.

14. The treatment liquid according to claim 13,
    wherein the reducing agent is one or more reducing agents selected from the group consisting of catechol and a derivative thereof, and a mercaptan compound.

15. The treatment liquid according to claim 1, further comprising acetic acid,
    wherein the content of the acetic acid is 1 ppt by mass to 0.1% by mass with respect to the total mass of the treatment liquid.

16. The treatment liquid according to claim 1, further comprising another organic acid other than acetic acid.

17. The treatment liquid according to claim 1, further comprising metal-containing particles,
   wherein the metal-containing particles contain one or more metal components selected from the group consisting of Na, Ca, Fe, and Cr, the particle diameter of the metal-containing particles is 0.02 to 0.05 μm, and the content of the metal-containing particles is 10 ppt by mass to 10 ppb by mass with respect to the total mass of the treatment liquid.

18. The treatment liquid according to claim 1, used as a cleaning liquid for removing etching residues, a solution for removing a resist film used for pattern formation, or a cleaning liquid for removing residues from a substrate after chemical mechanical polishing.

19. The treatment liquid according to claim 1, used for a treatment of a substrate having a metal layer containing one or more selected from the group consisting of W and Co.

20. A treatment liquid for a semiconductor device, comprising:
   one or more hydroxylamine compounds selected from the group consisting of hydroxylamine and a hydroxylamine salt;
   an organic basic compound;
   an alcohol-based solvent; and
   a surfactant,
   wherein the content of the alcohol-based solvent is 40% to 85% by mass with respect to the total mass of the treatment liquid,
   the pH is 8 or higher,
   the organic basic compound contains a tertiary amine compound,
   the tertiary amine compound contains a tertiary amino group other than a tertiary amino group contained in a nitrogen-containing non-aromatic ring, and
   the content of the tertiary amine compound is 1 ppt by mass to 5 ppm by mass with respect to the total mass of the treatment liquid.

21. The treatment liquid according to claim 20, further comprising an alkyl halide compound,
   wherein the content of the alkyl halide compound is 1 ppt by mass to 5 ppm by mass with respect to the total mass of the treatment liquid.

22. The treatment liquid according to claim 20,
   wherein the alkyl halide compound consists of a hydrocarbon group and a halogen atom.

* * * * *